United States Patent
Jikutani et al.

(10) Patent No.: US 7,720,125 B2
(45) Date of Patent: May 18, 2010

(54) SURFACE LIGHT EMITTING LASER ELEMENT, SURFACE LIGHT EMITTING LASER ARRAY PROVIDED WITH IT, ELECTRO-PHOTOGRAPHIC SYSTEM AND OPTICAL COMMUNICATION SYSTEM

(75) Inventors: Naoto Jikutani, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 153 days.

(21) Appl. No.: 11/815,050

(22) PCT Filed: Nov. 27, 2006

(86) PCT No.: PCT/JP2006/323603

§ 371 (c)(1),
(2), (4) Date: Oct. 10, 2007

(87) PCT Pub. No.: WO2007/063806

PCT Pub. Date: Jun. 7, 2007

(65) Prior Publication Data

US 2009/0022199 A1     Jan. 22, 2009

(30) Foreign Application Priority Data

Nov. 30, 2005 (JP) .............................. 2005-346055
Apr. 28, 2006 (JP) .............................. 2006-126072
Nov. 2, 2006 (JP) .............................. 2006-299074

(51) Int. Cl.
  *H01S 5/00* (2006.01)
(52) U.S. Cl. .............................. 372/46.013; 372/46.01; 372/50.1; 372/50.11; 372/50.124
(58) Field of Classification Search .............. 372/43.01, 372/45.01, 46.01, 46.013, 46.015, 50.1–50.124, 372/98, 99
See application file for complete search history.

(56) References Cited

U.S. PATENT DOCUMENTS 6,207,973 B1   3/2001  Sato et al.

(Continued)

FOREIGN PATENT DOCUMENTS

| JP | 5 206574 | 8/1993 |
| JP | 10 56233 | 2/1998 |

(Continued)

OTHER PUBLICATIONS

Choquette, K. D. et al.,"Cavity Characteristics of Selectively Oxidized Vertical-cavity Lasers", Appl. Phys. Lett., vol. 55, No. 25. 1995.
Choquette, K. D. et al.," Low Threshold Voltage Vertical-cavity Lasers Fabricated by Selective Oxidation", Electronics Letters Online, No. 19941421, 1994.
Bond, A. et al.," Design of Low-Loss Singles-Mode Vertical-Cavity Surface-Emitting Lasers", IEEE Journal of Selected Topics in Quantum Electronics, vol. 5, No. 3, pp. 574-581, 1999.

*Primary Examiner*—Minsun Harvey
*Assistant Examiner*—Xnning Niu
(74) *Attorney, Agent, or Firm*—Oblon, Spivak, McClelland, Maier & Neustadt, L.L.P.

(57) ABSTRACT

A surface-emission laser device comprises an active layer, cavity spacer layers provided at both sides of the active layer, reflection layers provided at respective sides of the cavity spacer layers, the reflection layers reflecting an oscillation light oscillated in the active layer and a selective oxidation layer. The selective oxidation layer is provided between a location in the reflection layer corresponding to a fourth period node of the standing wave distribution of the electric field of the oscillating light and a location in the reflection layer adjacent to the foregoing fourth period node in the direction away from the active layer and corresponding to an anti-node of the standing wave distribution of the electric field of the oscillation light.

5 Claims, 46 Drawing Sheets

U.S. PATENT DOCUMENTS

| | | |
|---|---|---|
| 6,411,638 B1 * | 6/2002 | Johnson et al. .......... 372/46.01 |
| 6,542,528 B1 | 4/2003 | Sato et al. |
| 6,563,851 B1 | 5/2003 | Jikutani et al. |
| 6,614,821 B1 | 9/2003 | Jikutani et al. |
| 6,674,785 B2 | 1/2004 | Sato et al. |
| 6,765,232 B2 | 7/2004 | Takahashi et al. |
| 6,803,604 B2 * | 10/2004 | Takahashi et al. ............ 257/80 |
| 6,959,025 B2 | 10/2005 | Jikutani et al. |
| 6,975,663 B2 | 12/2005 | Sekiya et al. |
| 2005/0147143 A1 | 7/2005 | Jikutani |
| 2005/0238075 A1 | 10/2005 | Jikutani et al. |
| 2006/0007979 A1 | 1/2006 | Jikutani et al. |
| 2006/0093006 A1 | 5/2006 | Jikutani |
| 2006/0093010 A1 | 5/2006 | Sekiya et al. |

FOREIGN PATENT DOCUMENTS

| | | |
|---|---|---|
| JP | 10 505465 | 5/1998 |
| JP | 2002 208755 | 7/2002 |
| JP | 2002 353562 | 12/2002 |
| JP | 2003 508928 | 3/2003 |
| JP | 2003 115634 | 4/2003 |
| JP | 2005 251860 | 9/2005 |
| JP | 2005 303113 | 10/2005 |
| JP | 2006 140446 | 6/2006 |

* cited by examiner

100

103

STANDING WAVE DISTRIBUTION

STANDING WAVE DISTRIBUTION

STANDING WAVE DISTRIBUTION

STANDING WAVE DISTRIBUTION

STANDING WAVE DISTRIBUTION

STANDING WAVE DISTRIBUTION

SURFACE LIGHT EMITTING LASER ELEMENT, SURFACE LIGHT EMITTING LASER ARRAY PROVIDED WITH IT, ELECTRO-PHOTOGRAPHIC SYSTEM AND OPTICAL COMMUNICATION SYSTEM

TECHNICAL FIELD

The present invention relates to surface-emission laser devices, surface-emission laser arrays having the same, electrophotographic systems having such a surface-emission laser device or surface-emission laser array, and optical communication systems having such a surface-emission laser device or surface-emission laser array.

BACKGROUND ART

Recently, intensive investigations are being made on surface-emission laser devices (surface-emission semiconductor laser devices) that cause laser oscillation in a direction perpendicular to a substrate. Such surface-emission laser devices are characterized by low threshold current for oscillation as compared with edge-emission laser devices. Further, such surface-emission laser devices can provide an output beam having a circular beam shape.

Further, in relation to the feature of the laser output being taken out in the direction perpendicular to the substrate, the surface-emission laser devices are suitable for integration in the form of high-density two-dimensional array, and intensive investigations are being made with regard to the use thereof for optical source of parallel optical interconnections, high-speed and high-definition electrophotographic systems, and the like.

For the current confinement structure of surface-emission laser devices, there is a well known structure that utilizes the phenomenon of selective oxidation (Non-Patent References 1 and 2). Non-Patent References 1 and 2 show a surface-emission laser device of 0.98 μm band that uses InGaAs for the active layer. With the surface-emission laser devices of Non-Patent References 1 and 2, there is provided a layer of $Al_{0.98}Ga_{0.02}As$ for selective oxidation in an upper distributed Bragg reflector of p-$Al_{0.9}Ga_{0.1}As$, wherein the upper distributed Bragg reflector is provided over the active layer.

With such surface-emission laser devices, the upper distributed Bragg reflector is subjected to etching to form a mesa structure after the crystal growth process, such that the sidewall surface of the layer for selective oxidation is exposed. Thereafter, the layer of $Al_{0.98}Ga_{0.02}As$ for selective oxidation is subjected to the selective oxidation process by being heated to 425° C. in the ambient formed by bubbling water heated to 85° C. with a nitrogen gas, in such a manner that the oxidation process proceeds from the etched sidewall surface toward the central part of the mesa structure.

As a result of the selective oxidation process, there is formed an insulation region of AlOx in the peripheral part of the mesa structure, wherein it should be noted that there is left a conductive region in the central part of the mesa structure in the form of non-oxidized region. Because AlOx is an excellent insulator, it is possible with such a structure to restrict the injection region of holes to the central part of the mesa structure, and it becomes possible to attain an oscillation threshold current of 1 mA or less.

Further, with the surface-emission laser devices of selective oxidation type, there is caused lateral confinement of light by the oxidation layer in view of the fact that AlOx has a small refractive index of about 1.6 as compared with other semiconductor layers, and as a result, it becomes possible to reduce the diffraction loss of light. Thereby, it becomes possible to obtain a device of high efficiency.

Thereby, decrease of optical loss caused by the oxide layer of low refractive index is effective for the improvement of device efficiency, and thus, there is proposed a construction of providing the oxidation layer at the location corresponding to the node of the standing waves formed in the electric field (Non-Patent Reference 3).

Non-Patent Reference 3 provides a comparison of threshold current or the like, for the case in which the layer for selective oxidation is provided at a location corresponding to the node of the standing wave and the case in which the layer for selective oxidation is provided at the location corresponding to an anti-node of the standing wave. According to this comparison, it has been indicated that the optical scattering loss can be suppressed effectively and low threshold current is attained by providing the layer for selective oxidation at the location of the node.

Meanwhile, in many applications of surface-emission laser devices, there is a demand for beam shape such that the surface-emission laser device provides an output beam having a single peak beam shape when operated under high output power, in addition to the feature of having low threshold characteristics. With selectively oxidized surface-emission laser devices, however, there arises a problem, because of large difference of diffractive index in the lateral direction caused by the selectively oxidized layer, in that higher-order transverse modes are also confined easily and there tends to be caused oscillation with higher-order transverse mode. Thus, control for single transverse mode operation is an important object to be achieved also in such selectively oxidized surface-emission laser devices. In order to attain decreased optical confinement for higher-order transverse modes, it is effective to decrease the difference of effective refractive index in the lateral direction or decrease the area of the non-oxidized region.

It is possible to decrease the effective refractive index difference as set forth in Non-Patent Reference 3, by providing the selective oxidation layer to be coincident to the location of a node of the electric field forming the standing wave. With this, the effect of the oxidation layer to the electric field can be reduced. Further, it is also possible to decrease the confinement action of the higher-order transverse modes by decreasing the area of the non-oxidized region. By doing so, it should be noted that the higher transverse modes, having a wide mode distribution profile, tend to cause gradual leakage from the non-oxidized region. While it depends on the wavelength band, it is possible to obtain laser oscillation with a single fundamental mode, by setting the oxidation confinement diameter to be 3-4 times the oscillation wavelength in the case of using conventional devices.

Unfortunately, the foregoing control of the operational mode to single fundamental transverse mode is possible only when the laser device is operated under the condition of relatively low injection level. When the injection level is increased, there is caused oscillation with higher-order transverse mode as a result of thermal lens effect caused by heat generation or spatial hole-burning effect of carriers. Further, with the approach of setting the area of the non-oxidized region small, it is difficult to obtain high output power because of reduced area for the oscillation region. Further, there arises a problem of increase of the device resistance.

Thus, with regard to the object of attaining high output power while maintaining single fundamental transverse mode oscillation, there are proposals to adopt a mode control mechanism other than the approach of using the selective oxidation layer in the surface-emission laser device. For example, Patent Reference 1 discloses a method of suppressing higher-order transverse mode oscillation by using the filtering action of higher-order transverse mode of electrode. With this prior art, increase of output power of single fundamental transverse mode is attained by optimizing the diameter of the electrode aperture with regard to the oxidation confinement diameter.

Further, with Patent Reference 2, a relief pattern is formed in correspondence to the higher-order transverse mode on the surface of the semiconductor multilayer reflector in the top part of the device, for suppressing the reflectivity of the multilayer reflector with regard to the higher transverse mode. Thereby, Patent Reference 2 attains increase of output power for the single fundamental transverse mode.

DISCLOSURE OF THE INVENTION

However, with the approach disclosed in Patent Reference 1, there is a problem that the transverse mode characteristics and the output characteristics are extremely sensitive to the area of the electrode aperture or misalignment between the electrode aperture and the selective oxidation structure. Because of this, there is a need for high precision alignment and high precision control of the patterned shape, while it is difficult to fabricate devices uniformly over the entire wafer surface. Further, there is needed a strict process control with regard to the aperture size and alignment error in the process of forming the aperture in the electrode, while such strict process control increases the cost of the device.

Further, with regard to the approach of using the reflectivity change caused by the dielectric layer according to Patent Reference 2, there is needed a process of forming a dielectric film and a process of removing the same partially, while such added process steps increases the fabrication cost of the device. Further, because the device characteristics are sensitive to the precision of alignment between the dielectric film and the current injection region, it is difficult to fabricate the device uniformly over the entire wafer surface.

The present invention has been made in view of the foregoing problems and it is the object of the present invention to provide a surface-emission laser device in which it is possible to increase the output power of single fundamental transverse mode easily.

Another object of the present invention is to provide a surface-emission laser array including therein surface-emission laser devices in which it is possible to increase the output power of single fundamental mode easily.

Another object of the present invention is to provide an electrophotographic system having a surface-emission laser device capable of increasing the output power of single fundamental transverse mode easily or a surface-emission laser array including therein such surface-emission laser devices.

Another object of the present invention is to provide an optical communication system having a surface-emission laser device capable of increasing the output power of single fundamental transverse mode easily or a surface-emission laser array including therein such surface-emission laser devices.

Non-Patent Reference 1 Applied Physics Letters vol. 66, No. 25, pp. 3413-3415, 1995.

Non-Patent Reference 2 Electronics Letters No. 24, Vol. 30, pp. 2043-2044, 1994.

Non-Patent Reference 3 IEEE Journal of selected topics in quantum electronics, vol. 5, pp. 574-581, 1999.

Patent Reference 1 Japanese Laid-Open Patent Application 2002-208755

Patent Reference 2 Japanese Laid-Open Patent Application 2003-115634

According to the present invention, the surface-emission laser device comprises an active layer, a cavity spacer layer, a reflection layer, and a selective oxidation layer. The cavity spacer layer is provided at both sides of the active layer. The reflection layer is provided at both sides of the cavity spacer layer and reflects an oscillation light oscillated in the active layer. The selective oxidation layer is provided between a first location in the reflector layer corresponding to a node of a standing wave distribution formed by an electric field of the oscillation light and a second location in the reflection layer adjacent to the first location in the direction away from the active layer, the first location corresponding to the node of the standing wave distribution, the second location corresponding to an anti-node of the standing wave distribution.

Preferably, the selective oxidation layer is provided between the first location and a midpoint between the first and second locations.

Preferably, the selective oxidation layer is provided generally at a midpoint between the first location and the second location.

Preferably, the reflection layer has a structure in which a first layer having a first refractive index and a second layer having a second refractive index larger than the fist refractive index are laminated alternately. Thereby, the selective oxidation layer is formed in the first layer.

Further, according to the present invention, the surface-emission laser device comprises an active layer, a cavity spacer layer, a reflection layer, a current confinement layer, and a suppression layer. The cavity spacer layer is provided at both sides of the active layer. The reflection layer is provided at both sides of the cavity spacer layer and reflects an oscillation light oscillated in the active layer. The current confinement layer confines a region of the reflection layer used for injecting a current to the active layer. The suppression laser suppresses a higher mode component oscillated in the active layer.

Preferably, the current confinement layer and the suppression layer are provided in the reflection layer. Thereby, the distance between the active layer and the suppression layer is equal to the distance between the active layer and the current confinement layer.

Preferably, the suppression layer comprises a first selective oxidation layer provided between a first location in the reflector layer corresponding to a node of a standing wave distribution formed by an electric field of the oscillation light and a second location in the reflection layer adjacent to the first location in the direction away from the active layer, the first location corresponding to the node of the standing wave distribution, the second location corresponding to an anti-node of the standing wave distribution. The current confinement layer comprises a second selective oxidation layer different from the first selective oxidation layer. Thereby, the distance between the active layer and the first selective oxidation layer is larger than the distance between the active layer and the second selective oxidation layer.

Preferably, the second selective oxidation layer is provided at a location corresponding to a node of the standing wave distribution of the electrode of the oscillation light.

Preferably, the reflection layer comprises first and second reflection layers. The first reflection layer is disposed at a first side of the active layer and formed on a semiconductor of n-type. The second reflection layer is disposed at an opposite side of the first reflection layer with regard to the active layer and is formed of a semiconductor of p-type. Further, the first selective oxidation layer is disposed in the first reflection layer and the second selective oxidation layer is disposed in the second reflection layer.

Preferably, the surface-emission laser device further comprises a semiconductor layer provided between the suppression layer and the current confinement layer for injecting a current into the active layer. The suppression layer comprises a first selective oxidation layer provided between a first location in the reflector layer corresponding to a node of a standing wave distribution formed by an electric field of the oscillation light and a second location in the reflection layer adjacent to the first location in the direction away from the active layer, the first location corresponding to the node of the standing wave distribution, the second location corresponding to an anti-node of the standing wave distribution. The current confinement layer comprises a first selective oxidation layer and a second selective oxidation layer different therefrom. The first and second selective oxidation layers are provided further away from the substrate with regard to the active layer. The second selective oxidation layer injects a current from the semiconductor layer into the active layer with confinement. The distance between the active layer and the first selective oxidation layer is larger than the distance between the active layer and the second selective oxidation layer.

Preferably, the area of the non-oxidized region of the second selective oxidation layer is larger than the area of the non-oxidized region of the first selective oxidation layer.

Preferably, the suppression layer comprises a selective oxidation layer provided between a first location in the reflector layer corresponding to a node of a standing wave distribution formed by an electric field of the oscillation light and a second location in the reflection layer adjacent to the first location in the direction away from the active layer, the first location corresponding to the node of the standing wave distribution, the second location corresponding to an anti-node of the standing wave distribution. The current confinement layer comprises a high-resistance region subjected to ion implantation process and having a resistance higher than a region through which a current injected to the active layer flows. Thereby, the distance between the active layer and the suppression layer is larger than the distance between the active layer and the current confinement layer.

Preferably, the reflection layer comprises first and second reflection layers. The first reflection layer is provided further away from the substrate with regard to the active layer and formed of a semiconductor. The second reflection layer is provided on the first reflection layer and is formed of a dielectric. The selective oxidation layer is formed in the first layer. The suppression layer comprises a dielectric layer provided between a first location in the second reflector layer corresponding to a node of a standing wave distribution formed by an electric field of the oscillation light and a second location in the second reflection layer adjacent to the first location in the direction away from the active layer, the first location corresponding to the node of the standing wave distribution, the second location corresponding to an anti-node of the standing wave distribution, the dielectric layer having a refractive index different from a dielectric adjacent in a lamination direction of the second reflection layer.

Preferably, the surface-emission laser device further comprises a positive electrode. The current confinement layer is provided in the non-oxidized region and around a non-oxidized region in an in-plane direction of the substrate. Further, the positive electrode is provided to a location corresponding to the oxidized region in a surface of a contact layer provided on the first reflection layer.

Further, according to the present invention, the surface-emission laser device is a surface-emission laser device operating in a single fundamental mode and comprises an active layer, a cavity spacer layer, a reflection layer, and a selective oxidation layer. The cavity spacer layer is provided at both sides of the active layer. The reflection layer is provided at both sides of the cavity spacer layer and reflects an oscillation light oscillated in the active layer. The selective oxidation layer is provided in the reflection layer and comprises an oxidized region and a non-oxidized region. Thereby, the non-oxidized region has an area in the range of 4-20 $\mu m^2$.

Preferably, the non-oxidized region has an area in the range of 4-18.5 $\mu m^2$.

Further, according to the present invention, the surface-emission laser array comprises any of the forgoing surface-emission laser devices.

Further, according to the present invention, the electrophotographic system comprises any of the forgoing surface-emission laser devices or the surface-emission laser array.

Further, according to the present invention, the optical communication system comprises any of the forgoing surface-emission laser devices or the surface-emission laser array.

With the surface-emission laser device of the present invention, the selective oxidation layer is provided between a first location in the reflector layer corresponding to a node of a standing wave distribution formed by an electric field of the oscillation light and a second location in the reflection layer adjacent to the node of the standing wave distribution in the direction away from the active layer, the second location corresponding to an anti-node of the standing wave distribution. As a result, oscillation of higher-order transverse mode components in the active layer is suppressed, and an oscillation light formed of the single fundamental transverse mode is emitted.

Thus, according to the present invention, it is possible to increase the output of the single fundamental transverse mode easily.

Further, with the surface-emission laser device, the area of the non-oxidized region in the selective oxidation layer is set to be larger than the case of the conventional surface-emission laser device.

Thus, according to the present invention, it is possible to increase the output of the single fundamental transverse mode easily.

Further, with the surface-emission laser array of the present invention, it becomes possible, as a result of use of the surface-emission laser device of the present invention, to emit the oscillation light of single fundamental transverse mode component while suppressing higher-order transverse mode components.

Thus, according to the present invention, it is possible, also with surface-emission laser array, to increase the output of the single fundamental transverse mode easily.

Further, according to the electrophotographic system of the present invention that uses the surface-emission laser device or surface-emission laser array of the present invention, a latent image is formed on a photosensitive drum by using a laser light oscillated with the single fundamental transverse mode.

Thus, according to the present invention, it becomes possible to attain high-speed writing with the electrophotographic system.

Further, according to the optical communication system of the present invention that uses the surface-emission laser device or surface-emission laser array of the present invention, signals are transmitted by using a laser light oscillated with the single fundamental transverse mode.

Thus, according to the present invention, it becomes possible to transmit the signals with reduced transmission error.

BEST MODE FOR IMPLEMENTING THE INVENTION

Figure 1:
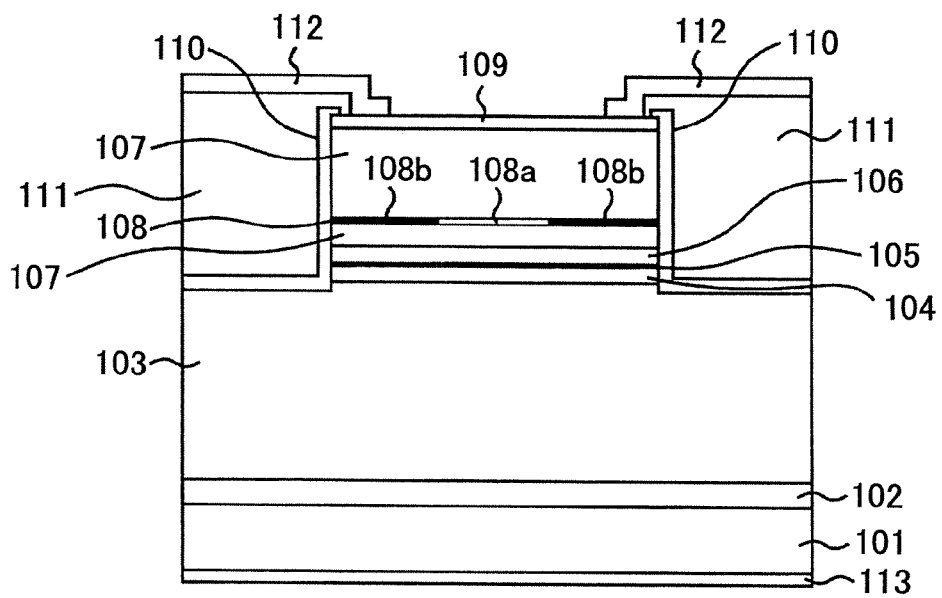
FIG. 1 is a schematic cross-sectional diagram showing a surface-emission laser device according to Embodiment 1 of the present invention.

Hereinafter, the present invention will be described in detail for embodiments with reference to the drawings. In the drawings, those parts corresponding to the parts are designated by the same reference numerals and the description thereof will be not repeated.

Embodiment 1

FIG. 1 is a schematic cross-sectional diagram showing a surface-emission laser device according to Embodiment 1 of the present invention. Referring to FIG. 1, a surface-emission laser device 100 of Embodiment 1 of the present invention comprises a substrate 101, a buffer layers 102, reflection layers 103 and 107, cavity spacer layers 104 and 106, an active layer 105, a selective oxidation layer 108, a contact layer 109, an SiO$_2$ layer 110, an insulating resin layer 111, a p-side electrode 112, and an n-side electrode 113. The surface-emission laser device 100 is a surface-emission laser device of the 780 nm band.

The substrate 101 is formed of GaAs of n-type (n-GaAs). The buffer layer 102 is formed of n-GaAs and is formed on a principal surface of the substrate 101. The reflection layer 103 has a structure of [n-Al$_{0.9}$Ga$_{0.1}$As/n-Al$_{0.3}$Ga$_{0.7}$As] of 40.5 periods formed on the buffer layer 102 by repeating the pair of n-Al$_{0.9}$Ga$_{0.1}$As/p-Al$_{0.3}$Ga$_{0.7}$As as the unit of repetition.

The cavity spacer layer 104 is formed of an undoped Al$_{0.6}$Ga$_{0.4}$As layer and is formed on the reflection layer 103. The active layer 105 has a multiple quantum well structure including therein three periods of [AlGaAs/Al$_{0.6}$Ga$_{0.4}$As] structure and formed on the cavity spacer layer 104, wherein it should be noted that the AlGaAs/Al$_{0.6}$Ga$_{0.4}$As pair forms one period. Thereby, the AlGaAs layer has a film thickness of 5.6 nm while the Al$_{0.6}$Ga$_{0.4}$As layer has a film thickness of 7.8 nm.

The cavity spacer layer 106 is formed of an undoped Al$_{0.6}$Ga$_{0.4}$As layer and is formed on the active layer 105. The reflection layer 107 is formed on the cavity spacer layer 106 and has a structure of [p-Al$_{0.9}$Ga$_{0.1}$As/n-Al$_{0.3}$Ga$_{0.7}$As] in which the p-Al$_{0.9}$Ga$_{0.1}$As/p-Al$_{0.3}$Ga$_{0.7}$As pair is repeated for 26 times.

The selective oxidation layer 108 is formed of p-AlAs and is provided inside the reflection layer 107. Thereby, it should be noted that the selective oxidation layer 108 includes a non-oxidized region 108a and an oxidized region 108b and has a thickness of 20 nm.

The contact layer 109 is formed of p-GaAs and is formed on the reflection layer 107. The SiO$_2$ layer 110 is formed so as to cover a part of the principal surface of the reflection layer 103, and the edge surfaces of the cavity spacer layer 104, the active layer 105, the cavity spacer layer 106, the reflection layer 107, the selective oxidation layer 108 and the contact layer 109.

The insulation resin layer 111 is formed adjacent to the SiO$_2$ layer 110. The p-side electrode 112 is formed on a part of the contact layer 109 and the insulating resin layer 111. The n-side electrode 113 is formed on a backside of the substrate 101.

Further, each of the reflection layers 103 and 107 constitute a semiconductor distributed Bragg reflector that confines the oscillating light oscillated in the active layer 105 into the active layer 105 as a result of Bragg multiple reflection.

Figure 2:
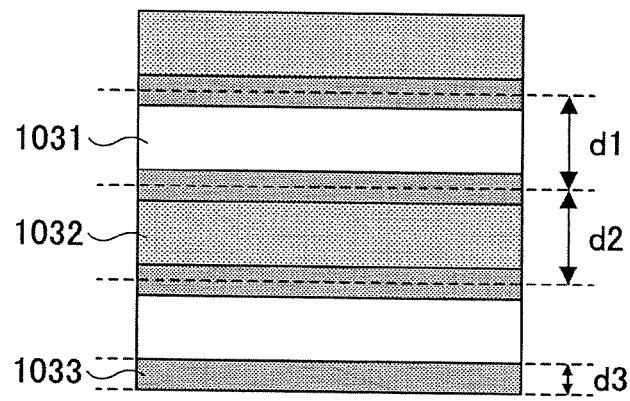
FIG. 2 is a schematic cross-sectional diagram showing a part of the reflection layer shown in FIG. 1.

FIG. 2 is a cross-sectional diagram showing a part of the reflection layer 103 shown in FIG. 1. Referring to FIG. 2, the reflection layer 103 includes a high-refractive index layer 1031, a low-refractive index layer 1032 and a compositional gradation layer 1033. The high-refractive index layer is formed of Al$_{0.3}$Ga$_{0.7}$As while the low-refractive index layer is formed of Al$_{0.9}$Ga$_{0.1}$As. Further, the compositional gradation layer 1033 is formed of AlGaAs in which the composition thereof is changed from one composition of the low-refractive index layer 1031 and the high-refractive index layer 1032 to the other of the foregoing compositions.

The compositional gradation layer 1033 is provided for decreasing the electric resistance between the low-refractive index layer 1031 and the high-refractive index layer 1032.

The high-refractive index layer 1031 has a film thickness d1 while the low-refractive index layer 1032 has a thickness d2. Further, the compositional gradation layer 1033 has a thickness d3.

In the case the reflection layer is not provided with the compositional gradation layer 1033 and thus characterized by a sharp interface, the low-refractive index layer and the high-refractive index layer constituting the reflection layer is set to have a thickness of λ/4n (n being the refractive index of the respective semiconductor layers) for the laser oscillation wavelength (λ=780 nm) so as to satisfy the Bragg multiple reflection phase condition.

It should be noted that this film thickness λ/4n is the film thickness that provides a phase shift of π/2 for the oscillation light in each of the semiconductor layers. In the case there is provided the compositional gradation layer 1033 as in the case of Embodiment 1, the thickness of the respective semiconductor layers including the compositional gradation layer 1033 is determined so as to satisfy the Bragg multiple reflection condition.

Further, the film thickness d3 is set for example to 20 nm, and the film thicknesses d1 and d2 are determined such that each of d1+d3 and d2+d3 satisfies the Bragg multiple reflection condition. Thus, each of d1+d3 and d2+d3 is set such that the phase shift of the oscillation light in the reflection layer 103 becomes π/2.

The reflection layer 107 has the same structure as the reflection layer 103.

Figure 3:
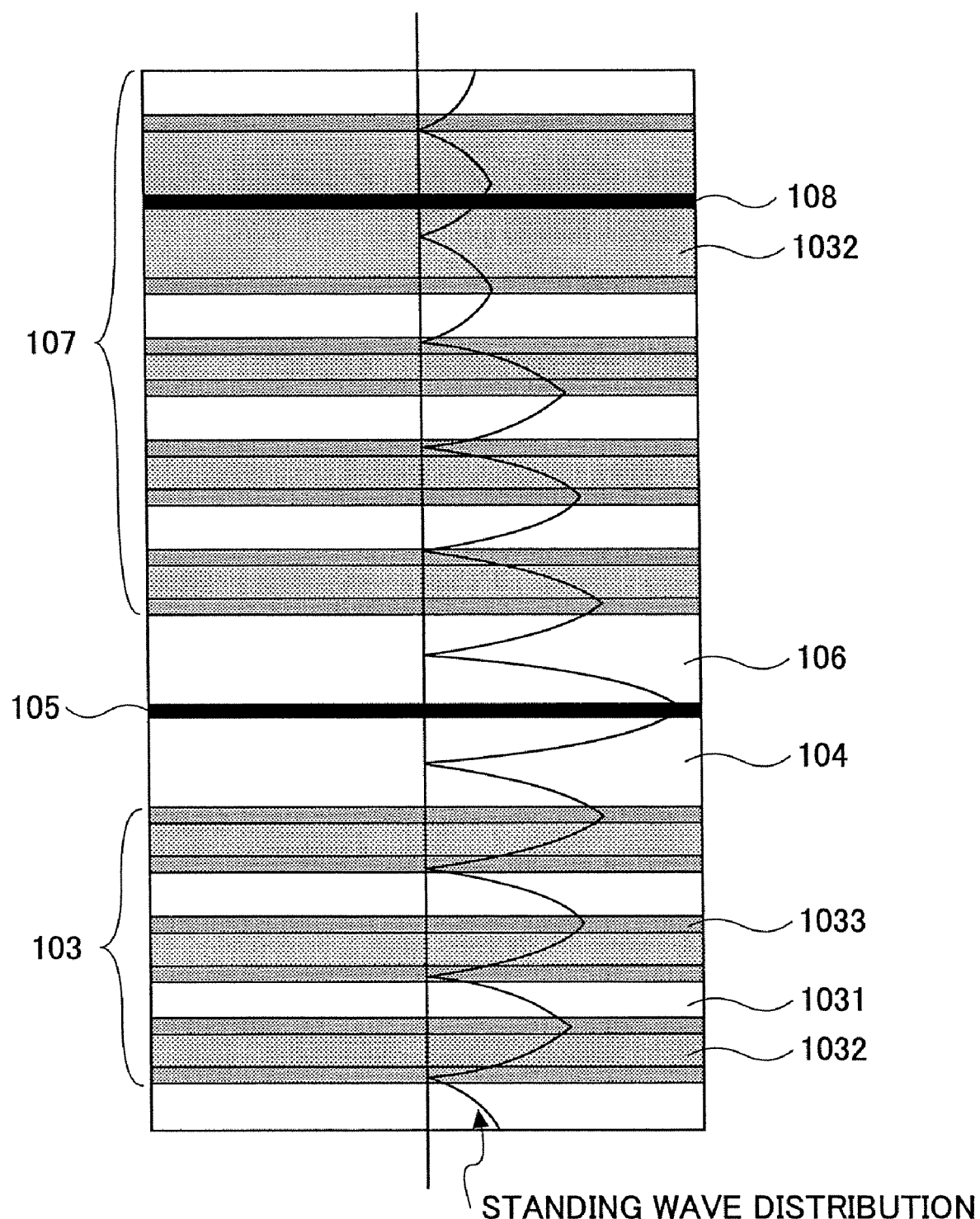
FIG. 3 is a diagram showing a part of the surface-emission laser device of FIG. 1 in the vicinity of a cavity region thereof.

FIG. 3 is a diagram showing a part of the surface-emission laser device 100 of FIG. 1 in the vicinity of the cavity region thereof. It should be noted that FIG. 3 also shows the electric field intensity distribution of the oscillation light in the oscillating state of the surface-emission laser device 100.

Referring to FIG. 3, the cavity region of the surface-emission laser device 100 is defined as the region formed of the cavity spacer layers 104 and 106 and the active layer 105. Thereby, it should be noted that the cavity region, formed of the cavity spacer layers 104 and 106 and the active layer 105, is set such that there occurs a phase shift amount of $2\pi$ in the semiconductor layers thereof. Thus, the cavity region forms a single wavelength cavity structure.

Further, in order to increase the probability of stimulated emission, the active layer 105 is provided centrally to the cavity region (=cavity spacer layers 104, 106 and active layer 105) at the location corresponding to the anti-node of the standing wave distribution of the oscillation light.

The reflection layers 103 and 107 are formed so as to make contact respectively with the cavity spacer layers 104 and 106 at the side of the low refractive index layer 1032. With this construction, the interface between the low-refractive index layer 1032 and the cavity spacer layer 104 or 106 (or compositional gradation layer 1033 in the case of Embodiment 1) is located at the anti-node of the standing wave distribution of the electric field formed by the oscillation light.

Because d1+d3 or d2+d3 is set such that there is caused a phase shift of $\pi/2$ for the oscillation light, there appear the anti-node and the node alternately between the high-refractive index layer 1031 and the low-refractive index layer 1032 where the compositional gradation layer 1033 is disposed.

The selective oxidation layer 108 is provided in the reflection layer 107 inside the low-refractive index layer 1032 at the fourth period location as counted from the cavity region (=cavity spacer layers 104 and 106 and active layer 105). More specifically, the selective oxidation layer 108 is provided at the location offset from the node of the standing wave distribution of the electric field formed by the oscillation wave in the direction away from the active layer 105 by a distance providing a phase shift of $\pi/4$ for the oscillation light (and hence the distance of $\lambda/8n$ where n represents the refractive index of the low-refractive index layer 1032).

Further, the thickness of the low-refractive index layer 1032, in which the selective oxidation layer 108 is provided, is set to the value that causes a phase shift of $3\pi/2$ for the oscillation wavelength, including the contribution from a part of the compositional gradation layer 1033. The phase condition of multiple reflection is met in the case the phase shift of the oscillation light caused in the constituting layers of the reflection layer 107 becomes an odd integer multiple of $\pi/2$.

Figure 4:
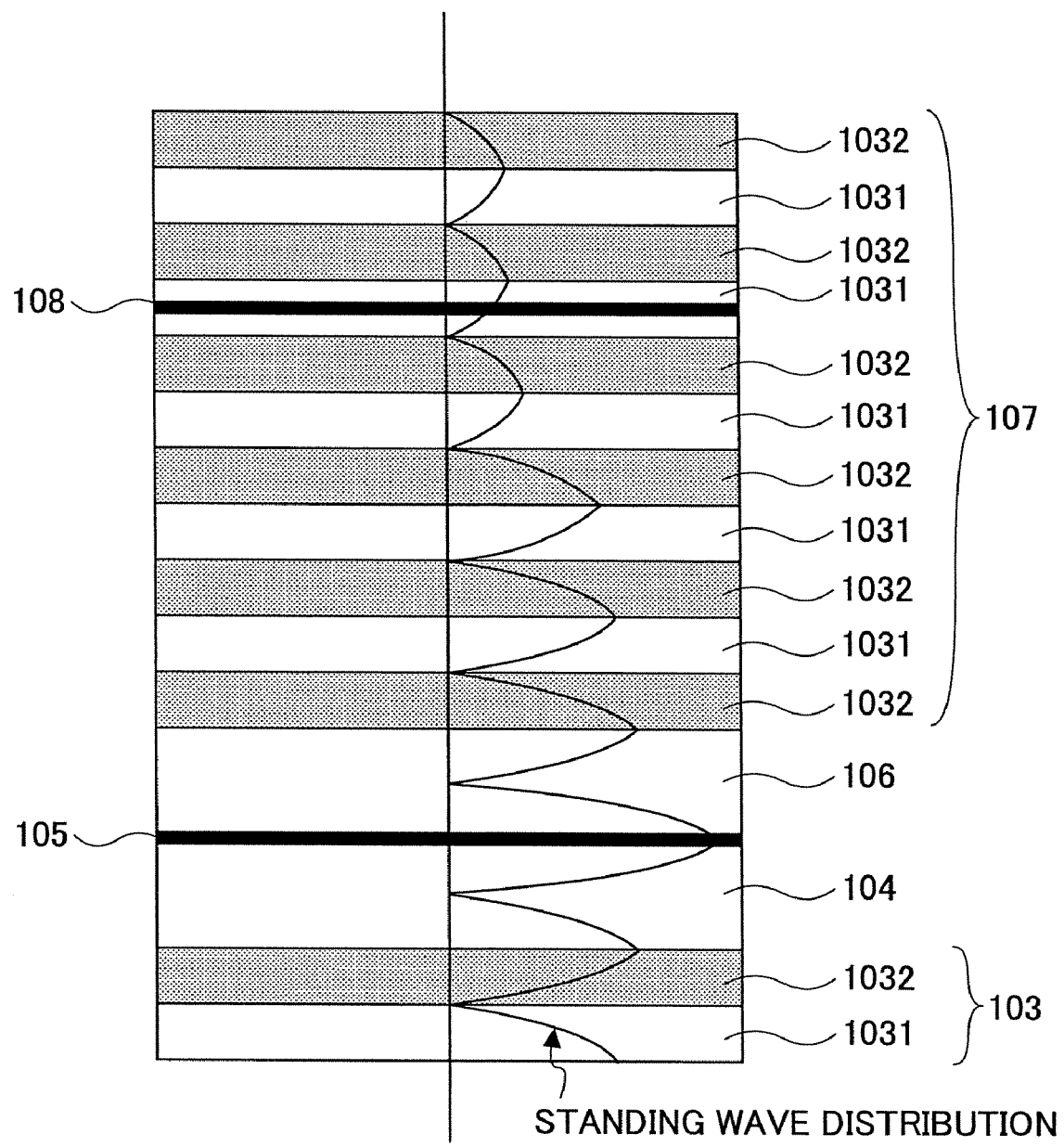
FIG. 4 is another diagram showing a part of the surface-emission laser device of FIG. 1 in the vicinity of a cavity region thereof.

FIG. 4 is another diagram showing the part of the surface-emission laser device 100 of FIG. 1 in the vicinity of the cavity region thereof. It should be noted that FIG. 4 also shows the electric field intensity distribution of the oscillation light in the oscillating state of the surface-emission laser device 100.

Referring to FIG. 4, the selective oxidation layer 108 is provided inside the high-refractive index layer 1031 at the fourth period location as counted from the cavity region (=cavity spacer layers 104 and 106 and active layer 105). More specifically, the selective oxidation layer 108 is provided between the fourth node of the standing wave distribution of the electric field formed by the oscillation wave and an anti-node locating adjacent to the foregoing fourth node in the direction away from the active layer 105. Otherwise, the construction is identical to the explanation of FIG. 3.

Thus, with the surface-emission laser device 100 of the present invention, the selective oxidation layer 108 is provided inside the high-refractive index layer 1031 located at the fourth period as counted from the cavity region (=cavity spacer layers 104 and 106 and active layer 105) or in the low-refractive index layer 1032 located at the fourth period as counted from the cavity region (=cavity spacer layers 104 and 106 and active layer 105).

Figure 5:
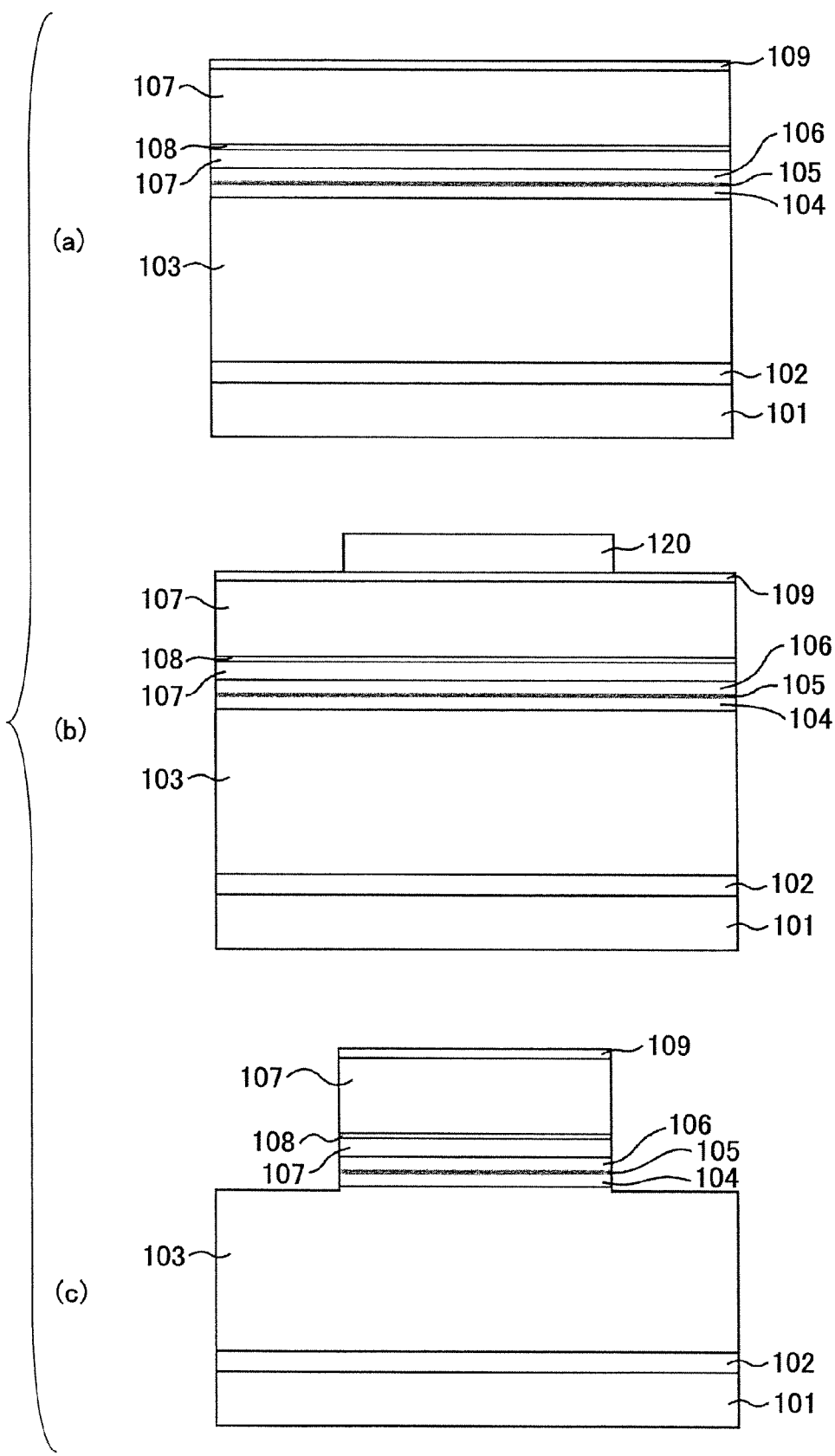
FIG. 5 is a diagram showing a first step of fabricating the surface-emission laser device of FIG. 1.
Figure 6:
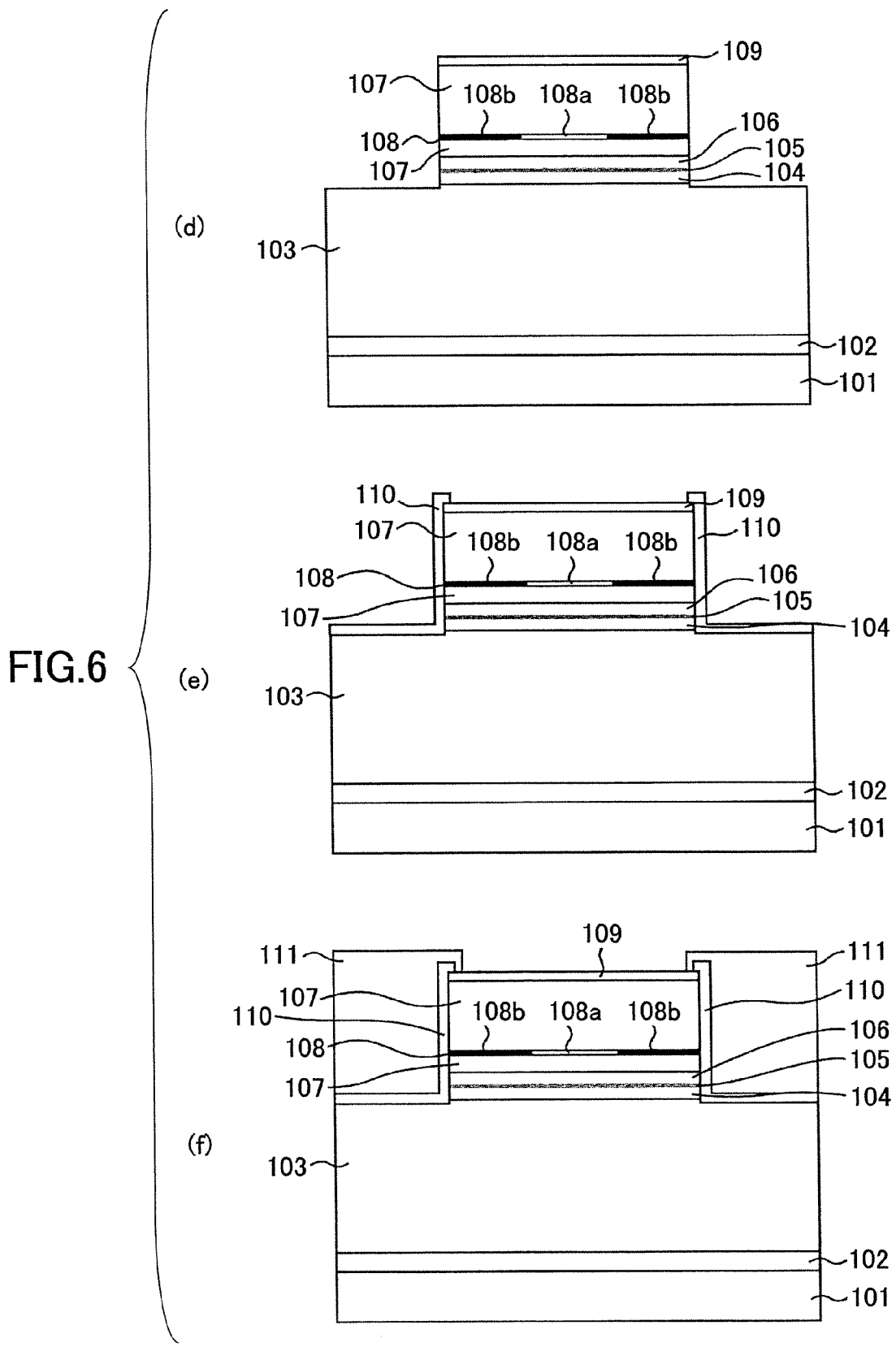
FIG. 6 is a diagram showing a second step of fabricating the surface-emission laser device of FIG. 1.
Figure 7:
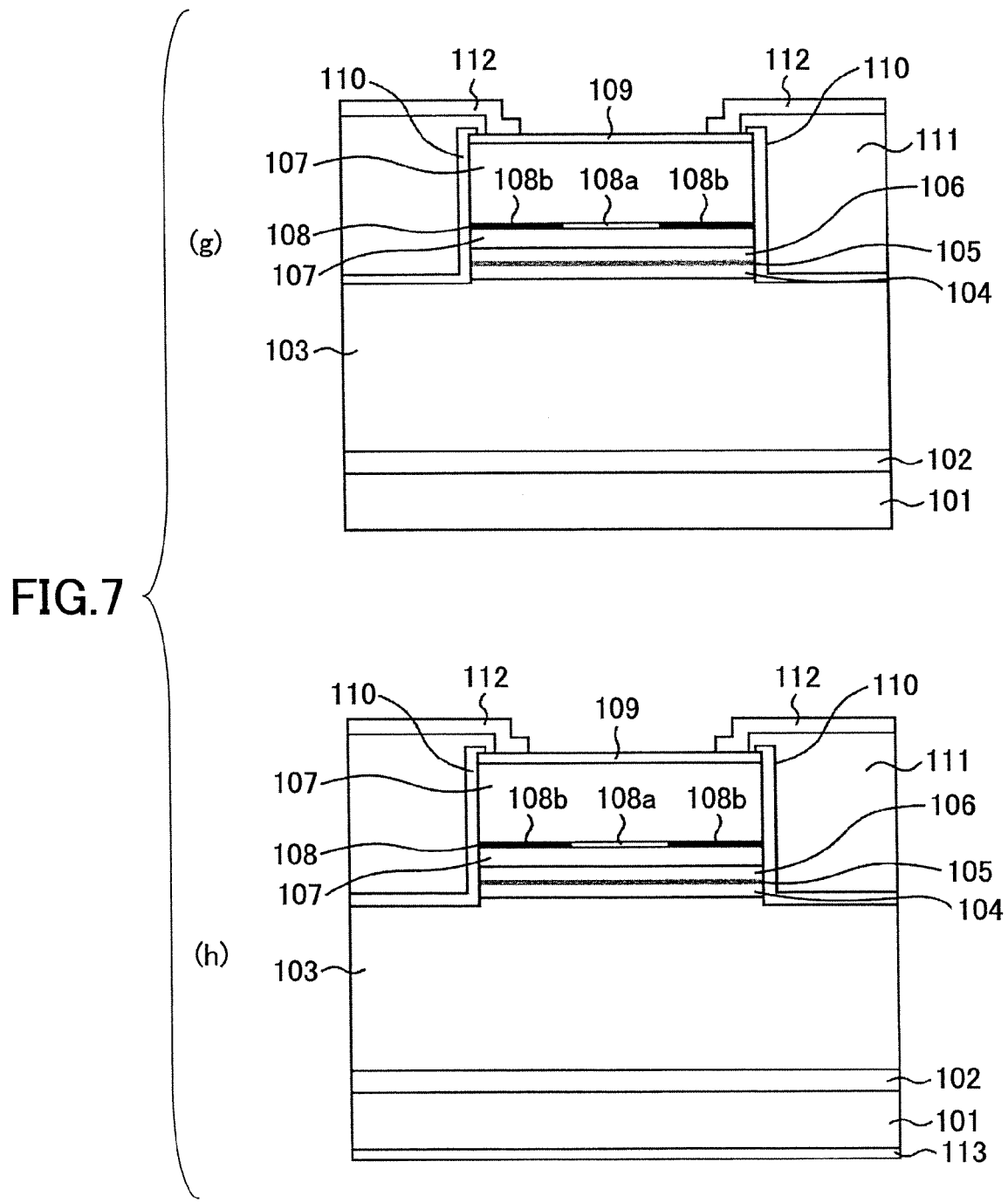
FIG. 7 is a diagram showing a third step of fabricating the surface-emission laser device of FIG. 1.

FIGS. 5, 6 and 7 are first through third process step diagrams showing the fabrication process of the surface-emission laser array 100 shown in FIG. 1. Referring to FIG. 5, the buffer layer 102, the reflection layer 103, the cavity spacer layer 104, the active layer 105, the cavity spacer layer 106, the reflection layer 107, the selective oxidation layer 108 and the contact layer 109 are stacked consecutively on the substrate 101 by using an MOCVD (metal organic chemical vapor deposition) process upon commencement of a series of process steps (reference should be made to step (a) of FIG. 5).

Therein, the n-GaAs layer forming the buffer layer 102 is formed while using trimethyl gallium (TMG), arsine (AsH$_3$) and hydrogen selenide (H$_2$Se) as the source, while the n-Al$_{0.9}$Ga$_{0.1}$As layer and the n-Al$_{0.3}$Ga$_{0.7}$As layer constituting the reflection layer 103 are formed while using trimethyl aluminum (TMA), trimethyl gallium (TMG), arsine (AsH$_3$) and hydrogen selenide (H$_2$Se) for the source.

Further, the undoped Al$_{0.6}$Ga$_{0.4}$As layer of the cavity spacer layer 104 is formed while using trimethyl aluminum (TMA), trimethyl gallium (TMG) and arsine (AsH$_3$) for the source and the AlGaAs/Al$_{0.6}$Ga$_{0.4}$As of the active layer 105 is formed while using trimethyl aluminum (TMA), trimethyl gallium (TMG) and arsine (AsH$_3$) for the source.

Further, the undoped Al$_{0.6}$Ga$_{0.4}$As layer of the cavity spacer layer 106 is formed while using trimethyl aluminum (TMA), trimethyl gallium (TMG) and arsine (AsH$_3$) for the source and the p-Al$_{0.9}$Ga$_{0.1}$As/Al$_{0.3}$Ga$_{0.7}$As of the reflection layer 107 is formed while using trimethyl aluminum (TMA), trimethyl gallium (TMG), arsine (AsH$_3$) and carbon tetrabromide (CBr$_4$) for the source.

Further, the p-AlAs layer of the selective oxidation layer 108 is formed while using trimethyl aluminum (TMA), arsine (AsH$_3$) and carbon tetrabromide (CBr$_4$) for the source material, and the p-GaAs layer of the contact layer 109 is formed while using trimethyl gallium (TMG), arsine (AsH$_3$) and carbon tetrabromide (CBr$_4$) for the source material.

Thereafter, a resist film is coated upon the contact layer 109 and a resist pattern 120 is formed on the contact layer 109 while using a photolithographic process (reference should be made to step (b) of FIG. 5). In the present case, the resist pattern 120 has a square shape with an edge length of 20 μm.

Upon formation of the resist pattern 120, the cavity spacer layer 104, the active layer 105, the cavity space layer 106, the selective oxidation layer 108 and the contact layer 109 are removed by a dry etching process at the peripheral parts thereof while using the resist pattern 120 as a mask. Thereafter, the resist pattern 120 is removed (reference should be made to step (c) of FIG. 5).

Next, referring to FIG. 6, the structure thus obtained is heated, after the step (c) of FIG. 5, to 425° C. in the ambient formed by bubbling water of 85° C. with a nitrogen gas. With this, oxidation proceeds in the selective oxidation layer 108 from the peripheral part thereof toward the central part, and with this, the non-oxidized layer 108a and the oxidized layer 108b are formed in the selective oxidation layer 108 (reference should be made to step (d) of FIG. 6). In this case, the non-oxidized region 108a has a square shape having an edge length of 4 μm.

Thereafter, the SiO$_2$ layer 110 is formed on the entire surface of the specimen thus obtained by using a CVD (chemical vapor deposition) process. Thereafter, the SiO$_2$ layer 110 is removed by a photolithographic process from the region of optical exit part together with the surrounding region thereof (reference should be made to step (e) of FIG. 6)

Further, the insulating resin layer 111 is applied over the entire specimen by a spin coating process, and the insulating resin layer 111 is removed from the region serving for the region of optical exit part (reference should be made to step (f) of FIG. 6).

Referring to FIG. 7, a resist pattern is formed after the formation of the insulating resin layer 111 on the region serving for the optical exit part with an edge length of 8 μm, and a p-side electrode material is deposited on the entire surface of the structure thus obtained by way of evaporation deposition process. Further, by lifting off the p-side electrode material on the resist pattern, the p-side electrode 112 is formed (reference should be made to step (g) of FIG. 7). Further, the back surface of the substrate 101 is polished and the n-side electrode 113 is formed on the back side of the substrate 101 thus polished. Thereafter, ohmic contact is formed for each of the p-side electrode 112 and the n-side electrode 113 by applying an annealing process (reference should be made to step (h) of FIG. 7). With this, the surface-emission laser device 100 is fabricated.

Figure 8:
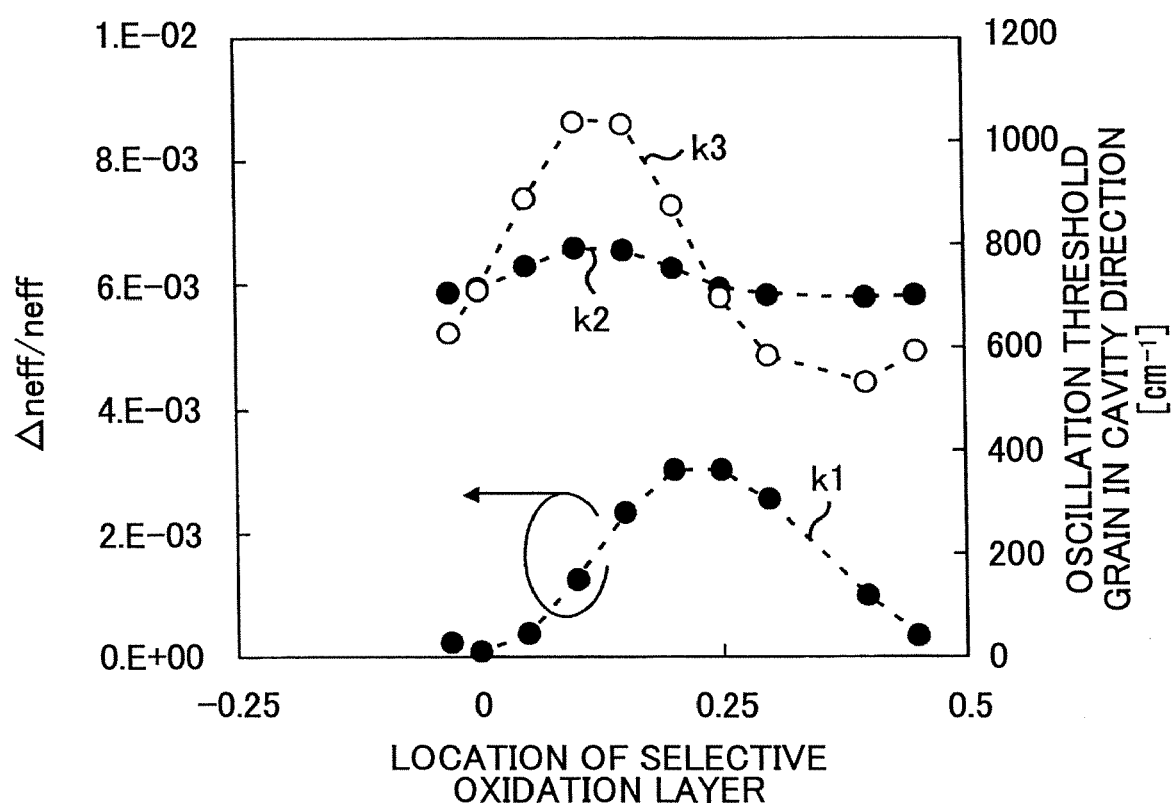
FIG. 8 is a diagram showing a relationship between an effective refractive index difference (Δneff), oscillation threshold gain and location of the selective oxidation layer for the case the selective oxidation layer is disposed in a high-refractive index layer of the reflection layer.

FIG. 8 is a diagram showing a relationship between an effective refractive index difference (Δneff), the oscillation threshold gain and the location of the selective oxidation layer 108 for the case the selective oxidation layer 108 is disposed in the high-refractive index layer 1031 of the reflection layer 107.

In FIG. 8, the vertical axis represents the effective diffractive index difference (Δneff) between the non-oxidized region 108a and the oxidized region 108b as normalized by the effective refractive index neff and the oscillation threshold gain, while the horizontal axis represents the location of the selective oxidation layer 108.

Further, the curve k1 represents the relationship between Δneff/neff and the location of the selective oxidation layer 108, while the curve k2 represents the oscillation threshold gain in the non-oxidized region 108a, and the curve k3 represents the oscillation threshold gain in the oxidized region 108b.

Here, it should be noted that the oscillation threshold gain corresponds to the cavity loss (reflection loss of mirror). The larger the oscillation threshold gain, the larger the cavity loss (reflection loss of mirror).

Figure 9:
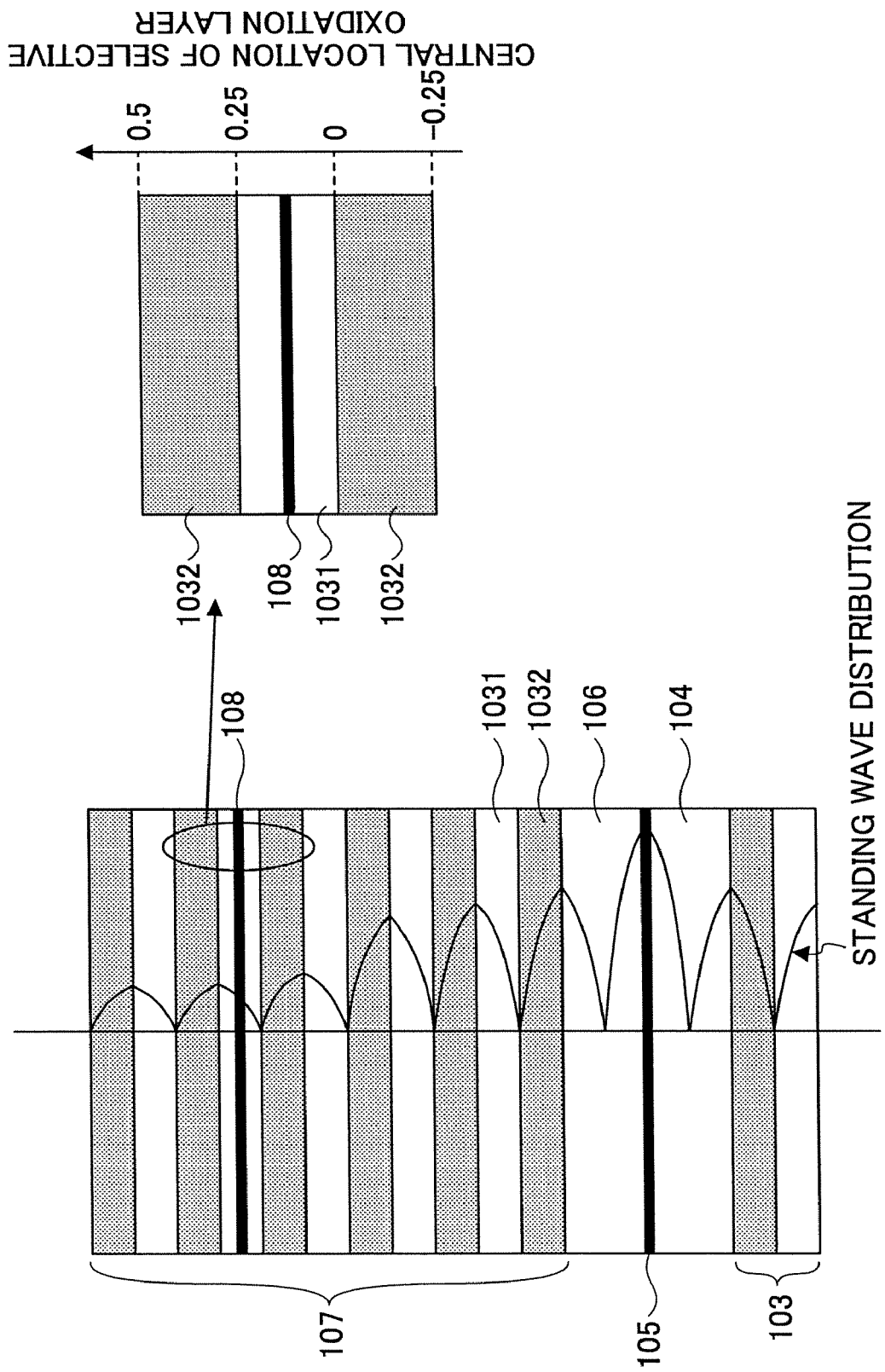
FIG. 9 is a diagram for explaining the location of the selective oxidation layer in the high-refractive index layer.

FIG. 9 is a diagram for explaining the location of the selective oxidation layer 108 in the high-refractive index layer 1031. Referring to FIG. 9, the selective oxidation layer 108 is provided inside the high-refractive index layer 1031 at the fourth period location as counted from the cavity region (=cavity spacer layers 104 and 106 and active layer 105). Thereby, the selective oxidation layer 108 is provided, in the case the selective oxidation layer 108 is located at "0", to the interface (=fourth node of the standing wave distribution of the electric field caused by the oscillation light as counted from the cavity region) formed between the low-refractive index layer 1032 and the high-refractive index layer 1031 as counted from the cavity region (=cavity spacer layers 104, 106 and active layer 105).

Further, the selective oxidation layer 108 is provided, in the case the selective oxidation layer 108 is located at "0.25", to the interface (=fifth node of the standing wave distribution of the electric field caused by the oscillation light as counted from the cavity region) formed between the fourth period high-refractive index layer 1031 and the fifth period low-refractive index layer 1032 as counted from the cavity region (=cavity spacer layers 104, 106 and active layer 105).

Further, the selective oxidation layer 108 is provided, in the case the selective oxidation layer 108 is located at "0.5", to the interface (=fifth node of the standing wave distribution of the electric field caused by the oscillation light as counted from the cavity region) formed between the fifth period low-refractive index layer 1032 and the fifth period high-refractive index layer 1031 as counted from the cavity region (=cavity spacer layers 104, 106 and active layer 105).

Further, the selective oxidation layer 108 is provided, in the case the selective oxidation layer 108 is located at "−0.25", to the interface (=fourth anti-node of the standing wave distribution of the electric field caused by the oscillation light as counted from the cavity region) formed between the third period high-refractive index layer 1031 and the fourth period low-refractive index layer 1032 as counted from the cavity region (=cavity spacer layers 104, 106 and active layer 105).

Thus, positive location of the selective oxidation layer 108 means that the location of the selective oxidation layer 108 is offset further away from the active layer 105 with regard to the interface formed between the fourth period high-refractive index layer 1031 and the low-refractive index layer 1032 as counted from the cavity region (=cavity spacer layers 104, 106 and active layer 105), while negative location of the selective oxidation layer 108 means that the selective oxidation layer 108 is offset toward the active layer 105 with regard to the interface formed between the fourth period high-refractive index layer 1031 and the low-refractive index layer 1032 as counted from the cavity region (=cavity spacer layers 104, 106 and active layer 105).

Further, it should be noted that the location of "−0.25" and the location of "0.25" are the locations corresponding to the anti-node of the standing wave distribution of the electric field caused by the oscillation light.

Referring to FIG. 8 again, it can be seen that the value of Δneff/neff increases with increased offset of the selective oxidation layer 108 in the positive direction from "0" and takes a maximum value when the selective oxidation layer 108 is located at about 0.25. Further, the value of Δneff/neff decreases with displacement of the selective oxidized layer 108 from 0.25 toward 0.5 (reference should be made to curve k1).

Further, the oscillation threshold gain in the non-oxidized region 108a increases slightly when the location of the selective oxidation layer 108 is moved in the positive direction from "0" and becomes maximum when the selective oxidation layer 108 is located at "0.125". Further, the oscillation threshold gain in the non-oxidized region 108a decreases when the location of the selective oxidation layer 108 is moved from "0.125" to "0.25" (reference should be made to the curve k2).

Further, the oscillation threshold gain in the oxidized region 108b increases slightly when the location of the selective oxidation layer 108 is moved in the positive direction from "0" and becomes maximum when the selective oxidation layer 108 is located at "0.125". Further, the oscillation threshold gain in the oxidized region 108b decreases when the location of the selective oxidation layer 108 is moved from "0.125" to "0.25" (reference should be made to the curve k3).

Thus, the difference between the oscillation threshold gain in the non-oxidized region 108a and the oscillation threshold gain in the oxidized region 108b becomes minimum when the selective oxidation layer 108 is located at "0" and "0.25" and increases as the location of the selective oxidation layer 108 moves from "0" toward "0.125". Further, the difference between the oscillation threshold gain in the non-oxidized region 108a and the oscillation threshold gain in the oxidized region 108b decreases when the location of the selective oxidation layer 108 is moved from "0.125" to "0.25" (reference should be made to the curves k2 and k3).

As noted before, large oscillation threshold gain means large cavity loss (reflection loss of the mirror), and thus, the oxidized region 108b functions to increase the loss in the cavity region (=cavity spacer layers 104 and 106 and active layer 105) beyond the non-oxidized region 108a in the case the selective oxidation layer 108 is located between "0" and "0.125".

Because higher transverse modes have larger lateral mode spreading as compared with the fundamental transverse mode and thus having large spatial overlapping with the oxidized region 108b, the oscillation threshold gain in the oxidized region 108b corresponds to the oscillation threshold gain of the higher-order transverse modes, while the oscillation threshold gain in the non-oxidized region 108a corresponds to the oscillation threshold gain of the fundamental transverse mode.

Thus, the larger oscillation threshold gain of the oxidized region 108b over the oscillation threshold gain of the non-oxidized region 108b attained in the case the selective oxidation layer 108 is located between "0" and "0.125", means that the higher-order transverse modes have larger loss over the fundamental transverse mode and that oscillation of higher transverse mode is suppressed as a result.

Thus, by disposing the selective oxidation layer 108 between "0" and "0.125", the oxidized region 108b of the selective oxidation layer 108 functions as the suppression layer suppressing the oscillation of higher-order transverse modes and also as the current confinement layer at the time of injecting current into the active layer 105.

Figure 10:
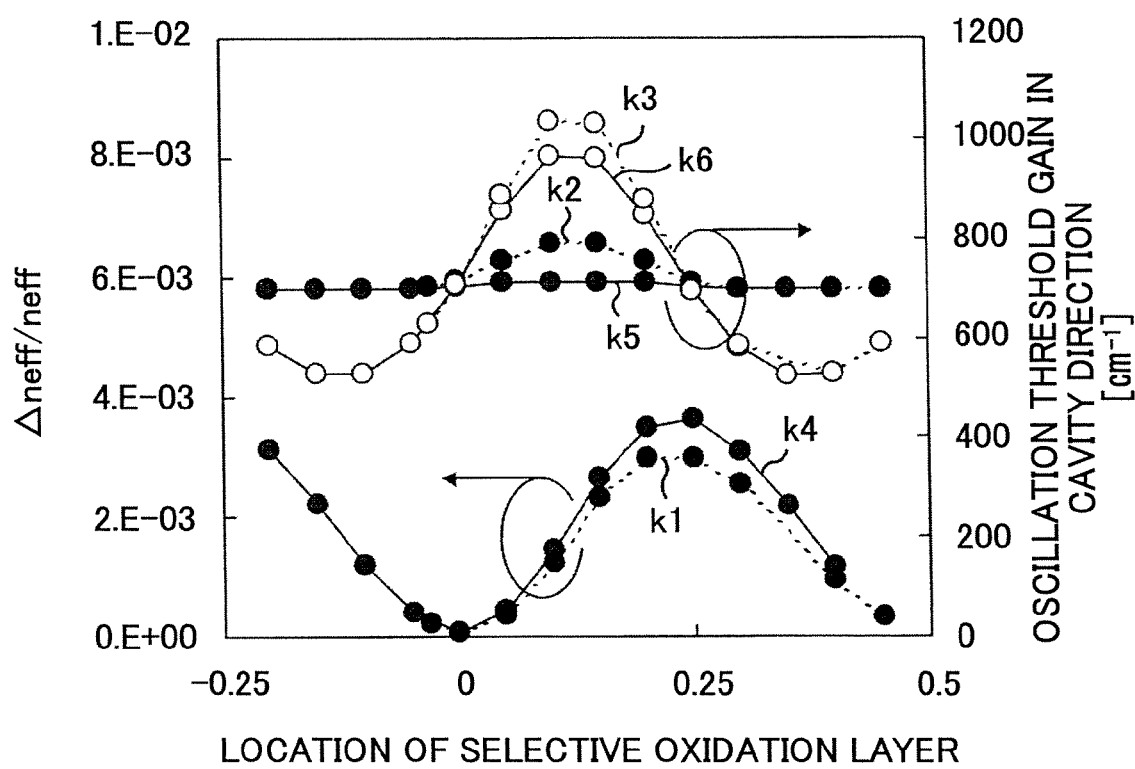
FIG. 10 is a diagram showing a relationship between an effective refractive index Δneff, oscillation threshold gain and location of the selective oxidation layer for the case the selective oxidation layer is disposed in a low-refractive index layer of the reflection layer.

FIG. 10 is a diagram showing the relationship between an effective refractive index difference (Δneff), the oscillation threshold gain and the location of the selective oxidation layer 108 for the case the selective oxidation layer 108 is disposed in the low-refractive index layer 1032 of the reflection layer 107.

In FIG. 10, the vertical axis represents the effective diffractive index difference (Δneff) between the non-oxidized region 108a and the oxidized region 108b as normalized by the effective refractive index neff and the oscillation threshold gain, while the horizontal axis represents the location of the selective oxidation layer 108.

Further, the curve k4 represents the relationship between Δneff/neff and the location of the selective oxidation layer 108, while the curve k5 represents the oscillation threshold gain in the non-oxidized region 108a, and the curve k6 represents the oscillation threshold gain in the oxidized region 108b.

It should be noted that the curves k1, k2 and k3 in FIG. 10 are identical to the curves k1, k2 and k3 shown in FIG. 8.

Figure 11:
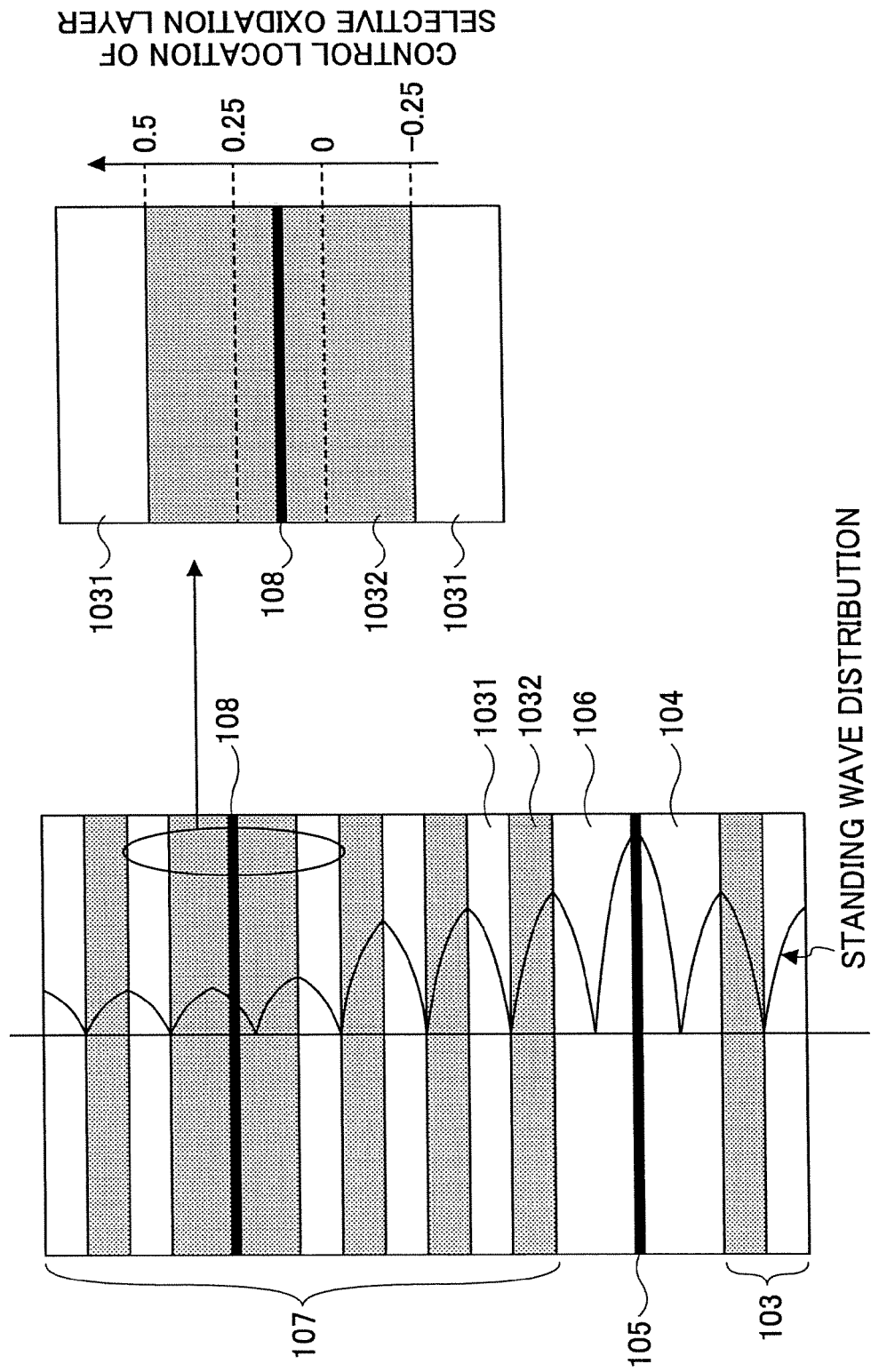
FIG. 11 is a diagram for explaining the location of the selective oxidation layer in the low-refractive index layer.

FIG. 11 is a diagram for explaining the location of the selective oxidation layer 108 in the low-refractive index layer 1032. Referring to FIG. 11, the film thickness of the low-refractive index layer 1032 at the fourth period as counted from the cavity region (=cavity spacer layers 104, 106 and active layer 105) is set to the film thickness that provides a phase shift of $3\pi/2$ for the oscillation light in this region (the film thickness corresponding to $3\lambda/4$: $\lambda$ being cavity wavelength, n being the refractive index of the low-refractive index layer 1032). Thereby, the selective oxidation layer 108 is provided inside the low-refractive index layer 1032, not in the high-refractive index layer 1031.

In this case, the interface between the high-refractive index layer 1031 at the third period and the low-refractive index layer 1032 at the fourth period as counted from the cavity region (=cavity spacer layers 104, 106 and active layer 105) becomes the location "0" of the selective oxidation layer 108, and the positive direction is defined as the direction away from the active layer 105 from the "0" location. Further, the negative direction is defined as the direction to the active layer 105 from the location "0".

Referring to FIG. 10 again, it can be seen that the value of Δneff/neff increases with increased offset of the selective oxidation layer 108 in the positive direction from "0" and takes the maximum value when the selective oxidation layer 108 is located at about 0.25. Further, the value of Δneff/neff decreases with displacement of the selective oxidation layer 108 from 0.25 toward 0.5 (reference should be made to curve k4).

On the other hand, there is little change of oscillation threshold gain in the non-oxidized region 108a even when the location of the selective oxidation layer 108 is moved from "0" in any of the positive direction and negative direction (reference should be made to curve k5).

Further, the oscillation threshold gain in the oxidized region 108b increases slightly when the location of the selective oxidation layer 108 is moved in the positive direction from "0" and becomes maximum when the selective oxidation layer 108 is located at "0.125". Further, the oscillation threshold gain in the oxidized region 108b decreases when the location of the selective oxidation layer 108 is moved from "0.125" to "0.25" (reference should be made to the curve k6).

Thus, the difference between the oscillation threshold gain in the non-oxidized region 108a and the oscillation threshold gain in the oxidized region 108b becomes minimum when the selective oxidation layer 108 is located at "0" and "0.25" and increases as the location of the selective oxidation layer 108 moves from "0" toward "0.125". Further, the difference between the oscillation threshold gain in the non-oxidized region 108a and the oscillation threshold gain in the oxidized region 108b decreases when the location of the selective oxidation layer 108 is moved from "0.125" to "0.25" (reference should be made to the curves k5 and k6).

As a result, the selective oxidation layer 108 disposed in the low-refractive index layer 1032 at the fourth period from the cavity region (=cavity spacer layers 104 and 106 and active layer 105) suppresses the higher-order transverse mode as explained with reference to FIG. 8. Incidentally, the selective oxidation layer 108 also suppresses the higher-order transverse mode even when it is disposed in the low-refractive index layer 1032 other than the fourth layer as counted from the cavity region.

Further, because the difference between the oscillation threshold gain in the non-oxidized region 108a and the oscillation threshold gain in the oxidized region 108b for the case the selective oxidation layer 108 is disposed in the low-refractive index layer 1032 at the fourth period from the cavity region (=cavity spacer layers 104 and 106 and active layer 105) is larger than the difference between the oscillation threshold gain in the non-oxidized region 108a and the oscillation threshold gain in the oxide region 108b for the case in which the selective oxidation layer is disposed in the high-refractive index layer 1031 of the fourth period from the cavity region (=cavity spacer layers 104 and 106 and active layer 105) (reference should be made to curves k2, k3, k5 and k6), the selective oxidation layer 108 disposed in the low-refractive index layer 1032 suppresses the higher-order transverse mode more effectively over the selective oxidation layer 108 disposed in the high-refractive index layer 1031.

Because the difference between the oscillation threshold gain in the non-oxidized region 108a and the oscillation threshold gain in the oxidized region 108b becomes maximum when the selective oxidation layer 108 is located at "0.125", it is preferable to dispose the selective oxidation layer 108 at an intermediate point between the location "0"

and the location "0.25", and thus at an intermediate point between the location corresponding to the node of the standing wave distribution of the electric field caused by the oscillation light and the location corresponding to the anti-node adjacent to the foregoing node in the direction away from the active layer 105. Further, by providing the selective oxidation layer 108 in the low-refractive index layer 1032, it becomes possible to reduce the band discontinuity to the selective oxidation layer 108 and it is possible to decrease the electric resistance.

Figure 12:
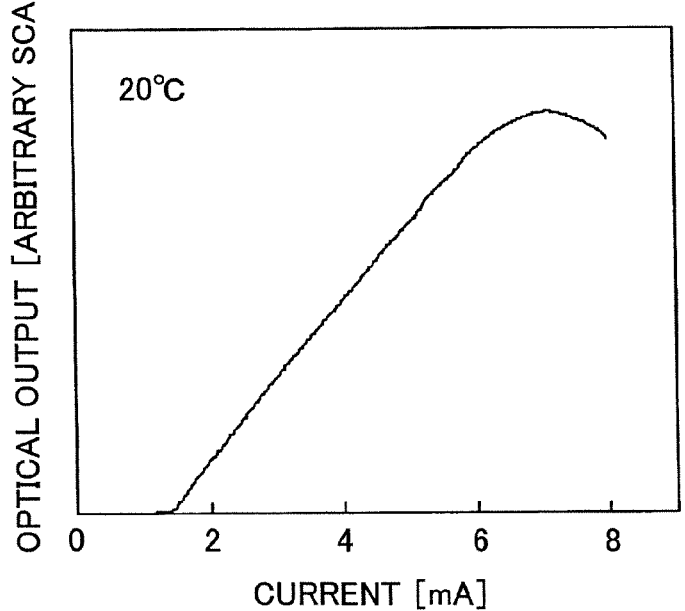
FIG. 12 is a diagram showing the current-optical output characteristics of the surface-emission laser device shown FIG. 1.
Figure 13:
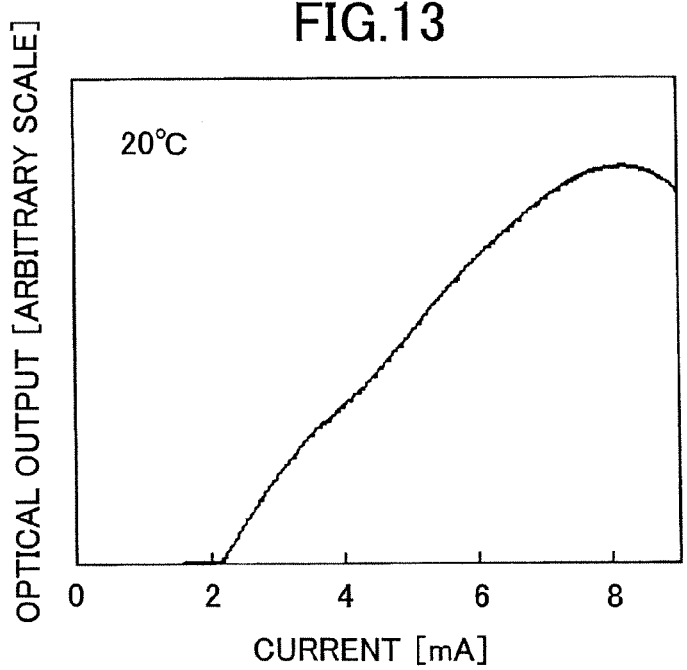
FIG. 13 is a diagram showing the current-optical output characteristics of conventional surface-emission laser device.

FIG. 12 is a diagram showing the current-optical output characteristics of the surface-emission laser device 100 shown FIG. 1. Further, FIG. 13 is a diagram showing the current-optical output characteristics of conventional surface-emission laser device. In the conventional surface-emission laser device, it should be noted that the selective oxidation layer is disposed at the location of the node in the standing wave distribution of the electric field caused by the oscillation light. Further, with the surface-emission laser device 100 and the conventional surface-emission laser device, the non-oxidized region is formed to have an edge length of 4 μm.

In FIGS. 12 and 13, the vertical axis represents the optical output and the horizontal axis represents the current. With the conventional surface-emission laser device, it can be seen that there is already started oscillation of higher-order transverse mode even with the injection current in the order of 4 mA, and associated therewith, there appears a king in the current-optical output power characteristics (reference should be made to FIG. 13).

On the other hand, with the surface-emission laser device 100, the higher-order transverse mode is suppressed effectively and it can be seen that a single fundamental mode oscillation is attained up to generally the peak output power (reference should be made to FIG. 12).

Thus, by providing the selective oxidation layer 108 at the location between the node and anti-node of the standing wave distribution of the electric field caused by the oscillation light, it is possible to attain the single fundamental mode oscillation up to near the peak output power while suppressing the oscillation of higher-order transverse mode.

Figure 14:
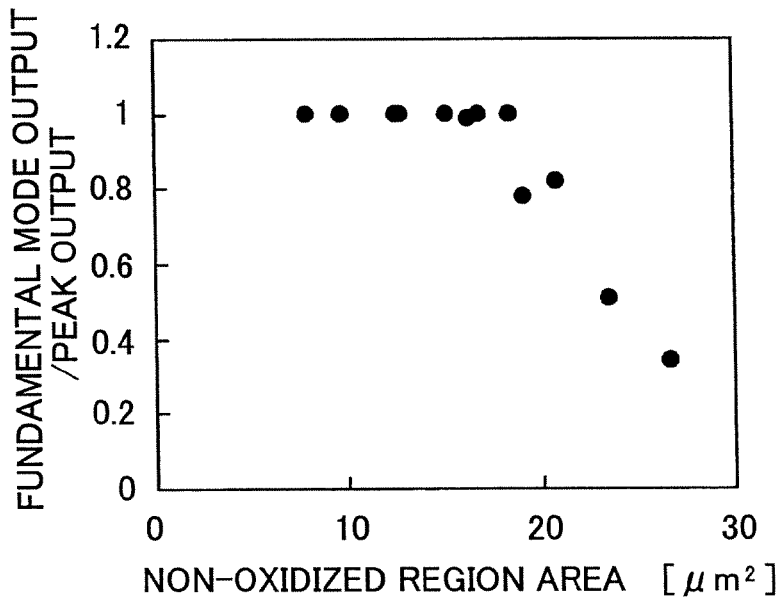
FIG. 14 is a diagram plotting the ratio of fundamental transverse mode output to peak output for the surface-emission laser device shown in FIG. 1 with regard to the area of the non-oxidized region.

FIG. 14 is a diagram plotting the ratio of fundamental transverse mode output to peak output for the surface-emission laser device 100 shown in FIG. 1 with regard to the area of the non-oxidized region 108a. Further, FIG. 15 is a diagram plotting the ratio of fundamental transverse mode output to peak output for the conventional surface-emission laser device with regard to the area of the non-oxidized region.

Figure 15:
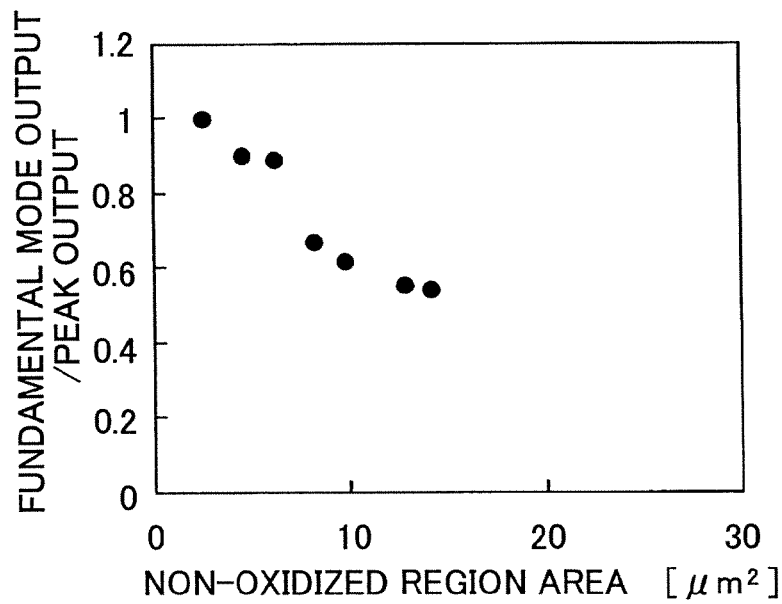
FIG. 15 is a diagram plotting the ratio of fundamental transverse mode output to peak output for the conventional surface-emission laser device with regard to the area of the non-oxidized region.

In FIGS. 14 and 15, the vertical axis represents the fundamental transverse mode output/peak output and the horizontal axis represents the area of the non-oxidized region. Here, the fundamental transverse mode output as shown in FIGS. 14 and 15 is defined as the output at the time the higher-order transverse mode suppression ratio (SMSR) of 20 dB is attained. Thus, in the case the single transverse mode oscillation is attained at the peak output (SMSR>20 dB), the fundamental transverse mode output/peak output on the vertical axis becomes "1".

In the conventional surface-emission laser device, it can be seen that the fundamental transverse mode output/peak output decreased rapidly with increase of the area of the non-oxidized region. Further, the area of the non-oxidized region capable of attaining the single fundamental transverse mode oscillation up to the peak power is limited to about 4 μm².

On the other hand, in the surface-emission laser device 100, it can be seen that the fundamental transverse mode output/peak output is "1" when the area of the non-oxidized region 108a is in the range of 4-18.5 μm², and thus, it is possible to attain the single fundamental transverse mode oscillation (SMSR>20 dB) within the range of 4-20 μm² for the area of the non-oxidized region 108a (reference should be made to FIG. 14).

Thus, it is possible to attain the single fundamental transverse mode oscillation with larger area for the non-oxidized region 108a, and it has become possible to increase the area of the non-oxidized region significantly with the present invention over the conventional surface-emission laser devices. As a result, higher optical emission intensity is attained for the surface-emission laser device 100.

Figure 16:
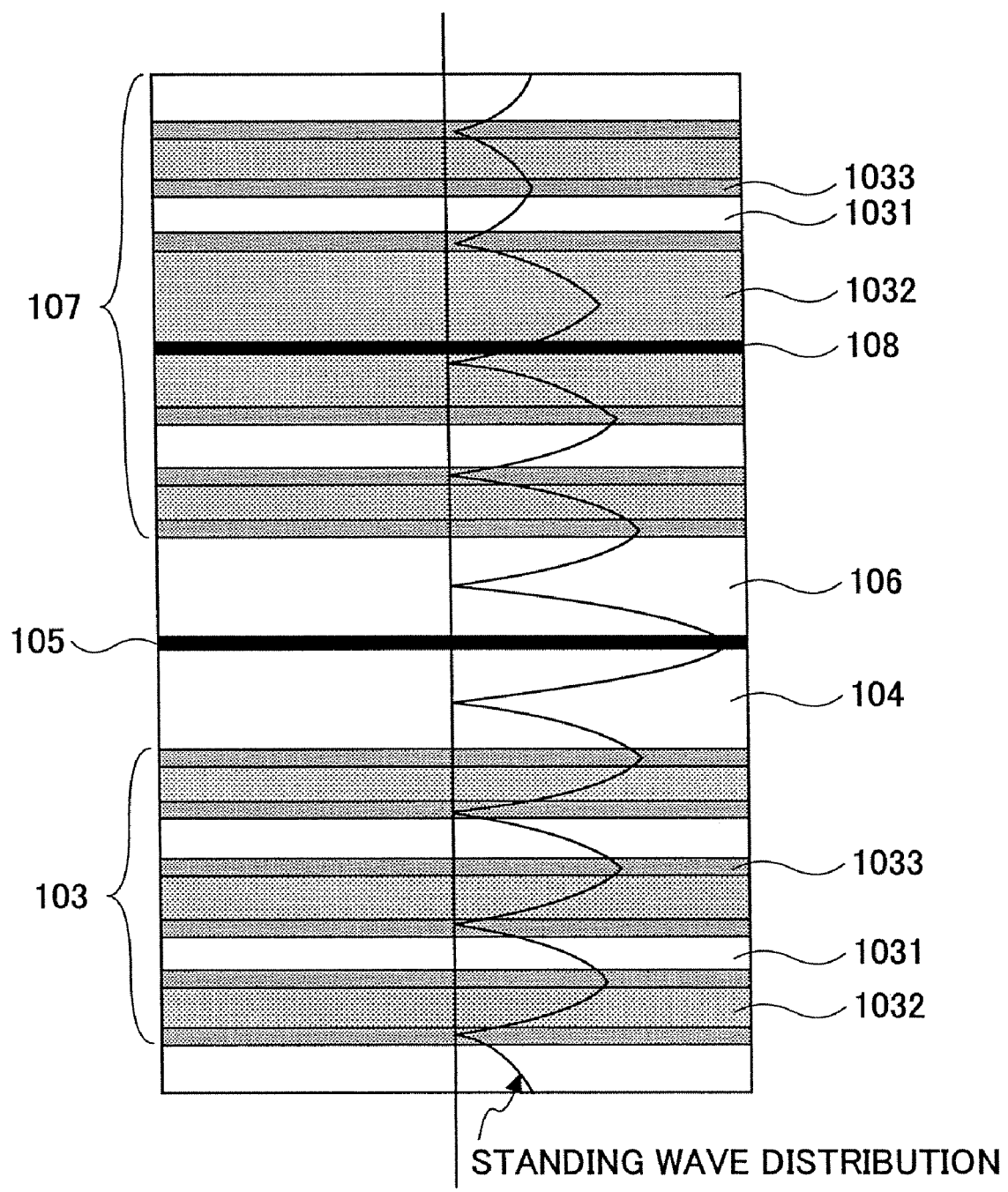
FIG. 16 is a further diagram showing a part of the surface-emission laser device of FIG. 1 in the vicinity of a cavity region thereof.

FIG. 16 is a further diagram showing the part of the surface-emission laser device 100 of FIG. 1 in the vicinity of the cavity region thereof. Referring to FIG. 16, it can be seen that the selective oxidation layer 108 may be provided inside the low-refractive index layer 1032 at the second period location as counted from the cavity region (=cavity spacer layers 104 and 106 and active layer 105) in the reflection layer 107. Thus, the selective oxidation layer 108 may be disposed at the location offset from the location corresponding to the second period node from the active layer 105 in the standing wave distribution of the electric field caused by the oscillation light in the direction away from the active layer 105 by the distance that provides the phase shift of π/8 (=λ/16n) for the oscillation light.

With the surface-emission layer device 100 in which the selective oxidation layer 108 is disposed as shown in FIG. 16, too, it is possible to increase the area of the non-oxidized region 108a similarly to the case of the surface-emission laser device 100 in which the selective oxidation layer 108 is disposed as shown in the configuration of FIG. 3, and it is possible to obtain the single fundamental mode oscillation. Further, the positional adjustment of the selective oxidation layer 108 can be attained very easily by using the MOCVD growth process which can be controlled as desired.

Figure 17:
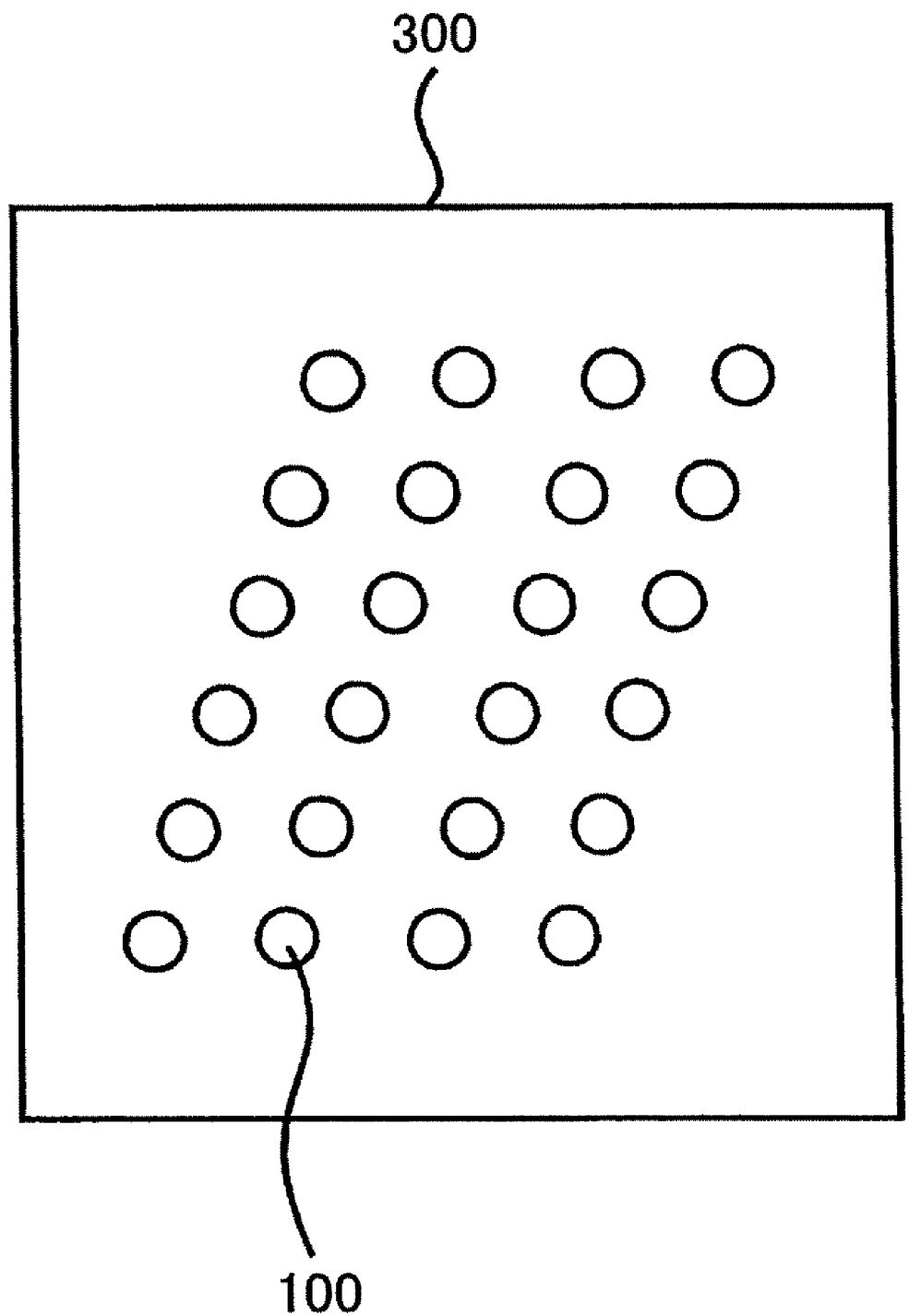
FIG. 17 is a plan view diagram of a surface-emission laser array that uses the surface-emission laser device shown in FIG. 1.

FIG. 17 is a plan view diagram of a surface-emission laser array that uses the surface-emission laser device 100 shown in FIG. 1. Referring to FIG. 17, the surface-emission laser array 300 has a structure in which 24 surface-emission laser devices 100 are disposed generally in the rhombic form array with a predetermined interval.

As noted before, the surface-emission laser array 100 can suppress the higher-order transverse mode oscillation and provide the single fundamental mode oscillation generally up to the peak output power. Thus, the surface-emission laser array 300 can also emit the oscillation light of single fundamental transverse mode oscillation generally up to the peak output power.

Further, because the surface-emission laser device 100 can increase the area of the non-oxidized region 108a up to about 20 μm², the surface-emission laser array 300 can emit the oscillation light of higher output power.

Figure 18:
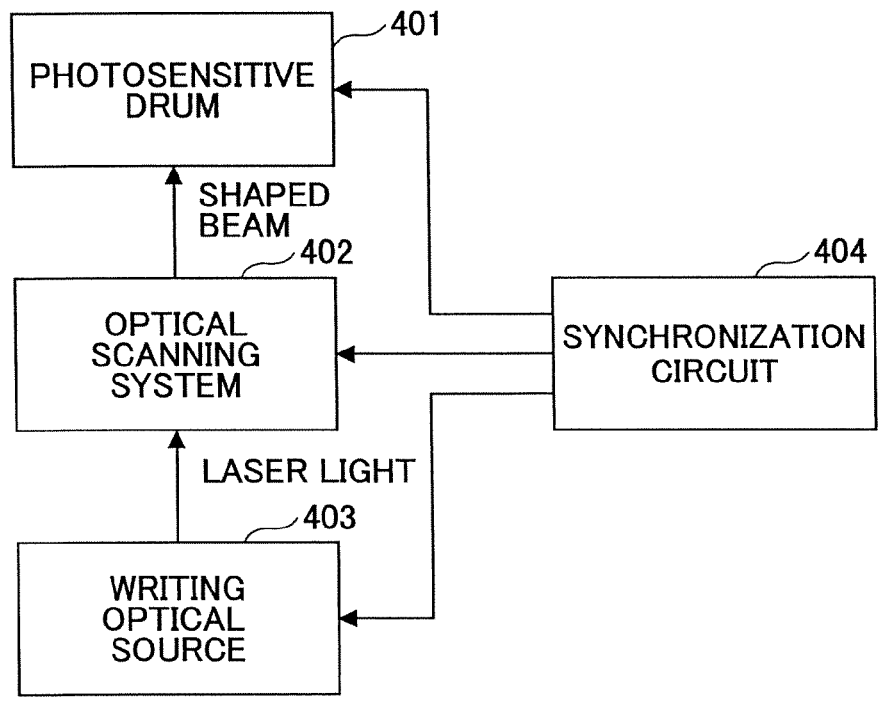
FIG. 18 is a schematic diagram of an electrophotographic system that uses the surface-emission laser device shown in FIG. 1 or the surface-emission laser array shown in FIG. 16.

FIG. 18 is a schematic diagram of an electrophotographic system that uses the surface-emission laser device 100 shown in FIG. 1 or the surface-emission laser array 300 shown in FIG. 17. Referring to FIG. 18, the electrophotographic system 400 includes a photosensitive drum 401, an optical scanning system 402, a writing optical source 403 and a synchronization control circuit 404.

The photosensitive drum 401 forms a latent image by a shaped beam from the optical scanning system 402 according to the control of the synchronization control circuit 404. The optical scanning system 402 is formed of a polygonal mirror and a lens converging system and focuses the laser light from the writing optical source 403 upon the photosensitive drum under control of the synchronization control circuit 404.

The writing optical source 403 is formed of the surface-emission laser device 100 or the surface-emission laser array 300 and causes oscillation of laser light of single fundamental transverse mode under control of the synchronization control circuit 404. Further, the writing optical source 403 emits the oscillated laser light to the optical scanning system 402. The synchronization control circuit 404 controls the photosensitive drum 401, the optical scanning system 402 and the writing optical source 403.

As noted above, the surface-emission laser device 100 and the surface-emission laser array 300 are capable of causing oscillation of laser light of single fundamental transverse mode with high output power, and thus, it becomes possible to achieve high-speed writing and obtain high-resolution images when they are applied to the electrophotographic system 400.

Figure 19:
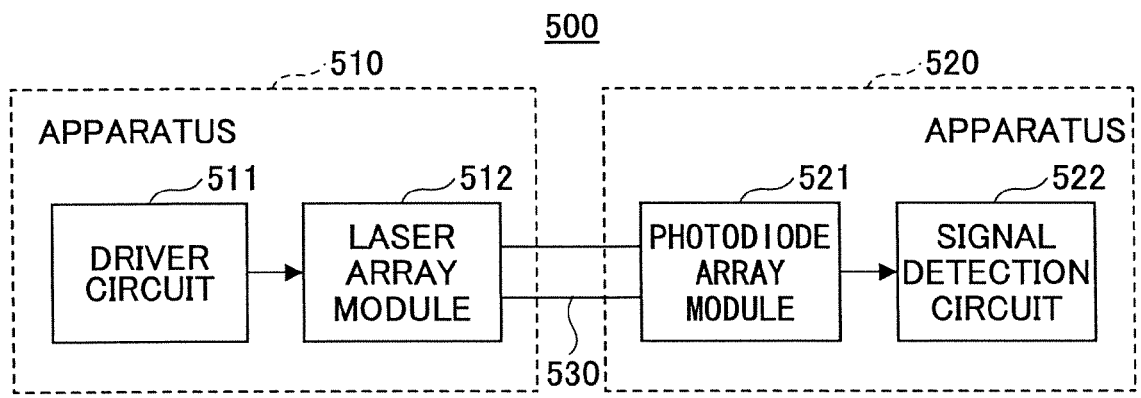
FIG. 19 is a plan view diagram of an optical communicating system that uses the surface-emission laser device shown in FIG. 1.

FIG. 19 is a plan view diagram of an optical communicating system that uses the surface-emission laser device 100 shown in FIG. 1. Referring to FIG. 19, the optical communication system 500 includes apparatuses 510 and 520 and an optical fiber array 530.

The apparatus 510 includes a driver circuit 511 and a laser array module 512. The driver circuit 511 drives the laser array module 512. The laser array module 512 is formed of an array module in which the surface-emission laser devices 100 are aligned in the form of one-dimensional array. Further, the plural surface-emission laser devices 100 forming the one-dimensional array are coupled to respective optical fibers of the optical fiber array 530.

Upon driving by the driver circuit 511, the laser array module 512 produces the laser lights of single fundamental transverse mode and transmits the transmission signal to the apparatus 520 via the optical fiber array after converting the transmission signal to an optical signal. In the optical communication system 500, it should be noted that the plural surface-emission laser devices 100 forming the one-dimensional array constitute a "surface-emission laser array".

The apparatus 520 includes a photodiode array module 521 and a signal detection circuit 522. The photodiode array module 521 is formed of a plurality of photodiodes arranged to form a one-dimensional array. Further, the plurality of photodiodes are coupled to respective fibers forming the optical fiber array 530. Thus, each photodiode in he photodiode array module 521 is connected to the corresponding surface-emission laser device 100 of the laser array module 512 via the corresponding optical fiber.

The photodiode array module 521 thus receives the optical signals from the optical fiber array 530 and converts the received optical signals into electric signals. Further, the photodiode array module 521 outputs the electric signals thus converted to the signal detection circuit 522 as the received signals. The signal detection circuit 522 receives the received signals from the photodiode array module 521 and detects the received signals.

Thereby, the optical fiber array 530 connects the laser array module 512 of the apparatus 510 to the photodiode module of the apparatus 520.

As noted above, the surface-emission laser apparatus 100 is capable of emitting high power laser light in the single fundamental transverse mode, and thus, the apparatus 510 can perform the transmission to the apparatus 520 with reduced transmission error. As a result, reliability of the optical communication system 500 is improved.

While the example of parallel optical interconnection system has been explained for the optical communicating system 500, the optical communication system of the present invention is not limited to such an example and the optical communication system 500 may be a serial transmission system that uses a single surface-emission laser device 100.

Further, the present invention can be applied to form interconnections between boards, between chips and between elements inside a chip, in addition to the interconnection between apparatuses.

The oxide region 108b of the selective oxidation layer 108 constitutes "current confinement layer" and "suppression layer".

Embodiment 2

Figure 20:
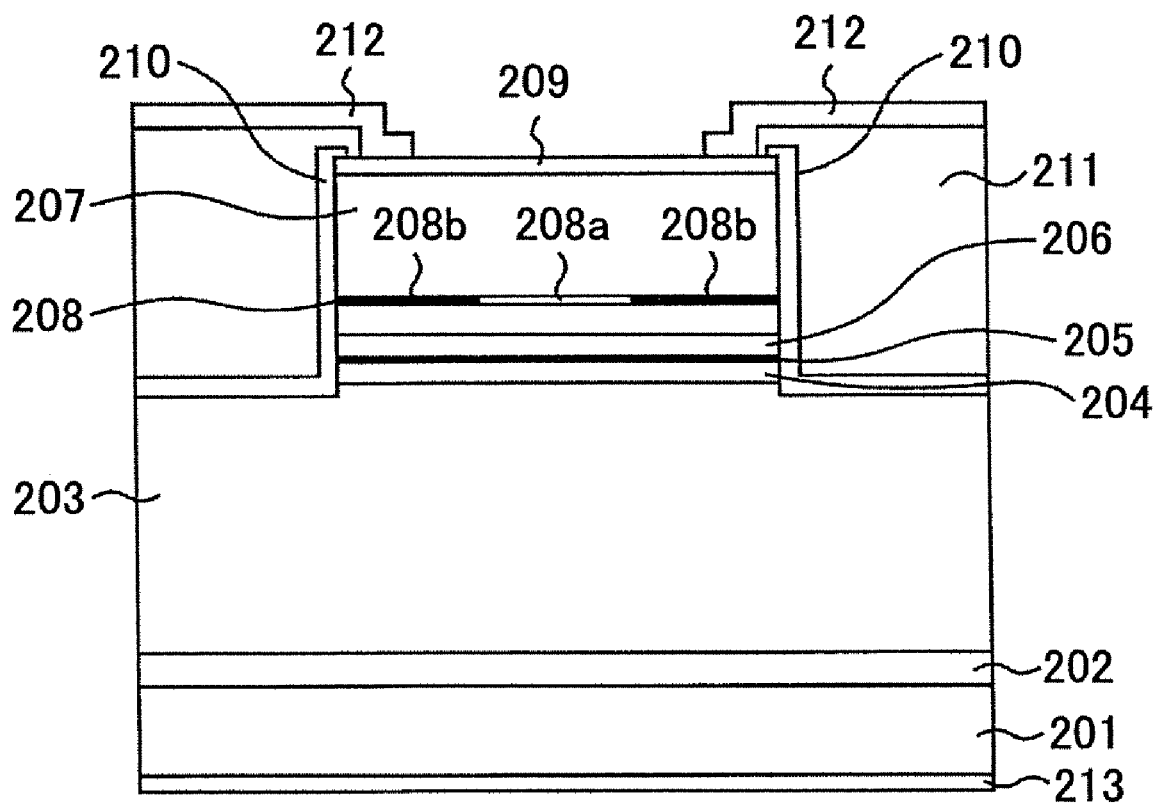
FIG. 20 is a schematic cross-sectional diagram showing a surface-emission laser device according to Embodiment 2 of the present invention.

FIG. 20 is a schematic cross-sectional diagram showing a surface-emission laser device according to Embodiment 2 of the present invention. Referring to FIG. 20, a surface-emission laser device 200 of the Embodiment 2 comprises a substrate 201, a buffer layer 202, reflection layers 203 and 207, cavity spacer layers 204 and 206, an active layer 205, a selective oxidation layer 208, a contact layer 209, an $SiO_2$ layer 210, an insulating resin layer 211, a p-side electrode 212, and an n-side electrode 213. The surface-emission laser device 200 is a surface-emission laser device of the 980 nm band.

The substrate 201 is formed of n-GaAs. The buffer layer 202 is formed of n-GaAs and is formed on a principal surface of the substrate 201. The reflection layer 203 is formed of [n-$Al_{0.9}Ga_{0.1}As$/GaAs] in which the n-$Al_{0.9}Ga_{0.1}As$/GaAs pair forming one period is repeated for 35.5 periods on the buffer layer 202.

The cavity spacer layer 204 is formed of undoped GaAs and is formed on the reflection layer 203. The active layer 205 has a multiple quantum well structure formed of InGaAs/GaAs pair and is formed on the cavity spacer layer 204.

The cavity spacer layer 206 is formed of undoped GaAs and is formed on the active layer 205. The reflection layer 207 is formed of [p-$Al_{0.9}Ga_{0.1}As$/GaAs] of 24 periods formed on the cavity spacer layer 206 by repeating the p-$Al_{0.9}Ga_{0.1}As$/GaAs pair.

The selective oxidation layer 208 is formed of p-AlAs and is provided inside the reflection layer 207. Further, the selective oxidation layer 208 is formed of a non-oxidized region 208a and an oxidized region 208b.

The contact layer 209 is formed of p-GaAs and is formed on the reflection layer 207. The $SiO_2$ layer 210 is formed so as to cover a part of the principal surface of the reflection layer 203, and the edge surfaces of the cavity spacer layer 204, the active layer 205, the cavity spacer layer 206, the reflection layer 207, the selective oxidation layer 208 and the contact layer 209.

The insulation resin layer 211 is formed adjacent to the $SiO_2$ layer 210. The p-side electrode 212 is formed on a part of the contact layer 209 and the insulating resin layer 211. The n-side electrode 213 is formed on a backside of the substrate 201.

Further, each of the reflection layers 203 and 207 constitute a semiconductor distributed Bragg reflector that confines the oscillating light oscillated in the active layer 205 into the active layer 205 as a result of Bragg multiple reflection.

In the surface-emission laser device 200, too, each of the reflection layers 203 and 207 includes therein a compositional gradation layer that changes the composition thereof from one composition of the low-refractive index layer ($Al_{0.9}Ga_{0.1}As$) and the high-refractive index layer (GaAs) included in the reflection layers 203 and 207 to the other composition. Further, the compositional gradation layer has a thickness of 20 nm, wherein this thickness is determined so as to satisfy the phase condition of Bragg multiple reflection for the oscillation light. More specifically, this thickness is determined such that there is caused a phase shift of $\pi/2$ for the oscillation light in the region formed of the low refractive index layer ($Al_{0.9}Ga_{0.1}As$) and the high-refractive index layer (GaAs) and a part of the compositional gradation layer.

Figure 21:
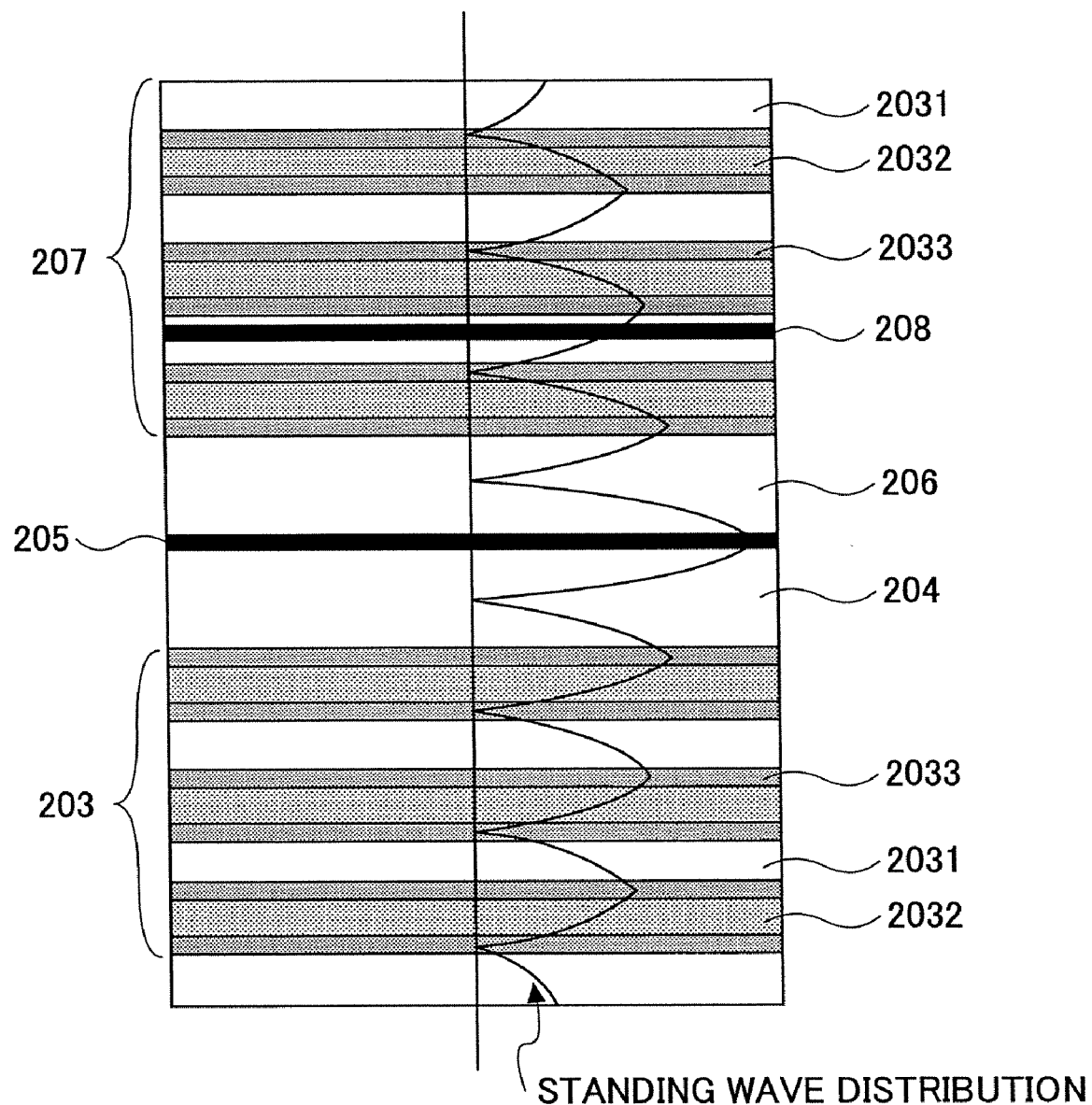
FIG. 21 is a diagram showing a part of the surface-emission laser device of FIG. 20 in the vicinity of a cavity region thereof.

FIG. 21 is a diagram showing a part of the surface-emission laser device 200 of FIG. 20 in the vicinity of the cavity region thereof. It should be noted that FIG. 21 also shows the electric field intensity distribution of the oscillation light in the oscillating state of the surface-emission laser device 200.

Referring to FIG. 21, the cavity region of the surface-emission laser device 200 is defined as the region formed of the cavity spacer layers 204 and 206 and the active layer 205. Thereby, it should be noted that the cavity region, formed of the cavity spacer layers 204 and 206 and the active layer 205, is set such that there occurs a phase shift amount of $2\pi$ in the semiconductor layers thereof. Thus, the cavity region forms a single wavelength cavity structure.

Further, in order to increase the probability of stimulated emission, the active layer 205 is provided centrally to the cavity region (=cavity spacer layers 204, 206 and active layer 205) at the location corresponding to the anti-node of the standing wave distribution of the oscillation light.

The reflection layers 203 and 207 are formed so as to make contact respectively with the cavity spacer layers 204 and 206 at the side of the low refractive index layer 2032. With this construction, the interface between the low-refractive index layer 2032 and the cavity spacer layer 204 or 206 (or compositional gradation layer 2033 in the case of Embodiment 2) is located at the anti-node of the standing wave distribution of the electric field formed by the oscillation light.

Similarly to Embodiment 1, there appear anti-nodes and nodes alternately in the location between the high-refractive index layer 2031 and the low-refractive index layer, where the compositional gradation layer 2033 is disposed.

The selective oxidation layer 208 is provided in the reflection layer 207 inside the high-refractive index layer 2032 at the first period location as counted from the cavity region (=cavity spacer layers 204 and 206 and active layer 205). More specifically, the selective oxidation layer 208 is provided at the location offset from the node of the standing wave distribution of the electric field formed by the oscillation wave in the direction away from the active layer 205 by a distance providing a phase shift of $3\pi/10$ for the oscillation light (and hence the distance of $\lambda/8n$ where n is the refractive index of the high-refractive index layer 2032). It should be noted that this location of the selective oxidation layer 208 is the location offset from the center of the high-refractive index layer 2031 (where the phase shift amount of the oscillation light from the node becomes $\pi/4$) in the direction toward the anti-node of the standing wave distribution.

The surface-emission laser device 100 shown in FIG. 20 is fabricated by the process steps (a)-(h) shown in FIGS. 5, 6 and 7. In this case, it is sufficient to read the substrate 101, the buffer layer 102, the reflection layers 103 and 107, the cavity spacer layers 104 and 106, the active layer 105, the selective oxidation layer 108, the contact layer 109, the $SiO_2$ layer 110, the insulating resin layer 111, the p-side electrode 112 and the n-side electrode 113 respectively as the substrate 201, the buffer layer 202, the reflection layers 203 and 207, the cavity spacer layers 204 and 206, the active layer 205, the selective oxidation layer 208, the contact layer 209, the $SiO_2$ layer 210, the insulating resin layer 211, the p-side electrode 212 and the n-side electrode 213.

Further, in the step (a) shown in FIG. 5, the n-GaAs layer of the buffer layer 202 is formed while using trimethyl gallium (TMG), arsine ($AsH_3$) and hydrogen selenide ($H_2Se$) for the source, the n-$Al_{0.9}Ga_{0.1}As$ layer of the reflection layer 203 is formed while using trimethyl aluminum (TMA), trimethyl gallium (TMG), arsine ($AsH_3$) and hydrogen selenide ($H_2Se$) for the source, and the n-GaAs layer of the reflection layer 203 is formed while using trimethyl gallium (TMG), arsine ($AsH_3$) and hydrogen selenide ($H_2Se$) for the source.

Further, the undoped GaAs layer of the cavity spacer layer 204 is formed while using trimethyl gallium (TMG) and arsine ($AsH_3$) for the source, the InGaAs layer of the active layer 205 is formed while using trimethyl indium (TMI), trimethyl gallium (TMG) and arsine ($AsH_3$) for the source, and the GaAs layer of the active layer 205 is formed while using trimethyl gallium (TMG) and arsine ($AsH_3$) for the source.

Further, the undoped GaAs layer of the cavity spacer layer 206 is formed while using trimethyl gallium (TMG) and arsine ($AsH_3$) for the source, the p-$Al_{0.9}Ga_{0.1}As$ layer of the reflection layer 107 is formed while using trimethyl aluminum (TMA), trimethyl gallium (TMG), arsine ($AsH_3$) and carbon tetrabromide ($CBr_4$) for the source, and the p-GaAs layer of the reflection layer 108 is formed of trimethyl gallium (TMG), arsine ($AsH_3$) and carbon tetrabromide ($CBr_4$) for the source.

Further, the p-AlAs layer of the selective oxidation layer 208 is formed while using trimethyl aluminum (TMA), arsine ($AsH_3$) and carbon tetrabromide ($CBr_4$) for the source material, and the p-GaAs layer of the contact layer 209 is formed while using trimethyl gallium (TMG), arsine ($AsH_3$) and carbon tetrabromide ($CBr_4$) for the source material.

Further, in the fabrication process of the surface-emission laser device 200, the region corresponding to the optical exit part is formed to have a square shape with an edge length of 25 μm, while the non-oxidized region 208a of the selective oxidation layer 208 is formed to have an edge length of 5 μm.

Otherwise, the fabrication process is the same to those explained with reference to FIGS. 5, 6 and 7.

Similarly to the surface-emission laser device 100, the surface-emission laser device 200 can oscillate in the single fundamental transverse mode up to the peak output power, and thus, it becomes possible to obtain a high output power as compared with the conventional surface-emission laser diode operating in the single fundamental transverse mode.

Figure 22:
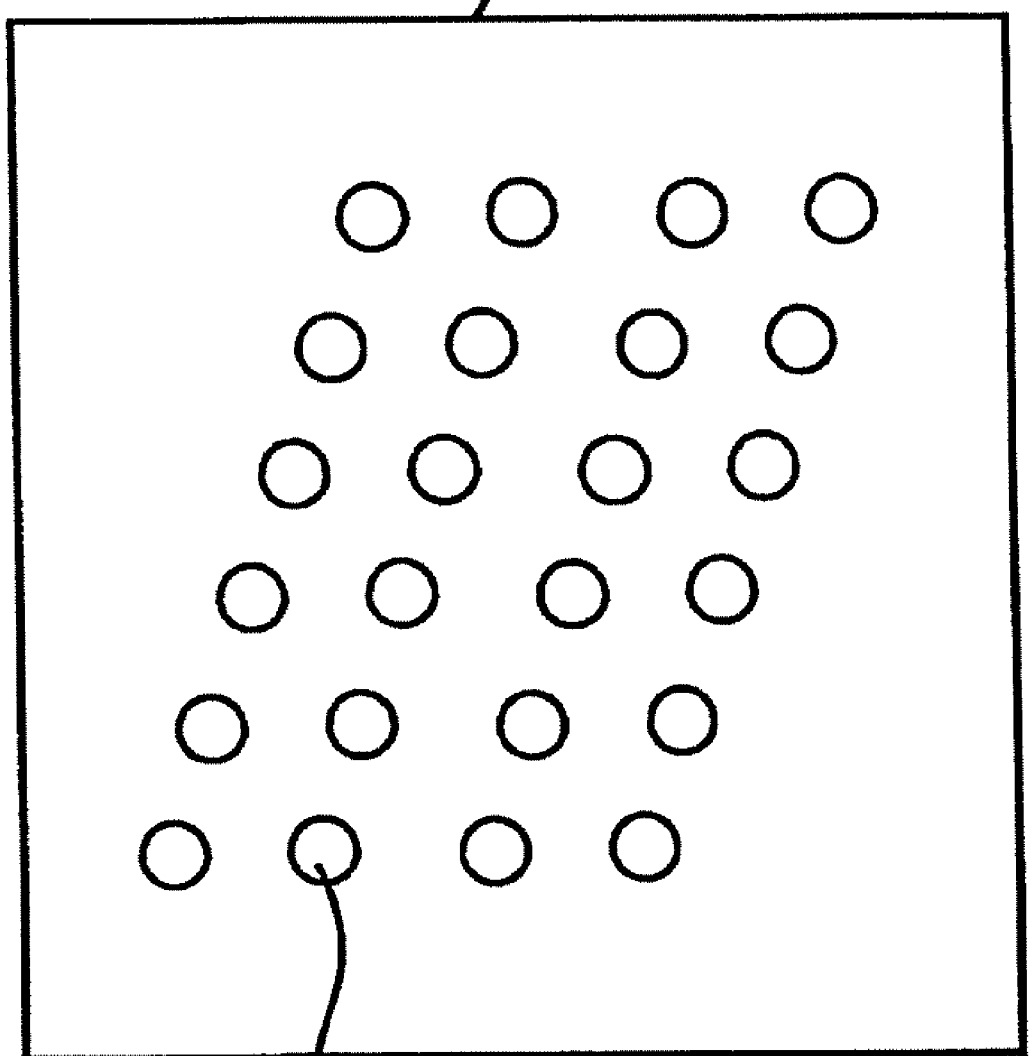
FIG. 22 is a plan view diagram of a surface-emission laser array that uses the surface-emission laser device shown in FIG. 20.

FIG. 22 is a plan view diagram of a surface-emission laser array that uses the surface-emission laser device 200 shown in FIG. 20. Referring to FIG. 22, the surface-emission laser array 300A has a structure in which 24 surface-emission laser devices 200 are disposed generally in the rhombic form array with a predetermined interval.

As noted before, the surface-emission laser array 200 can suppress the higher-order transverse mode oscillation and provide the single fundamental mode oscillation generally up to the peak output power. Thus, the surface-emission laser array 300A can also emit the oscillation light of single fundamental transverse mode oscillation generally up to the peak output power.

Further, because the surface-emission laser device 200 can increase the area of the non-oxidized region 208a similarly to the non-oxidized region 108a of the surface-emission laser device 100, the surface-emission laser array 300A can emit the oscillation light of higher output power.

Figure 23:
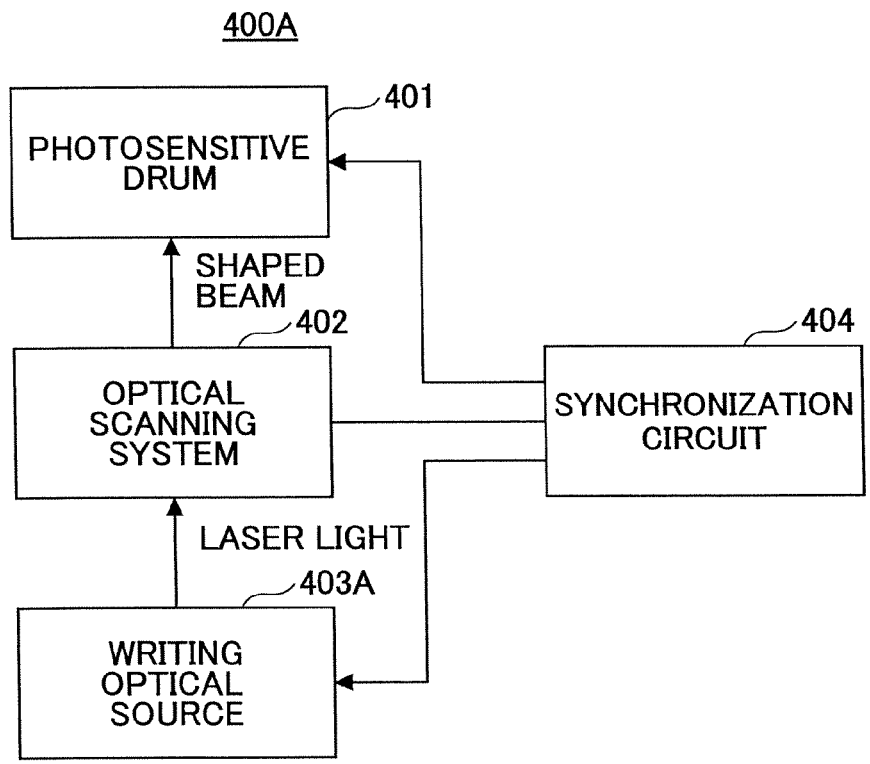
FIG. 23 is a schematic diagram of an electrophotographic system that uses the surface-emission laser device shown in FIG. 20 or the surface-emission laser array shown in FIG. 22.

FIG. 23 is a schematic diagram of an electrophotographic system that uses the surface-emission laser device 200 shown in FIG. 20 or the surface-emission laser array 300A shown in FIG. 22. Referring to FIG. 23, the electrophotographic system 400A has a construction similarly to that of the electrophotographic system 400 except that the writing optical source 403 of the electrophotographic system 400 of FIG. 18 is replaced with the writing optical source 403A.

The writing optical source 403A is formed of the surface-emission laser device 200 or the surface-emission laser array 300A and causes oscillation of laser light of single fundamental transverse mode under control of the synchronization control circuit 404. Further, the writing optical source 403A emits the oscillated laser light to the optical scanning system 402.

As noted above, the surface-emission laser device 200 and the surface-emission laser array 300A are capable of causing oscillation of laser light of single fundamental transverse mode with high output power, and thus, it becomes possible to achieve high-speed writing and obtain high-resolution images when they are applied to the electrophotographic system 400A.

Otherwise, the present embodiment is identical to electrophotographic system 400.

Figure 24:
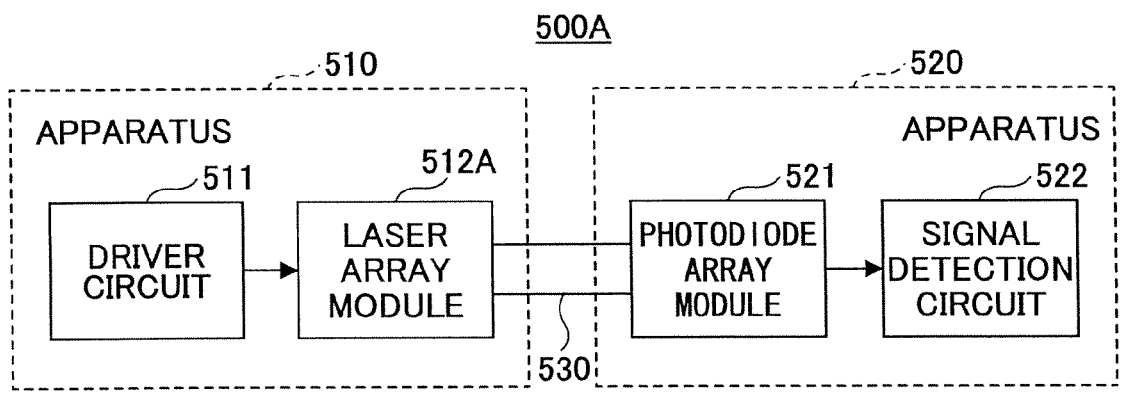
FIG. 24 is a plan view diagram of an optical communicating system that uses the surface-emission laser device shown in FIG. 20.

FIG. 24 is a plan view diagram of an optical communicating system that uses the surface-emission laser device 200 shown in FIG. 20. Referring to FIG. 24, the optical communication system 500A has a construction similar to that of the optical communication system 500 except that the laser array module 512 of the optical communication system 500 shown in FIG. 19 is replaced with a laser array module 512A.

The laser array module 512A is formed of an array module in which the surface-emission laser devices 200 are aligned in the form of one-dimensional array. Further, the plural surface-emission laser devices 200 forming the one-dimensional array are coupled to respective optical fibers of the optical fiber array 530.

Upon driving by the driver circuit 511, the laser array module 512A produces the laser lights of single fundamental transverse mode and transmits the transmission signals to the apparatus 520 via the optical fiber array after converting the transmission signals to optical signals. In the optical communication system 500A, it should be noted that the plural surface-emission laser devices 200 forming the one-dimensional array constitute a "surface-emission laser array".

As noted above, the surface-emission laser apparatus 200 is capable of emitting high power laser light in the single fundamental transverse mode, and thus, the apparatus 510 can perform the transmission to the apparatus 520 with reduced transmission error. As a result, reliability of the optical communication system 500A is improved.

The oxidized region 208b of the selective oxidation layer 208 constitutes "current confinement layer" and "suppression layer".

Otherwise, the present embodiment is identical to electrophotographic system 500.

Embodiment 3

Figure 25:
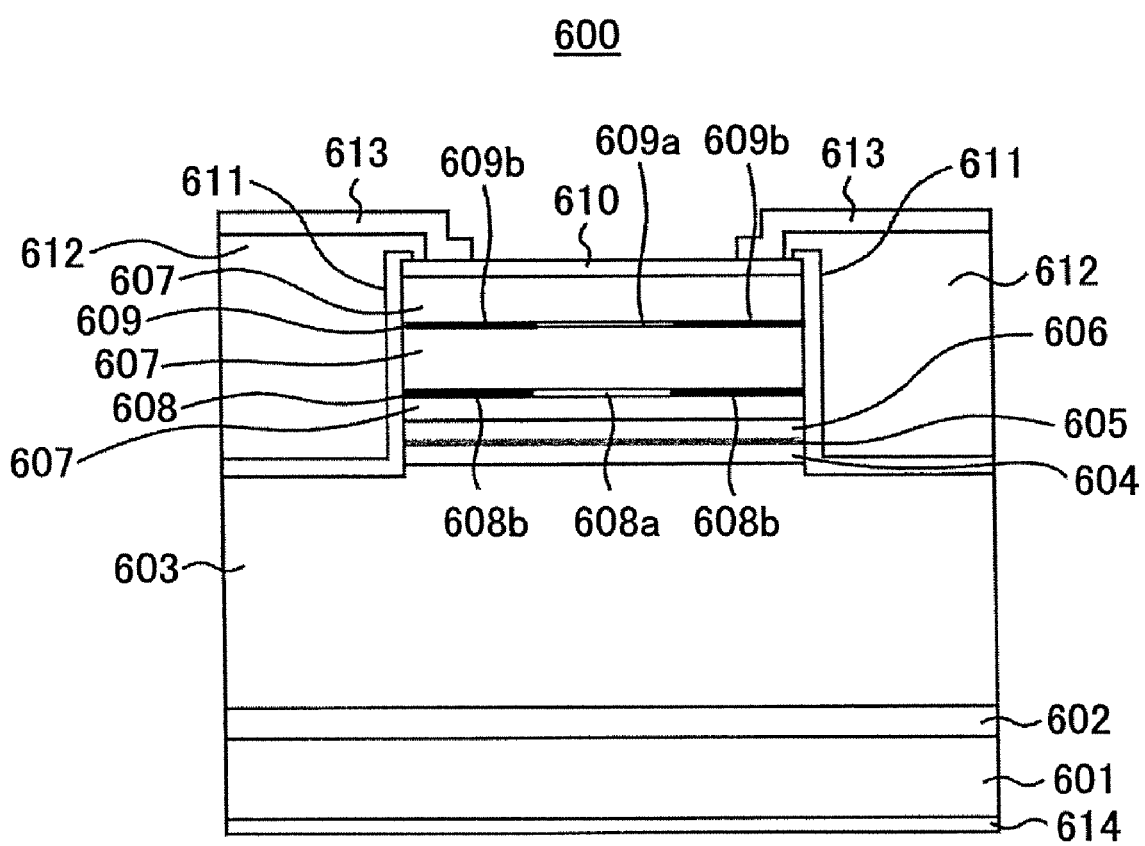
FIG. 25 is a schematic cross-sectional diagram showing a surface-emission laser device according to Embodiment 3 of the present invention.

FIG. 25 is a schematic cross-sectional diagram showing a surface-emission laser device according to Embodiment 3 of the present invention. Referring to FIG. 25, a surface-emission laser device 600 of the Embodiment 3 comprises a substrate 601, a buffer layer 602, reflection layers 603 and 607, cavity spacer layers 604 and 606, an active layer 605, selective oxidation layers 608 and 609, a contact layer 610, an $SiO_2$ layer 611, an insulating resin layer 612, a p-side electrode 613, and an n-side electrode 614. The surface-emission laser device 600 is a surface-emission laser device of the 780 nm band.

The substrate 601 is formed of n-GaAs. The buffer layer 602 is formed of n-GaAs and is formed on a principal surface of the substrate 601. The reflection layer 603 is formed by repeating the pair of n-$Al_{0.9}Ga_{0.7}As$/p-$Al_{0.3}Ga_{0.7}As$ as the unit of repetition and has a structure of [n-$Al_{0.9}Ga_{0.1}As$/n-$Al_{0.3}Ga_{0.7}As$] repeated for 41.5 times, wherein the reflection layer 603 is formed on the buffer layer 602.

The cavity spacer layer 604 is formed of an undoped $Al_{0.6}Ga_{0.4}As$ layer and is formed on the reflection layer 603. The active layer 605 has a multiple quantum well structure including therein a repetition of [AlGaAs/$Al_{0.6}Ga_{0.4}As$] structure for three periods and is formed on the cavity spacer layer 604, wherein the AlGaAs/$Al_{0.6}Ga_{0.4}As$ pair forms one period in counting the repetition.

The cavity spacer layer 606 is formed of an undoped $Al_{0.4}Ga_{0.6}As$ layer and is formed on the active layer 605. The reflection layer 607 is formed by repeating the pair of p-$Al_{0.9}Ga_{0.1}As$/p-$Al_{0.3}Ga_{0.7}As$ as the unit of repetition and has a structure of [p-$Al_{0.9}Ga_{0.6}As$/n-$Al_{0.3}Ga_{0.7}As$] repeated for 24 times, wherein the reflection layer 606 is formed on the cavity spacer layer 405.

The selective oxidation layer 608 is formed of p-AlAs and is provided inside the reflection layer 607. Thereby, it should be noted that the selective oxidation layer 608 includes a non-oxidized region 608a and an oxidized region 608b and has a thickness of 20 nm. The selective oxidation layer 609 is formed of p-AlAs and is provided inside the reflection layer 607. Thereby, it should be noted that the selective oxidation layer 609 includes a non-oxidized region 608a and an oxidized region 608b and has a thickness of 20 nm. Each of the non-oxidized regions 608a and 609a has a generally square shape having an edge length of 4 µm. Further, the selective oxidation layer 609 is disposed at a far side from the active layer 605 with regard to the selective oxidation layer 608.

The contact layer 610 is formed of p-GaAs and is formed on the reflection layer 607. The $SiO_2$ layer 611 is formed so as to cover a part of the principal surface of the reflection layer 603, and the edge surfaces of the cavity spacer layer 604, the active layer 605, the cavity spacer layer 606, the reflection layer 607, the selective oxidation layers 608 and 609 and the contact layer 610. In this case, the aperture not formed with the $SiO_2$ layer 611 has a square shape with a length of 8 µm for each edge.

The insulation resin layer 612 is formed adjacent to the $SiO_2$ layer 611. The p-side electrode 613 is formed on a part of the contact layer 610 and the insulating resin layer 612. The n-side electrode 614 is formed on a backside of the substrate 601.

Further, each of the reflection layer s 603 and 607 constitute a semiconductor distributed Bragg reflector that confines the oscillating light oscillated in the active layer 605 into the active layer 605 as a result of Bragg multiple reflection.

Figure 26:
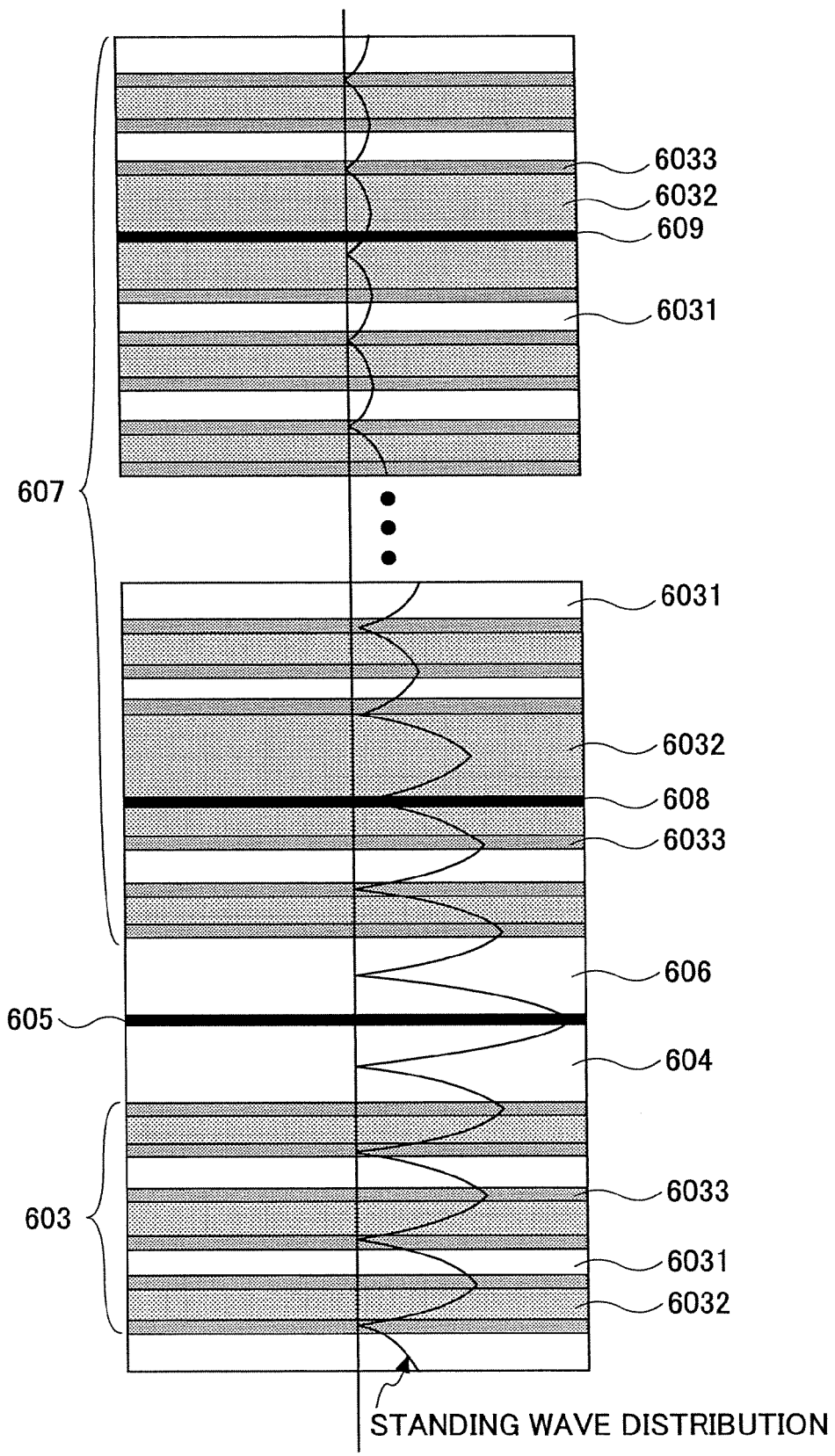
FIG. 26 is a diagram showing a part of the surface-emission laser device shown in FIG. 25 in the vicinity of a cavity region thereof.

FIG. 26 is a diagram showing a part of the surface-emission laser device 600 of FIG. 25 in the vicinity of the cavity region thereof. It should be noted that FIG. 26 also shows the electric field intensity distribution of the oscillation light in the oscillating state of the surface-emission laser device 600. Further, the solid dots in FIG. 26, and also in subsequent diagrams, represent the periodic repetition of the multilayer film constituting the reflection layer 607.

Referring to FIG. 26, each of the reflection layers 603 and 607 includes a high-refractive index layer 6031, a low-refractive index layer 6032 and a compositional gradation layer 6033. In the reflection layer 603, the high-refractive index layer 6031 is formed of n-$Al_{0.3}Ga_{0.7}As$ while the low-refractive index layer 6032 is formed of n-$Al_{0.9}Ga_{0.1}As$. Further, the compositional gradation layer 6033 is formed of n-AlGaAs in which the composition thereof is changed from one composition of the low-refractive index layer 6031 and the high-refractive index layer 6032 toward the other of the foregoing compositions.

In the reflection layer 607, the high-refractive index layer 6031 is formed of p-$Al_{0.3}Ga_{0.7}As$ while the low-refractive index layer 6032 is formed of p-$Al_{0.9}Ga_{0.1}As$. Further, the compositional gradation layer 6033 is formed of p-AlGaAs in which the composition thereof is changed from one composition of the low-refractive index layer 6031 and the high-refractive index layer 6032 toward the other of the foregoing compositions.

The cavity region of the surface-emission laser device 600 is defined as the region formed of the cavity spacer layers 604 and 606 and the active layer 605. Thereby, it should be noted that the cavity region, formed of the cavity spacer layers 604 and 606 and the active layer 605, is provided such that there occurs a phase shift amount of $2\pi$ in the semiconductor layers thereof. Thus, the cavity region forms a single wavelength cavity structure.

Further, in order to increase the probability of stimulated emission, the active layer 605 is provided centrally to the cavity region (=cavity spacer layers 604, 606 and active layer 605) at the location corresponding to the anti-node of the standing wave distribution of the oscillation light.

The reflection layers 603 and 607 are formed so as to make contact respectively with the cavity spacer layers 604 and 606 at the side of the low refractive index layer 6032. With this construction, the interface between the low-refractive index layer 6032 and the cavity spacer layer 604 or 606 (or compositional gradation layer 6033 in the case of Embodiment 3) is located at the anti-node of the standing wave distribution of the electric field formed by the oscillation light.

Further, similarly to Embodiment 1, there appear antinodes and nodes alternately in the location between the high-refractive index layer 6031 and the low-refractive index layer 6032, where the compositional gradation layer 6033 is disposed.

The selective oxidation layer 608 is provided inside the low-refractive index layer 6032 located at the second period from the cavity region (=cavity spacer layers 604 and 605 and active layer 605). More specifically, the selective oxidation layer 608 is provided at a location corresponding to the second node of the standing wave distribution of the electrode of the oscillation light. The thickness of the low-refractive index layer 6032 in which the selective oxidation layer 608 is provided, is set such that there is caused a phase shift of $3\pi/2$ for the oscillation light in the region extending from the central part of the compositional graded layer 603 adjacent to one side of the low-refractive index layer 6032 to the central part of the compositional graded layer 6033 adjacent to the low-refractive index layer 6032 at the other side thereof (the region of film thickness d2 shown in FIG. 2). Here, the selective oxidation layer 608 functions as the current confinement layer that confines the current injected into the active layer 605.

The selective oxidation layer 609 is provided inside the low-refractive index layer 6032 located at the fifteenth period from the cavity region (=cavity spacer layers 604 and 605 and active layer 605). More specifically, the selective oxidation layer 609 is provided at the location offset from the node at the fifteenth period of the standing wave distribution of the electric field caused by the oscillation light in the direction away from the active layer 605 by a distance providing a phase shift of $\pi/4$ for the oscillation light (and hence the distance of $\lambda/8n$ where n represents the refractive index of the low-refractive index layer 6032). Thereby, the thickness of the low-refractive index layer 6032 in which the selective oxidation layer 609 is provided is set generally equal to the thickness of the low-refractive index layer 6032 in which the selective oxidation layer 608 is provided. Thus, the selective oxidation layer 609 functions as the suppression layer suppressing the higher-order transverse mode of the oscillation light similarly to the selective oxidation layer 108 of Embodiment 1.

Thus, with the surface-emission laser device 600, there are provided two selective oxidation layers, 608 and 609, wherein the selective oxidation layer 609 functioning as the suppression layer suppressing the higher-order transverse mode is provided at a location further away from the active layer 605 with regard to the selective oxidation layer 608 that functions as the current confinement layer.

Figure 27:
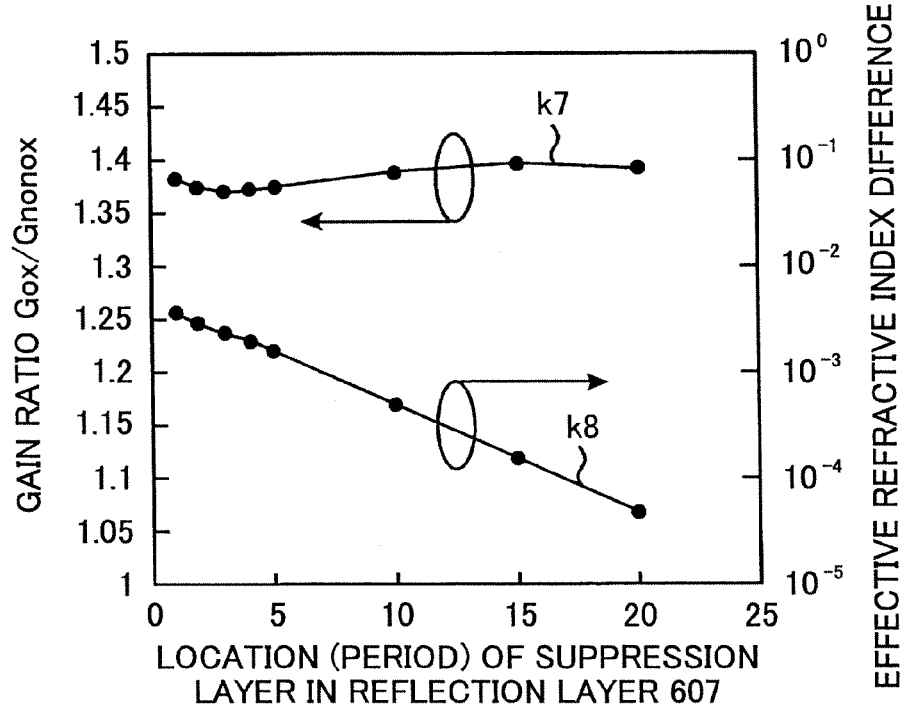
FIG. 27 is a diagram showing the relationship between the location of the of the selective oxidation layer, gain ratio and effective refractive index difference for the case of disposing the selective oxidation layer functioning as a suppression layer in the low-refractive index layer.

FIG. 27 is a diagram showing the relationship between the location of the of the selective oxidation layer 609, the gain ratio and the effective refractive index difference for the case of disposing the selective oxidation layer 609 functioning as a suppression layer in the low-refractive index layer 6032. Further, FIG. 28 is a diagram showing the relationship between the location of the of the selective oxidation layer 609 and the oscillation threshold gain for the case of disposing the selective oxidation layer 609 functioning as the suppression layer in the low-refractive index layer 6032.

In FIG. 27, the vertical axes represent the gain ratio of the oscillation threshold gain Gnonox of the non-oxidized region 609a to the oscillation threshold gain Gox of the oxidized region 609b in the selective oxidation layer 609 and further the effective refractive index difference, while the horizontal axis represents the location (period) of the suppression layer (=selective oxidation layer 609) in the reflection layer 607. The larger the number of the period, the larger the distance from the active layer 605 to the suppression layer (=selective oxidation layer 609). Further, the curve k7 represents the relationship between the location of the selective oxidation layer 609 and the gain ratio, while the curve k8 represents the relationship between the location of the selective oxidation layer 609 and the effective refractive index difference.

Figure 28:
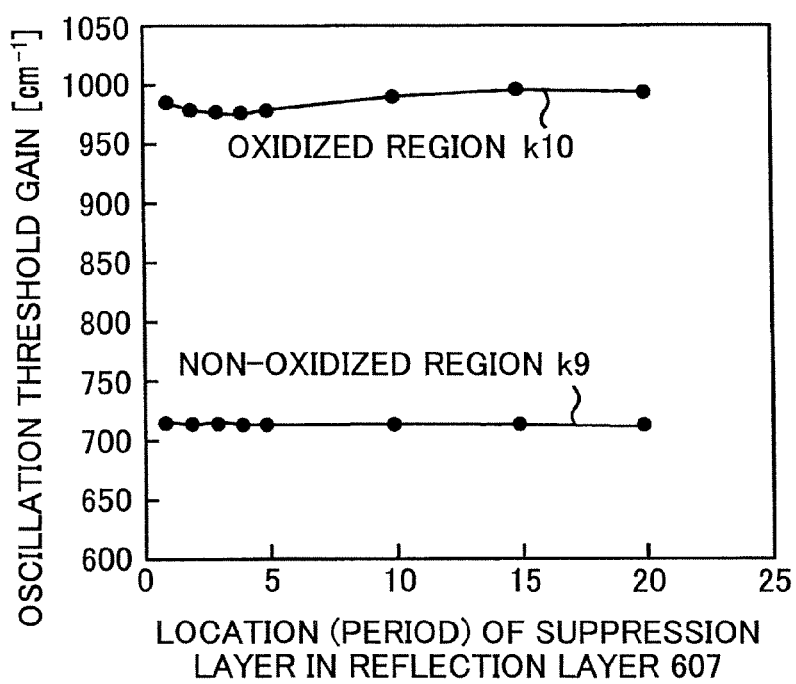
FIG. 28 is a diagram showing the relationship between the location of the selective oxidation layer and the oscillation threshold gain for the case of disposing the selective oxidation layer functioning as a suppression layer in the low-refractive index layer.

In FIG. 28, the vertical axis represents the oscillation threshold gain while the horizontal axis represents the location (period) of the suppression layer (=selective oxidation layer 609) in the reflection layer 607. Further, the curve k9 represents the oscillation threshold gain in the non-oxidized region 609a of the selective oxidation layer 609, while the curve k10 represents the oscillating threshold gain in the oxidized region 609b of the selective oxidation layer 609.

Referring to FIG. 27, it can be seen that there is caused a significant decrease of effective refractive index difference with increase in the number of the period of the reflection layer 607 in which the suppression layer (=selective oxidation layer 609) is disposed (reference should be made to curve k8). Further, with decrease of the effective refractive index difference, it can be seen that there is caused a decrease of diffraction loss caused by the suppression layer (=selective oxidation layer 609).

With regard to the gain ratio, on the other hand, there is caused little change even when the location of the suppression layer (=selective oxidation layer 609) is changed, and a gain ratio of about 1.37 is attained (reference should be made to curve k7). Further, as shown in FIG. 28, there is caused little change in the magnitude of the oscillation threshold gain for any of the non-oxidized region 609a and the oxidized region 609b (reference should be made to curves k9 and k10).

The reason that the gain ratio (curve k7) shown in FIG. 27 takes the value of about 1.37 is that the oscillation gain for the oxidized region 609b (curve k10) is larger than the oscillation threshold gain (curve k9) of the non-oxidized region 609a. Further, with increase of the oscillation threshold gain, there increases the diffraction loss. Further, because higher transverse modes have larger lateral mode spreading as compared with the fundamental transverse mode and thus having large spatial overlapping with the oxidized region 609b, the oscillation threshold gain in the oxidized region 609b corresponds to the oscillation threshold gain of the higher-order transverse modes, while the oscillation threshold gain in the non-oxidized region 609a corresponds to the oscillation threshold gain of the fundamental transverse mode.

Thus, by disposing the suppression layer (=selective oxidation layer 609) to the location relatively away from the active layer 605, it becomes possible to reduce the diffraction loss caused by the suppression layer (=selective oxidation layer 609) significantly while maintaining high suppression ratio of the higher-order transverse modes.

Thus, as noted above, the selective oxidation layer 609 functioning as the suppression layer suppressing the higher-order transverse mode is disposed at the location further away from the active layer 605 with regard to the selective oxidation layer 608 that functions as the current confinement layer.

In the case the same selective oxidation layer is used for the suppression layer and the current confinement layer, there is caused increase of threshold current as a result of re-spreading of the carriers passed through the suppression layer (=current confinement layer), which in turn is caused as a result of increased distance of the suppression layer (=current confinement layer) from the active layer 605. In order to avoid this, it is necessary to provide the current confinement layer close to the active layer 605.

Thus, with Embodiment 3, the current confinement layer and the suppression layer are formed by different selective oxidation layers 608 and 609 and the selective oxidation layer 608 functioning as the current confinement layer is disposed at the closer location to the active layer 605 (inside the low-refractive index layer 6032 a the second period from the cavity region) while disposing the selective oxidation layer 609 functioning as the suppression layer at the further location from the active layer 605 (in the low-refractive index layer 6032 at the fifteenth period from the cavity region).

Thus, with the surface-emission laser device 600, the distance between the suppression layer (=selective oxidation layer 609) and the active layer 605 is larger than the distance between the current confinement layer (=selective oxidation layer 608) and the active layer 605.

Thus, with this feature, it becomes possible to realize high output oscillation in single fundamental mode with the surface-emission laser device 600 while maintaining low threshold current and low diffraction loss (=high slope efficiency).

Further, with the surface-emission laser device 600, the selective oxidation layer 608 is provided at the location corresponding to the node of the standing wave distribution of the electric field caused by the oscillation light.

With this feature, it is possible to suppress the diffraction loss of the oscillation light caused by the selective oxidation layer 608. As a result, higher output is attained for the surface-emission laser device 600.

The surface-emission laser device 600 is fabricated by the process steps (a)-(h) shown in FIGS. 5, 6 and 7. In this case, it is sufficient to read the substrate 101, the buffer layer 102, the reflection layers 103 and 107, the cavity spacer layers 104 and 106, the active layer 105, the selective oxidation layer 108, the contact layer 109, the SiO$_2$ layer 110, the insulating resin layer 111, the p-side electrode 112 and the n-side electrode 113 respectively as the substrate 601, the buffer layer 602, the reflection layers 603 and 607, the cavity spacer layers 604 and 606, the active layer 605, the selective oxidation layers 608 and 609, the contact layer 610, the SiO$_2$ layer 611, the insulating resin layer 612, the p-side electrode 613 and the n-side electrode 614.

While it has bee explained in the foregoing that the area of the non-oxidized region 608a of the selective oxidation layer 608 is identical to the area of the non-oxidized region 609a of the selective oxidized region 609, the present invention is not limited to such a case, and it is possible that the area of the non-oxidized region 608a in the selective oxidation layer 608 is different from the area of the non-oxidized region 609a of the selective oxidized region 609.

The effect of suppressing the higher-order transverse mode is generally determined by the area, of the non-oxidized region 609a of the suppression layer (=selective oxidation layer 609). Thus, by setting the area of the non-oxidized region 608a of the current confinement layer (=selective oxidation layer 608) to be larger than the area of the non-oxidized region 609a of the suppression layer (=selective oxidation layer 609), there is caused increase of the area of the current injection region (oscillation region) to the active layer 605, and it becomes possible to obtain further high output power oscillation light while suppressing the higher-order transverse mode.

In this case, the selective oxidation layers 608 and 609 can be formed by Al$_x$Ga$_{1-x}$As ($0.9 \leq x \leq 1$) of large Al composition. Because the selective oxidation layer of AlGaAs and AlAs has a larger oxidation rate with increased film thickness or with increased Al composition, it is possible to form the two selective oxidation layers 608 and 609 having different areas for the non-oxidized region with a single oxidation step by adjusting the Al content or film thickness.

The surface-emission laser device 600 is used for the surface-emission laser array 300 shown in FIG. 17. Further, the surface-emission laser device 600 and the surface-emission laser array 300 that uses the surface-emission laser device 600 are used for the electrophotographic system 400 shown in FIG. 18 and for the optical communication system 500 shown in FIG. 19.

Embodiment 4

A surface-emission laser device 700 has a construction similar to that of the surface-emission laser device 600 shown in FIG. 25, except that the selective oxidation layer 608 is replaced with high-resistance regions 708a and 708b. Thus, the substrate 701, the buffer layer 702, the reflection layer 703, the cavity spacer layers 704 and 706, the selective oxidation layer 709, the contact layer 710, the SiO$_2$ layer 711, the insulating resin layer 712, the p-side electrode 713 and the n-side electrode 714 are identical with the substrate 601, the buffer layer 602, the reflection layer 603, the cavity spacer layers 604 and 606, the selective oxidation layer 609, the contact layer 610, the SiO$_2$ layer 611, the insulating resin layer 612, the p-side electrode 613 and the n-side electrode 614, respectively.

Thus, each of the reflection layers 703 and 707 constitute a semiconductor distributed Bragg reflector that confines the oscillating light oscillated in the active layer 705 into the active layer 705 as a result of Bragg multiple reflection. Further, the selective oxidation layer 709 functions as the suppression layer suppressing the higher-order transverse mode of the oscillation light.

Further, the high-resistance regions 708a and 708b have a resistance higher than any of the semiconductor layers (=reflection layers 703 and 707, the cavity spacers 704 and 706, active layer 705) existing between the high-resistance layers 708a and 708b.

Figure 29:
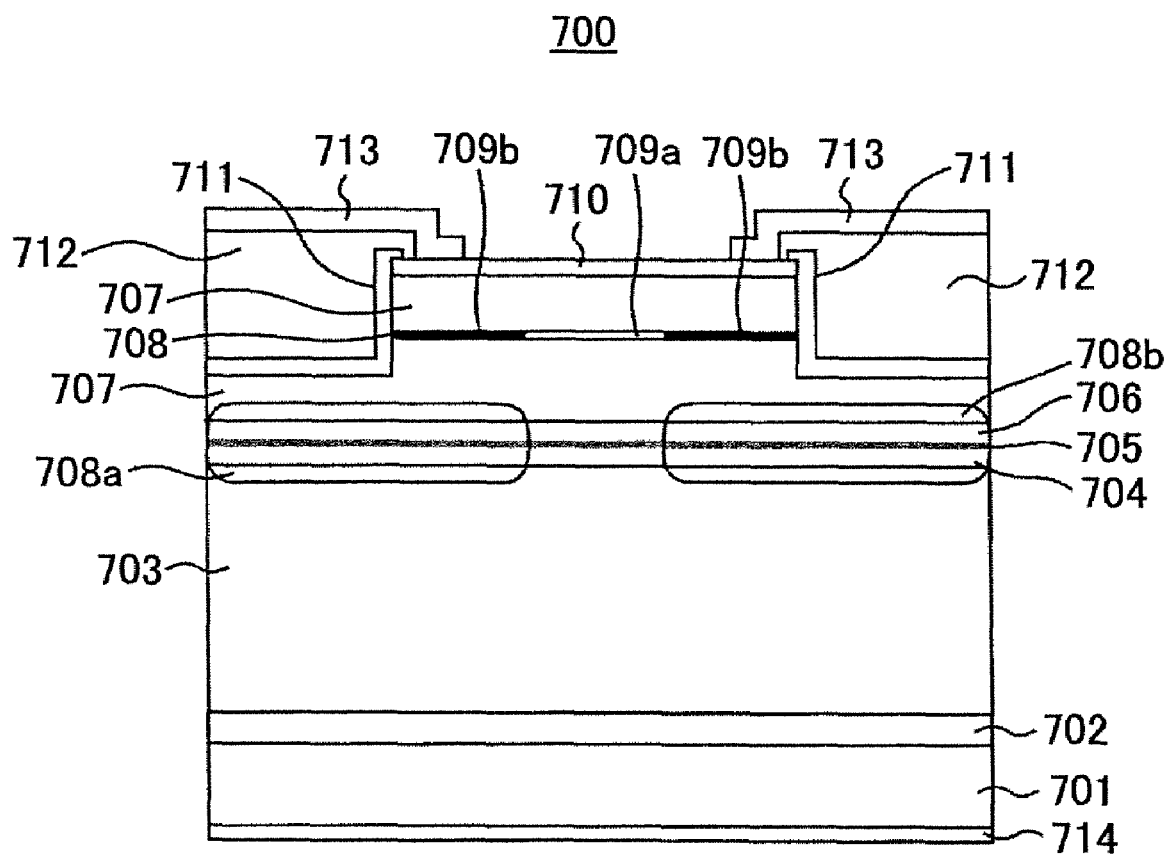
FIG. 29 is a schematic cross-sectional diagram showing a surface-emission laser device according to Embodiment 4 of the present invention.
Figure 30:
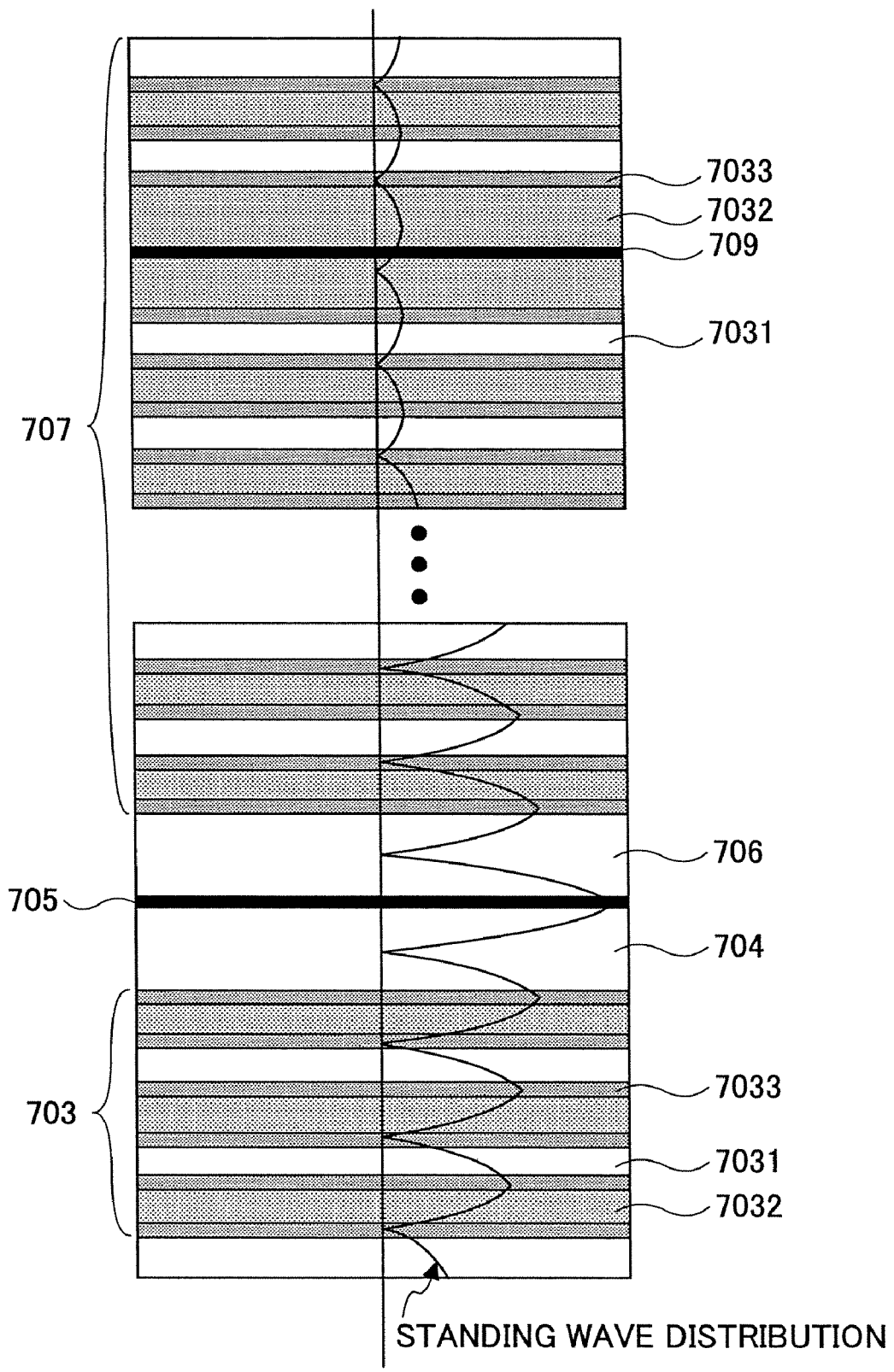
FIG. 30 is a diagram showing a part of the surface-emission laser device of FIG. 29 in the vicinity of a cavity region (=formed of cavity spacer layer and active layer) thereof.

FIG. 30 is a diagram showing a part of the surface-emission laser device 700 of FIG. 29 in the vicinity of a cavity region (=formed of cavity spacer layers 704, 706 and active layer 705) thereof. It should be noted that FIG. 30 also shows the electric field intensity distribution of the oscillation light in the oscillating state of the surface-emission laser device 700.

Referring to FIG. 30, each of the reflection layers 703 and 707 includes a high-refractive index layer 7031, a low-refractive index layer 7032 and a compositional gradation layer 7033. In the reflection layer 703, the high-refractive index layer 7031 is formed of n-$Al_{0.3}Ga_{0.7}As$ while the low-refractive index layer 7032 is formed of n-$Al_{0.9}Ga_{0.1}As$. Further, the compositional gradation layer 7033 is formed of n-AlGaAs in which the composition thereof is changed from one composition of the low-refractive index layer 7031 and the high-refractive index layer 7032 toward the other of the foregoing compositions.

In the reflection layer 707, the high-refractive index layer 7031 is formed of p-$Al_{0.3}Ga_{0.7}As$ while the low-refractive index layer 7032 is formed of p-$Al_{0.9}Ga_{0.1}As$. Further, the compositional gradation layer 7033 is formed of p-AlGaAs in which the composition thereof is changed from one composition of the low-refractive index layer 7031 and the high-refractive index layer 7032 toward the other of the foregoing compositions.

The cavity region of the surface-emission laser device 700 is defined as the region formed of the cavity spacer layers 704 and 706 and the active layer 705. Thereby, it should be noted that the cavity region, formed of the cavity spacer layers 704 and 706 and the active layer 705, is provided such that there occurs a phase shift amount of $2\pi$ in the semiconductor layers thereof. Thus, the cavity region forms a single wavelength cavity structure.

Further, in order to increase the probability of stimulated emission, the active layer 705 is provided centrally to the cavity region (=cavity spacer layers 704, 706 and active layer 705) at the location corresponding to the anti-node of the standing wave distribution of the oscillation light.

The reflection layers 703 and 707 are formed so as to make contact respectively with the cavity spacer layers 704 and 706 at the side of the low refractive index layer 7032. With this construction, the interface between the low-refractive index layer 7032 and the cavity spacer layer 704 or 706 (or compositional gradation layer 7033 in the case of Embodiment 4) is located at the anti-node of the standing wave distribution of the electric field formed by the oscillation light.

Further, similarly to Embodiment 1, there appear anti-nodes and nodes alternately in the location between the high-refractive index layer 7031 and the low-refractive index layer 7032, where the compositional gradation layer 7033 is disposed.

The selective oxidation layer 709 is provided inside the low-refractive index layer 7032 located at the fifteenth period from the cavity region (=cavity spacer layers 704 and 706 and active layer 705). More specifically, the selective oxidation layer 709 is provided at the location offset from the node at the fifteenth period of the standing wave distribution of the electric field caused by the oscillation light in the direction away from the active layer 705 by a distance providing a phase shift of $\pi/5$ for the oscillation light (and hence the distance of $\lambda/10n$ where n represents the refractive index of the low-refractive index layer 7032).

The thickness of the low-refractive index layer 7032 in which the selective oxidation layer 709 is provided, is set such that there is caused a phase shift of $3\pi/2$ for the oscillation light in the region extending from the central part of the compositional graded layer 7033 adjacent to one side of the low-refractive index layer 7032 to the central part of the compositional graded layer 7032 adjacent to the low-refractive index layer 7033 at the other side thereof (the region of film thickness d2 shown in FIG. 2). Further, the selective oxidation layer 709 functions as the suppression layer suppressing the higher-order transverse mode of the oscillation light.

With the surface-emission laser device 700, the high-resistance regions 708a and 708b function to restrict the current injected into the active layer 705. Thus, the high-resistance regions 708a and 708b function as the current confinement layer. Thereby, the high-resistance regions 708a and 708b are formed by injecting hydrogen ions into a part of the reflection layers 703 and 707, the cavity spacer layers 704 and 706 and the active layer 705.

Because the high-resistance regions 708a and 708b formed by injection of hydrogen ions cause little refractive index difference with regard to the region not injected with the hydrogen ions, it becomes possible to avoid the effect of diffraction loss, or the like, for the current confinement layer (=high-resistance regions 708a and 708b).

Further, with the surface-emission laser device 700, in which the high-resistance regions 708a and 708b are formed by injecting hydrogen ions into a part of the reflection layers 703, 707, the cavity spacer layers 704, 706 and the active layer 705, the suppression layer (=selective oxidation layer 709) is provided at a location further away from the active layer 705 with regard to the current confinement layer (=high-resistance regions 708a and 708b).

Thus, with this feature, it becomes possible to realize high output oscillation in single fundamental mode with the surface-emission laser device 700 while maintaining low threshold current and low diffraction loss (=high slope efficiency).

In the surface-emission laser device 700, in which there is formed a mesa structure by etching the peripheral parts of the reflection layer 707, the selective oxidation layer 709 and the contact layer 710, it should be noted that the high-resistance layers 708a and 708b also function to isolate the active layer 705 from the active layer of the surface-emission laser device adjacent to he surface-emission laser device 700.

In the case of forming the surface-emission laser array that uses the surface-emission laser device 700, a plurality of the surface-emission laser devices 700 are formed simultaneously on the substrate 701. Thus, in the case the high-resistance regions 708a and 708b are not provided, the active layers 705 of the plurality of surface-emission laser devices 700 are connected with each other, while it becomes possible to isolate the respective active layers 705 of the plurality of surface-emission laser devices 700 by forming the high-resistant regions 708a and 708b.

Figure 31:
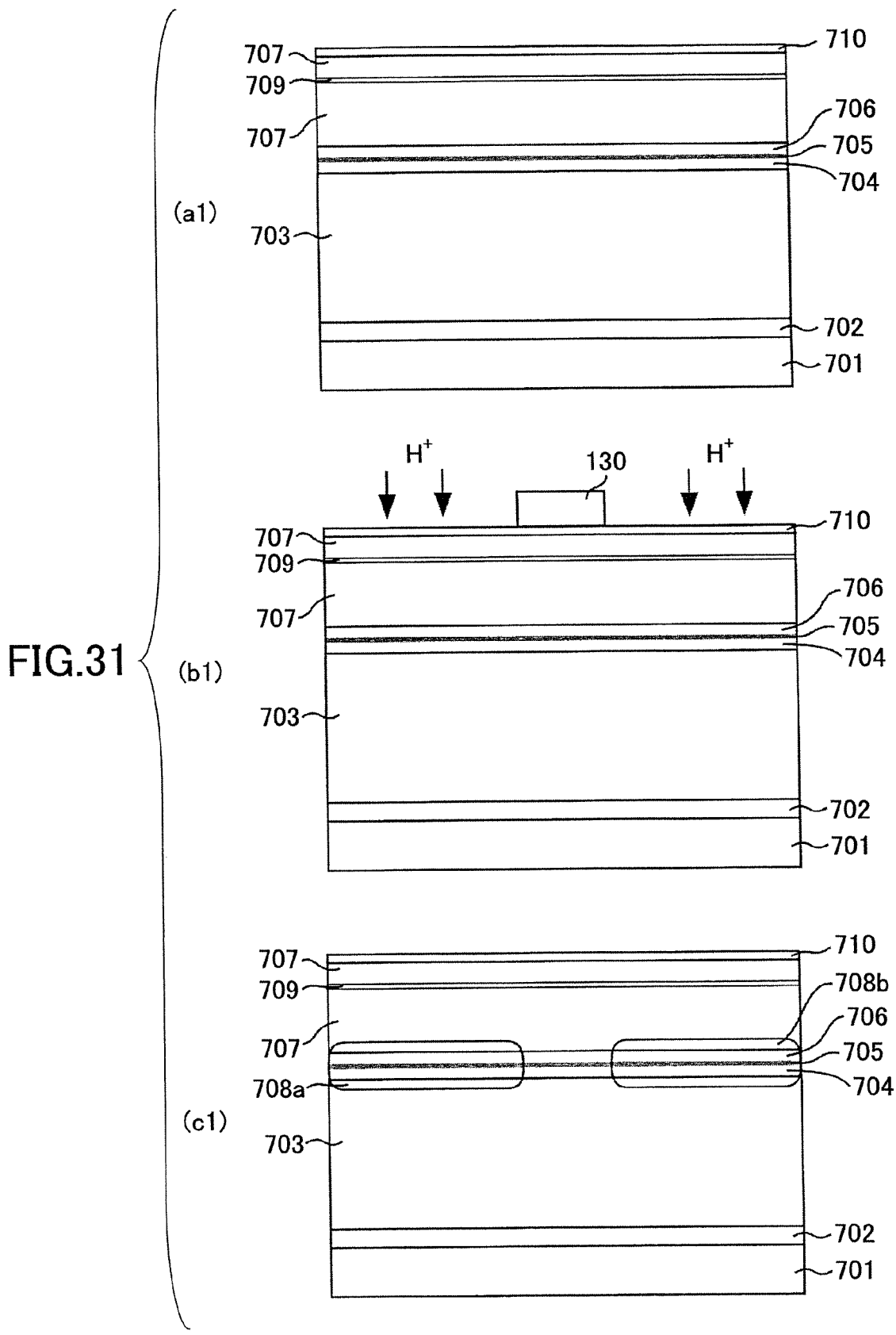
FIG. 31 is a diagram showing a first step of fabricating the surface-emission laser device of FIG. 29.

FIGS. 31, 32, 33 and 34 are respectively first through fourth process step diagrams showing the fabrication process of the surface-emission laser array 700 shown in FIG. 29. Referring to FIG. 31, the buffer layer 702, the reflection layer 703, the cavity spacer layer 704, the active layer 705, the cavity spacer layer 706, the reflection layer 707, the selective oxidation layer 709 and the contact layer 710 are stacked consecutively on the substrate 701 by using an MOCVD process upon commencement of a series of process steps (reference should be made to step (a1) of FIG. 31).

Therein, the n-GaAs layer forming the buffer layer 702 is formed while using trimethyl gallium (TMG), arsine ($AsH_3$) and hydrogen selenide ($H_2Se$) as the source, while the n-$Al_{0.9}Ga_{0.1}As$ layer and the n-$Al_{0.3}Ga_{0.7}As$ layer constituting the reflection layer 703 are formed while using trimethyl aluminum (TMA), trimethyl gallium (TMG), arsine ($AsH_3$) and hydrogen selenide ($H_2Se$) for the source.

Further, the undoped $Al_{0.6}Ga_{0.4}As$ layer of the cavity spacer layer 704 is formed while using trimethyl aluminum (TMA), trimethyl gallium (TMG) and arsine ($AsH_3$) for the source and the $AlGaAs/Al_{0.6}Ga_{0.4}As$ of the active layer 705 is formed while using trimethyl aluminum (TMA), trimethyl gallium (TMG) and arsine ($AsH_3$) for the source.

Further, the undoped $Al_{0.6}Ga_{0.4}As$ layer of the cavity spacer layer 706 is formed while using trimethyl aluminum (TMA), trimethyl gallium (TMG) and arsine ($AsH_3$) for the source and the p-$Al_{0.9}Ga_{0.1}As/Al_{0.3}Ga_{0.7}As$ of the reflection layer 707 is formed while using trimethyl aluminum (TMA), trimethyl gallium (TMG), arsine ($AsH_3$) and carbon tetrabromide ($CBr_4$) for the source.

Further, the p-AlAs layer of the selective oxidation layer 709 is formed while using trimethyl aluminum (TMA), arsine ($AsH_3$) and carbon tetrabromide ($CBr_4$) for the source material, and the p-GaAs layer of the contact layer 710 is formed while using trimethyl gallium (TMG), arsine ($AsH_3$) and carbon tetrabromide ($CBr_4$) for the source material.

Thereafter, a resist film is coated upon the contact layer 710 and a resist pattern 130 is formed on the contact layer 710 while using a photolithographic process (reference should be made to the step (b1) of FIG. 31). In the present case, the resist pattern 130 has a square shape with an edge length of 4 μm.

Upon formation of the resist pattern 130, ion implantation of hydrogen ions (H+) is conducted into the reflection layers 703 and 707, the cavity spacer layers 704 and 706 and a part of the active layer 705 while using the resist pattern 130 thus formed as a mask, and with this, there are formed the high-resistance regions 708a and 708b. Thereafter, the resist pattern 130 is removed (reference should be made to (c1) of FIG. 31).

Figure 32:
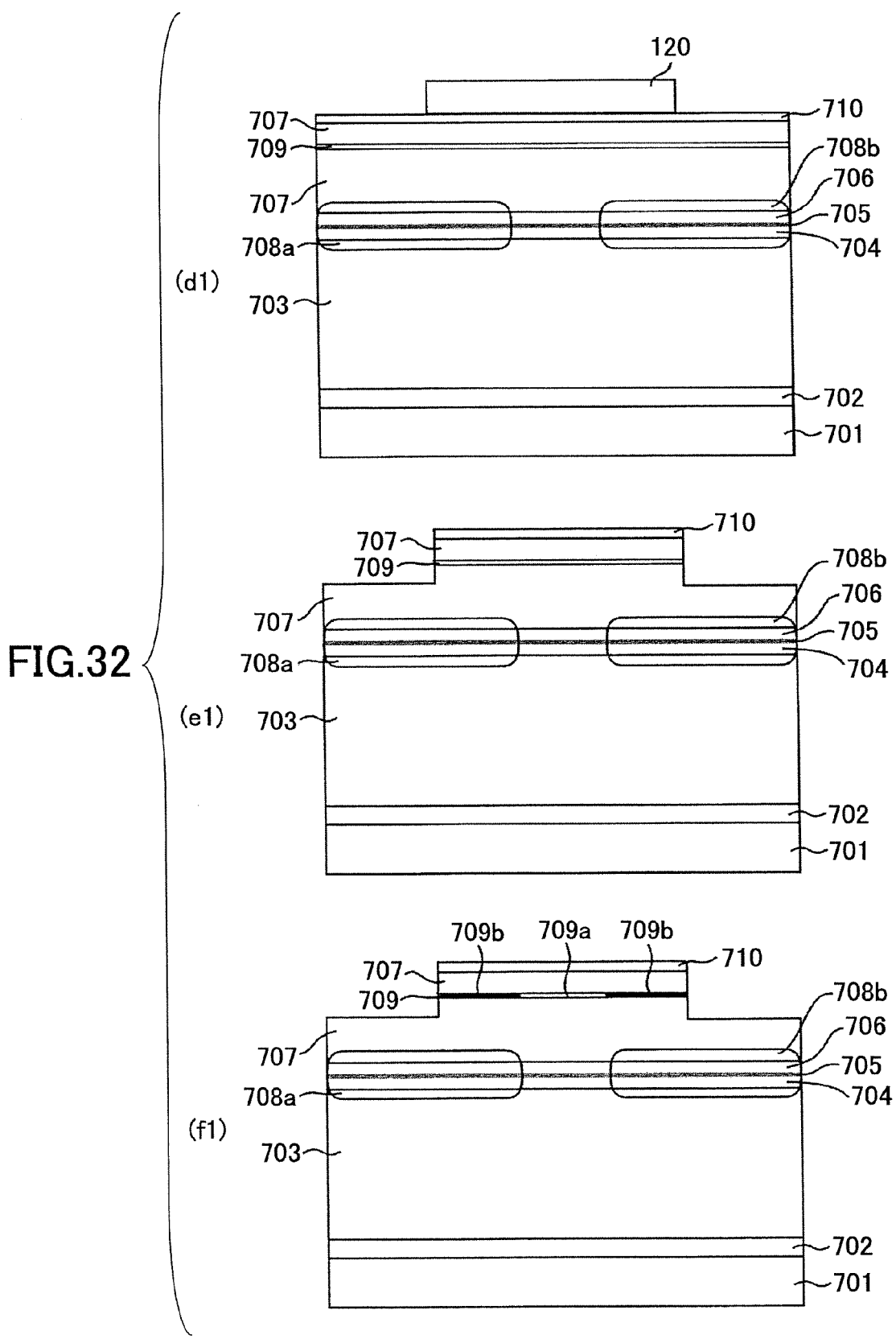
FIG. 32 is a diagram showing a second step of fabricating the surface-emission laser device of FIG. 29.

Subsequently, the high-resistance regions 708a and 708b are formed as shown in FIG. 32, and a resist patter 120 is formed on the contact layer 710 by applying a resist film on the contact layer 710 and using a photolithographic process (reference should be made to step (d1) of FIG. 32). In the present case, the resist pattern 120 has a square shape with an edge length of 20 μm.

Upon formation of the resist pattern 120, the reflection layer 707, the selective oxidation layer 709 and the contact layer 710 are removed by a dry etching process at the peripheral parts thereof while using the resist pattern 120 as a mask. Thereafter, the resist pattern 120 is removed (reference should be made to step (e1) of FIG. 32).

Thereafter, the structure thus obtained is heated to 425° C. in the ambient formed by bubbling water of 85° C. with a nitrogen gas. With this, oxidation proceeds in the selective oxidation layer 709 from the peripheral part thereof toward the central part, and with this, the non-oxidized layer 709a and the oxidized layer 709b are formed in the selective oxidation layer 709 (reference should be made to step (f1) of FIG. 32). In this case, the non-oxidized region 709a has a square shape having an edge length of 4 μm.

Figure 33:
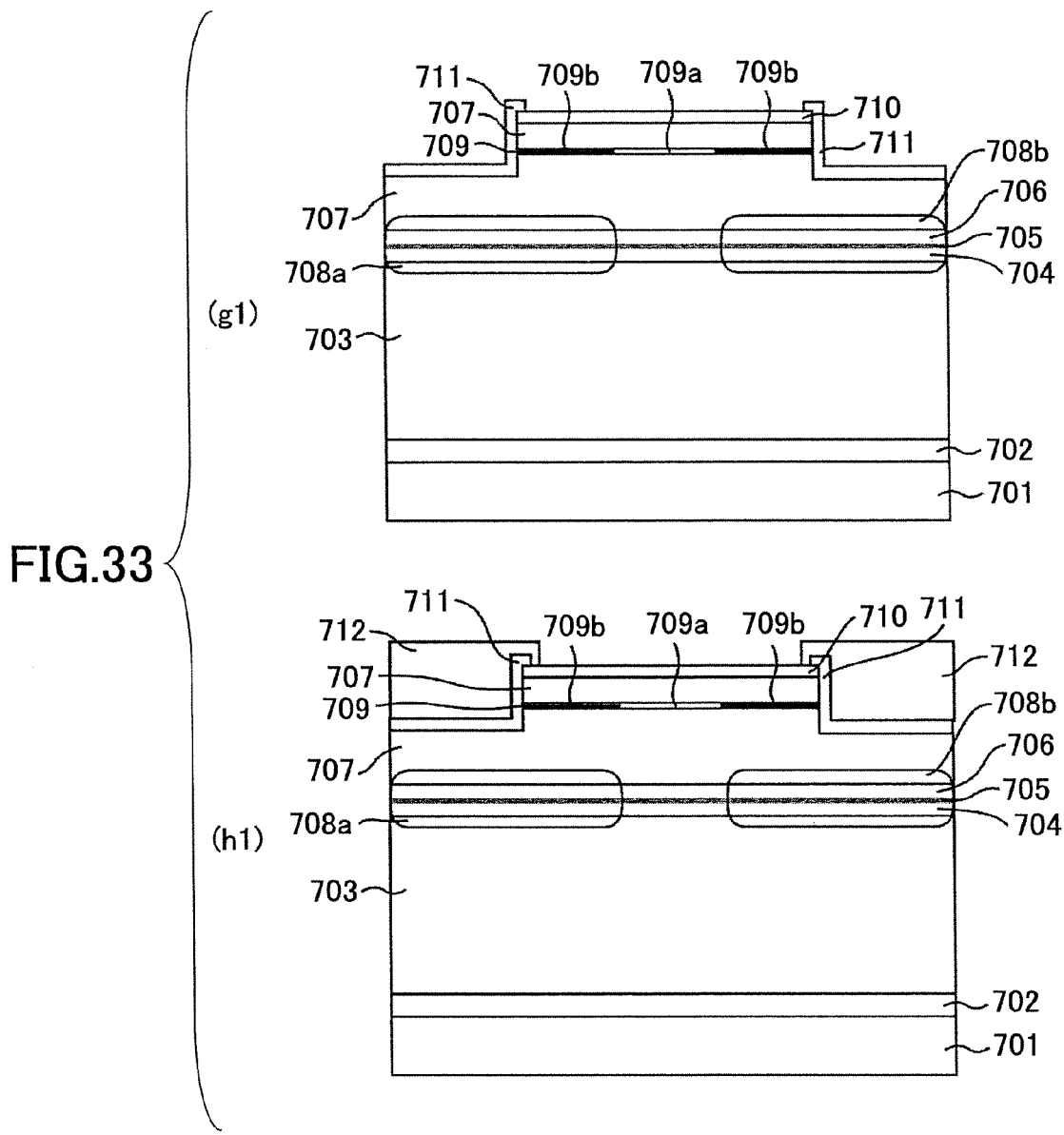
FIG. 33 is a diagram showing a third step of fabricating the surface-emission laser device of FIG. 29.

Referring to FIG. 33, a CVD process is conducted, after the formation of the non-oxidized region 709a and the oxidized region 709b, to form the $SiO_2$ layer 711 over the entire surface of the specimen, and a part of the $SiO_2$ layer 711 is removed from the region serving for the optical exit part together with the surrounding region thereof by using photolithography (reference should be made to step (g1) of FIG. 33).

Further, the insulating resin layer 712 is applied over the entire specimen by a spin coating process, and the insulating resin layer 712 is removed from the region serving for the optical exit part (reference should be made to step (h1) of FIG. 33).

Figure 34:
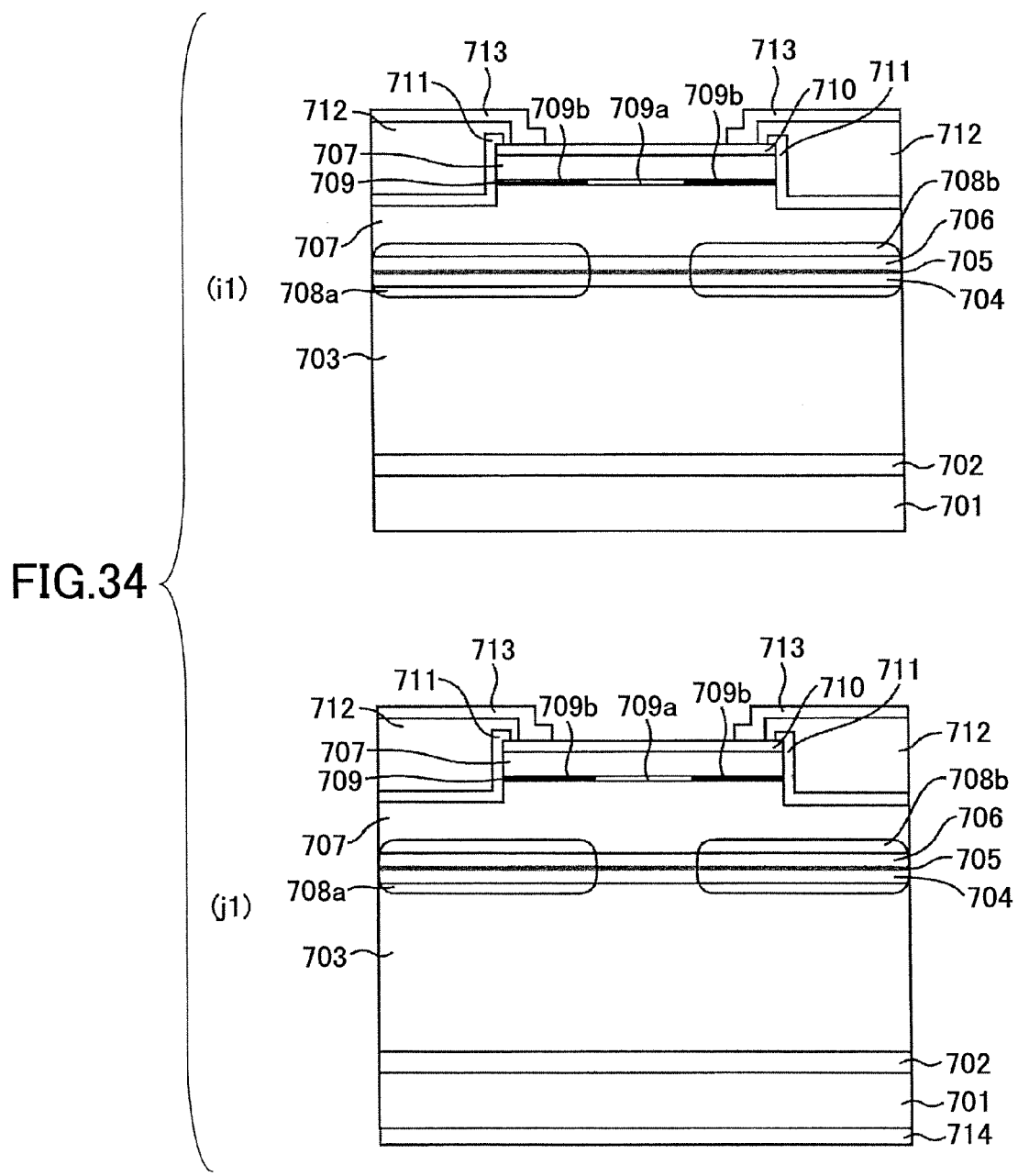
FIG. 34 is a diagram showing a fourth step of fabricating the surface-emission laser device of FIG. 29.

Referring to FIG. 34, a resist pattern is formed after the formation of the insulating resin layer 712 on the region serving for the optical exit part with an edge length of 8 μm, and a p-side electrode material is deposited on the entire surface of the structure thus obtained by way of evaporation deposition process. Further, by lifting off the p-side electrode material on the resist pattern, the p-side electrode 713 is formed (reference should be made to step (i1) of FIG. 34). Further, the back surface of the substrate 701 is polished and the n-side electrode 714 is formed on the back side of the substrate 701 thus polished. Thereafter, ohmic contact is formed for each of the p-side electrode 713 and the n-side electrode 714 by applying an annealing process (reference should be made to step (j1) of FIG. 34). With this, the surface-emission laser device 700 is fabricated.

The surface-emission laser device 700 is used for the surface-emission laser array 300 shown in FIG. 17. Further, the surface-emission laser device 700 and the surface-emission laser array 300 that uses the surface-emission laser device 700 are used for the electrophotographic system 400 shown in FIG. 18 and for the optical communication system 500 shown in FIG. 19.

Embodiment 5

Figure 35:
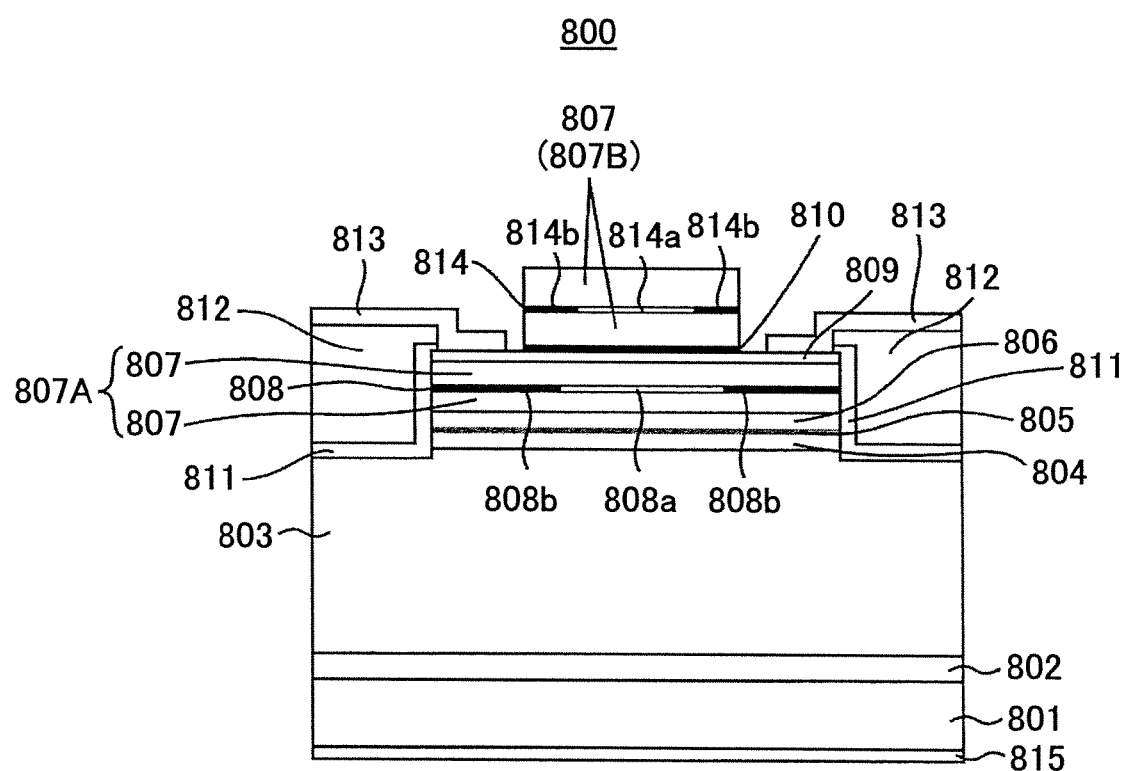
FIG. 35 is a schematic cross-sectional diagram showing a surface-emission laser device according to Embodiment 5 of the present invention.

FIG. 35 is a schematic cross-sectional diagram showing a surface-emission laser device according to Embodiment 5 of the present invention. Referring to FIG. 35, a surface-emission laser device 800 of the Embodiment 5 comprises a substrate 801, a buffer layer 802, reflection layers 803 and 807, cavity spacer layers 804 and 806, an active layer 805, selective oxidation layers 808 and 814, a contact layer 809, an etching stop layer 810, an $SiO_2$ layer 811, an insulating resin layer 812, a p-side electrode 813, and an n-side electrode 815. The surface-emission laser device 800 is a surface-emission laser device of the 980 nm band.

The substrate 801 is formed of n-GaAs. The buffer layer 802 is formed of n-GaAs and is formed on a principal surface of the substrate 801. The reflection layer 803 is formed of [n-$Al_{0.9}Ga_{0.1}As$/GaAs] in which the n-$Al_{0.9}Ga_{0.1}As$/GaAs pair forming one period is repeated for 35.5 periods on the buffer layer 802.

The cavity spacer layer 804 is formed of an undoped $Al_{0.2}Ga_{0.8}As$ layer and is formed on the reflection layer 803. The active layer 805 has a multiple quantum well structure formed of InGaAs/GaAs pair and is formed on the cavity spacer layer 804.

The cavity spacer layer 806 is formed of an undoped $Al_{0.2}Ga_{0.8}As$ layer and is formed on the active layer 805. The reflection layer 807 is formed of [p-$Al_{0.9}Ga_{0.1}As$/GaAs] of 24 periods formed on the cavity spacer layer 806 by repeating the p-$Al_{0.9}Ga_{0.1}As$/GaAs pair. In this case, the reflection layer 807 is formed by tow reflection layers 807A and 807B of different sizes. There, the reflection layer 807A has a larger size over the reflection layer 807B and is formed adjacent to the cavity spacer layer 806, while the reflection layer 807B is formed on the reflection layer 807A via the contact layer 809 and the etching stop layer 810.

The selective oxidation layer is formed of p-AlAs layer of the thickness of 20 nm and is provided in the reflection layer 807 (807A). Further, the selective oxidation layer 808 is formed of a non-oxidized region 808a and an oxidized region 808b. In this case, the non-oxidized region 808a has a square shape having an edge length of 6 μm.

The selective oxidation layer is formed of p-AlGaAs layer of the thickness of 20 nm and is provided in the reflection layer 807 (807B). Further, the selective oxidation layer 814 is formed of a non-oxidized region 8014a and an oxidized region 814b. In this case, the non-oxidized region 814a has a square shape having an edge length of 5 μm.

Thus, the non-oxidized region 808a of the selective oxidation layer 808 has a larger area over the non-oxidized region 814a of the selective oxidation layer 814.

The contact layer 809 is formed of p-GaAs having a film thickness of 20 nm and is formed on the reflection layer 807 (807A). Further, the amount of doping of carbon (C) in the p-GaAs layer is in the order of $1 \times 10^{19}$ cm$^{-3}$. The etching stop layer 810 is formed of p-GaInP having a film thickness of 20 nm and is formed on a part of the contact layer 809. Thereby, the etching stop layer 810 functions to stop the etching at the time of forming the mesa structure formed of the reflection layer 807 (807B) and the selective oxidation layer 814 by an etching process.

The SiO$_2$ layer 811 is formed so as to cover a part of the principal surface of the reflection layer 803, and the edge surfaces of the cavity spacer layer 804, the active layer 805, the cavity spacer layer 806, the reflection layer 807 (807A), the selective oxidation layer 808 and further a part of the contact layer 809.

The insulation resin layer 812 is formed adjacent to the SiO$_2$ layer 811. The p-side electrode 813 is formed on a part of the contact layer 809 and the insulating resin layer 812. The n-side electrode 815 is formed on a backside of the substrate 801.

Further, each of the reflection layers 803 and 807 constitute a semiconductor distributed Bragg reflector that confines the oscillating light oscillated in the active layer 805 into the active layer 805 as a result of Bragg multiple reflection.

Figure 36:
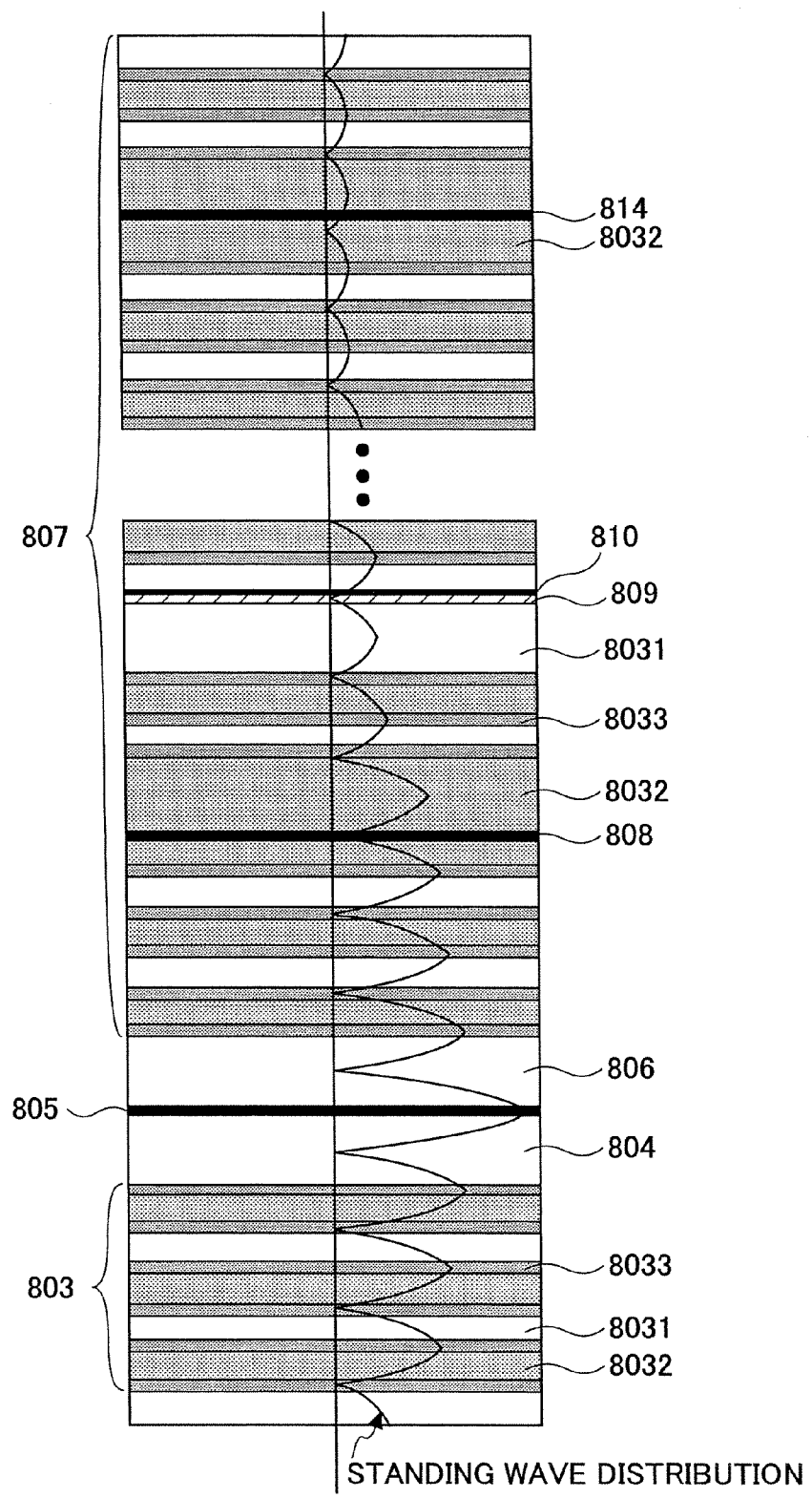
FIG. 36 is a diagram showing a part of the surface-emission laser device of FIG. 35 in the vicinity of a cavity region thereof.

FIG. 36 is a diagram showing a part of the surface-emission laser device 800 of FIG. 35 in the vicinity of the cavity region thereof. It should be noted that FIG. 36 also shows the electric field intensity distribution of the oscillation light in the oscillating state of the surface-emission laser device 800.

Referring to FIG. 36, each of the reflection layers 803 and 807 includes a high-refractive index layer 8031, a low-refractive index layer 8032 and a compositional gradation layer 8033. In the reflection layer 803, the high-refractive index layer 8031 is formed of n-GaAs while the low-refractive index layer 8032 is formed of n-Al$_{0.9}$Ga$_{0.1}$As. Further, the compositional gradation layer 8033 is formed of n-AlGaAs in which the composition thereof is changed from one composition of the low-refractive index layer 8031 and the high-refractive index layer 8032 toward the other of the foregoing compositions.

Further, in the reflection layer 807, the high-refractive index layer 8031 is formed of p-GaAs while the low-refractive index layer 8032 is formed of p-Al$_{0.9}$Ga$_{0.1}$As. Further, the compositional gradation layer 8033 is formed of p-AlGaAs in which the composition thereof is changed from one composition of the low-refractive index layer 8031 and the high-refractive index layer 8032 toward the other of the foregoing compositions.

The cavity region of the surface-emission laser device 800 is defined as the region formed of the cavity spacer layers 804 and 806 and the active layer 805. Thereby, it should be noted that the cavity region, formed of the cavity spacer layers 804 and 806 and the active layer 805, is provided such that there occurs a phase shift amount of $2\pi$ in the semiconductor layers thereof. Thus, the cavity region forms a single wavelength cavity structure.

Further, in order to increase the probability of stimulated emission, the active layer 805 is provided centrally to the cavity region (=cavity spacer layers 804, 806 and active layer 805) at the location corresponding to the anti-node of the standing wave distribution of the oscillation light.

The reflection layers 803 and 807 are formed so as to make contact respectively with the cavity spacer layers 804 and 806 at the side of the low refractive index layer 8032. With this construction, the interface between the low-refractive index layer 8032 and the cavity spacer layer 804 or 806 (or compositional gradation layer 8033 in the case of Embodiment 5) is located at the anti-node of the standing wave distribution of the electric field formed by the oscillation light.

Further, similarly to Embodiment 1, there appear anti-nodes and nodes alternately in the location between the high-refractive index layer 8031 and the low-refractive index layer 8032, where the compositional gradation layer 8033 is disposed.

The selective oxidation layer 808 is provided inside the low-refractive index layer 8032 located at the third period from the cavity region (=cavity spacer layers 804 and 806 and active layer 805). More specifically, the selective oxidation layer 808 is provided at a location corresponding to the third node of the standing wave distribution of the electrode of the oscillation light. The thickness of the low-refractive index layer 8032 in which the selective oxidation layer 808 is provided, is set such that there is caused a phase shift of $3\pi/2$ for the oscillation light in the region extending from the central part of the compositional graded layer 8033 adjacent to one side of the low-refractive index layer 8032 to the central part of the compositional graded layer 8033 adjacent to the low-refractive index layer 8032 at the other side thereof (the region of film thickness d2 shown in FIG. 2). Here, the selective oxidation layer 808 functions as the current confinement layer that confines the current injected into the active layer 805.

The selective oxidation layer 814 is provided inside the low-refractive index layer 8032 located at the eighteenth period from the cavity region (=cavity spacer layers 804 and 806 and active layer 805). More specifically, the selective oxidation layer 814 is provided at the location offset from the node at the eighteenth period of the standing wave distribution of the electric field caused by the oscillation light in the direction away from the active layer 805 by a distance providing a phase shift of $\pi/5$ for the oscillation light (and hence the distance of $\lambda/10n$ where n represents the refractive index of the low-refractive index layer 8032). Thereby, the thickness of the low-refractive index layer 8032 in which the selective oxidation layer 814 is provided is set generally equal to the thickness of the low-refractive index layer 8032 in which the selective oxidation layer 808 is provided. Thus, the selective oxidation layer 814 functions as the suppression layer suppressing the higher-order transverse mode of the oscillation light similarly to the selective oxidation layer 108 of Embodiment 1.

Thus, with the surface-emission laser device 800, there are provided two selective oxidation layers, 808 and 814, wherein the selective oxidation layer 814 functioning as the suppression layer suppressing the higher-order transverse mode is provided at a location further away from the active layer 808 with regard to the selective oxidation layer 805 that functions as the current confinement layer.

With the surface-emission layer device 800, the contact layer 809 is provided in the reflection layer inside the high-refractive index layer 8031 of the fourth period counted from the active layer 805. Further, the contact layer 809, the etching stop layer 810 and the high-refractive index layer 8031 are formed such that there is induced the phase shift of $3\pi/2$ for the oscillation light in the region formed of the contact layer 809, the etching stop layer 810 and the high-refractive index layer 8031.

Figure 37:
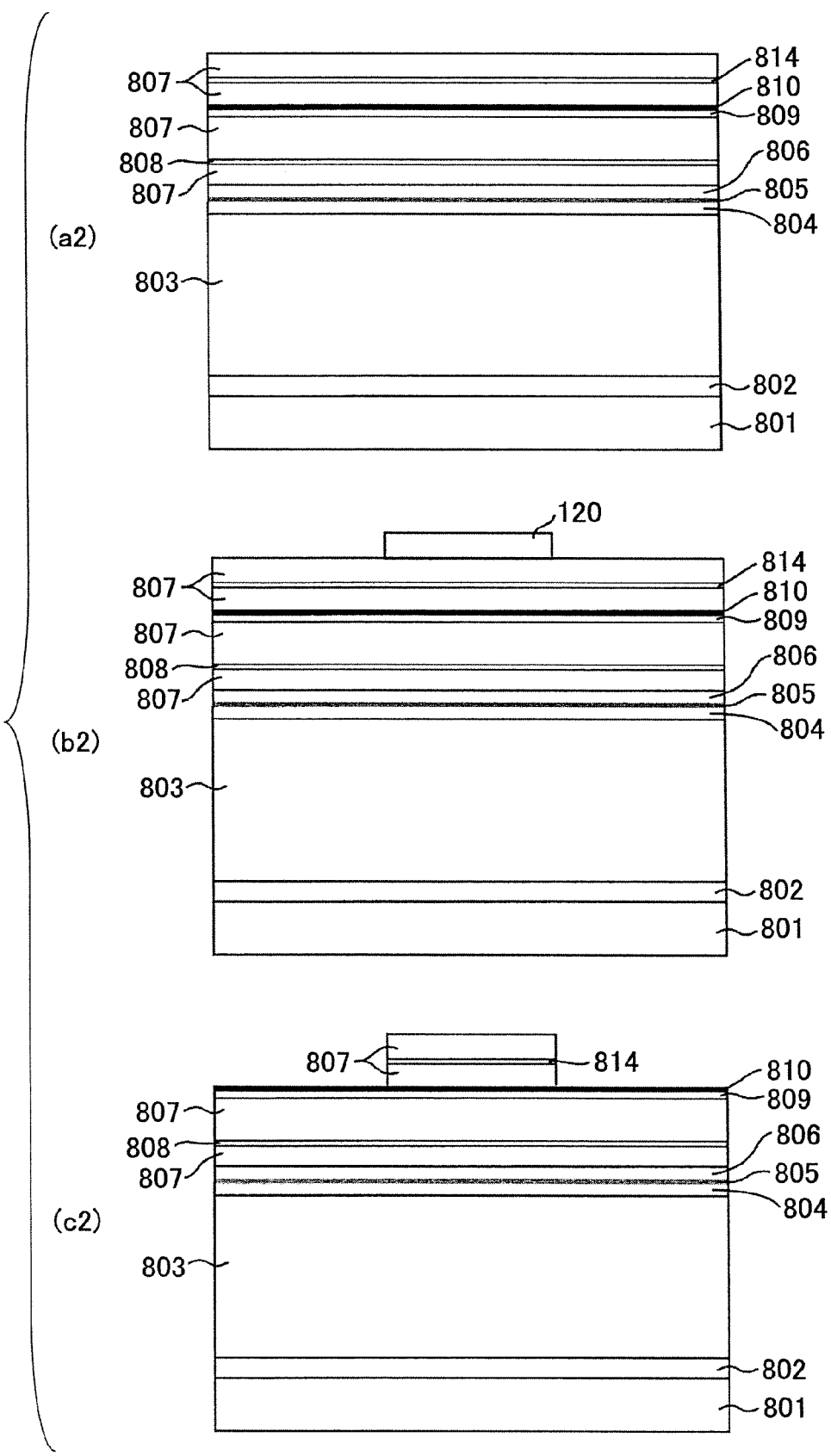
FIG. 37 is a diagram explaining a first step of fabricating the surface-emission laser device of FIG. 35.
Figure 38:
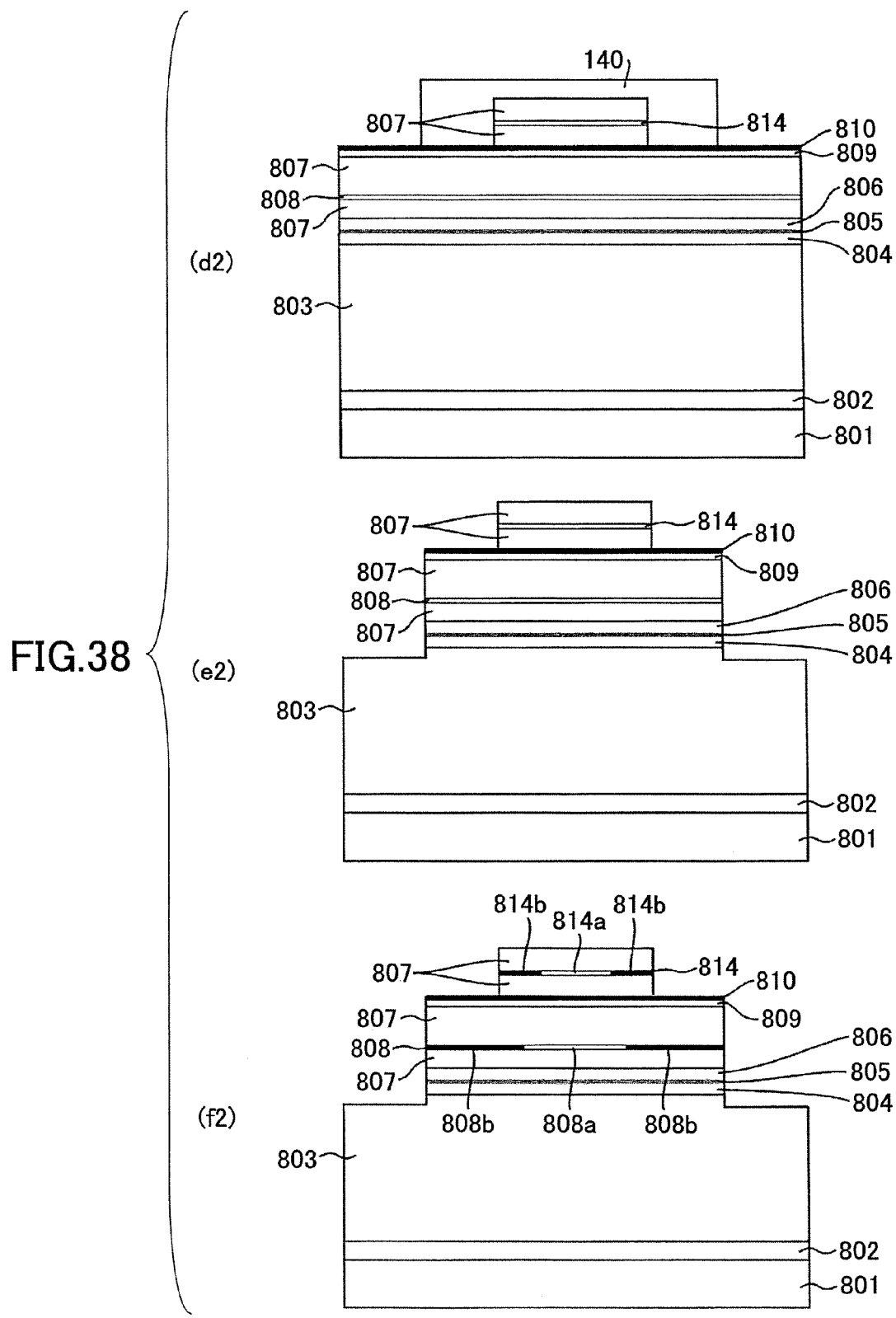
FIG. 38 is a diagram explaining a second step of fabricating the surface-emission laser device of FIG. 35.

FIGS. 37 through 40 are first through fourth process step diagrams showing the fabrication process of the surface-emission laser array 800 shown in FIG. 35. Referring to FIG. 37, the buffer layer 802, the reflection layer 803, the cavity spacer layer 804, the active layer 805, the cavity spacer layer 806, the reflection layer 807, the selective oxidation layer 808, the contact layer 809, the etching stop layer 810 and the selective oxidation layer 814 are stacked consecutively on the substrate 810 by using an MOCVD process upon commencement of a series of process steps (reference should be made to step (a2) of FIG. 37).

Therein, the n-GaAs layer forming the buffer layer 802 is formed while using trimethyl gallium (TMG), arsine ($AsH_3$) and hydrogen selenide ($H_2Se$) as the source, while the n-$Al_{0.9}Ga_{0.1}As$ layer and the n-GaAs layer constituting the reflection layer 803 are formed while using trimethyl aluminum (TMA), trimethyl gallium (TMG), arsine ($AsH_3$) and hydrogen selenide ($H_2Se$) for the source.

Further, the undoped $Al_{0.2}Ga_{0.8}As$ layer of the cavity spacer layer 804 is formed while using trimethyl aluminum (TMA), trimethyl gallium (TMG) and arsine ($AsH_3$) for the source and the InGaAs/GaAs of the active layer 805 is formed while using trimethyl indium (TMI), trimethyl gallium (TMG) and arsine ($AsH_3$) for the source.

Further, the undoped $Al_{0.2}Ga_{0.8}As$ layer of the cavity spacer layer 806 is formed while using trimethyl aluminum (TMA), trimethyl gallium (TMG) and arsine ($AsH_3$) for the source and the p-$Al_{0.9}Ga_{0.1}As$/GaAs of the reflection layer 807 is formed while using trimethyl aluminum (TMA), trimethyl gallium (TMG), arsine ($AsH_3$) and carbon tetrabromide ($CBr_4$) for the source.

Further, the p-AlAs layer of the selective oxidation layer 808 is formed while using trimethyl aluminum (TMA), arsine ($AsH_3$) and carbon tetrabromide ($CBr_4$) for the source material, and the p-GaAs layer of the contact layer 809 is formed while using trimethyl gallium (TMG), arsine ($AsH_3$) and carbon tetrabromide ($CBr_4$) for the source material.

Further, the p-GaInP layer of the etching stop layer 810 is formed while using trimethyl gallium (TMG), trimethyl indium (TMI), phosphine (PH3) and cyclodiphenyl magnesium ($CPMg_2$) for the source.

Further, the p-AlGaAs layer forming the selective oxidation layer 814 is formed while using trimethyl aluminum (TMA), trimethyl gallium (TMG), arsine ($AsH_3$) and carbon tetrabromide ($CBr_4$) for the source.

Thereafter, a resist film is coated upon the reflection layer 807 and a resist pattern 120 is formed on the reflection layer 807 while using a photolithographic process (reference should be made to the step (b2) of FIG. 37). In the present case, the resist pattern 120 has a square shape with an edge length of 20 μm.

Upon formation of the resist pattern 120, the peripheral parts of the reflection layer 807 and the selective oxidation layer 814 are removed by a dry etching process while using the resist pattern 120 thus formed. In this case, the etching is stopped before the etching depth reaches the etching stop layer 810. Thereafter, the layers are removed down to the etching stop layer 810 while using an etchant of sulfuric acid family ($H_2SO_4+H_2+H_2O$). After the etching, the resist pattern 120 is removed, and there is formed a first stage mesa structure in which the edge surface of the selective oxidation layer 814 is exposed (reference should be made to (c2) of FIG. 37).

Referring again to FIG. 38, upon formation of the first stage mesa structure, a resist is applied subsequently upon the mesa structure thus formed and upon the etching stop layer 810, and a resist pattern 140 is formed on the mesa structure and the etching stop layer 810 while using a photolithographic process (see step (d2) of FIG. 38). In the present case, the resist pattern 140 has a square shape with an edge length of 50 μm.

Upon formation of the resist pattern 140, the etching stop layer 810, the contact layer 809, the reflection layer 807, the selective oxidation layer 808, the cavity spacer layer 806, the active layer 805 and the cavity space layer 804 are removed by a dry etching process at the peripheral parts thereof while using the resist pattern 140 thus formed as a mask. Thereafter, the resist pattern 140 is removed (reference should be made to step (e2) of FIG. 38). With this, the second stage of the mesa structure is formed.

Thereafter, the structure thus obtained is heated to 425° C. in the ambient formed by bubbling water of 85° C. with a nitrogen gas. With this, oxidation proceeds in the selective oxidation layers 808 and 814 from the peripheral part thereof toward the central part, and with this, the non-oxidized layer 808a and the oxidized layer 808b are formed in the selective oxidation layer 808. Further, the non-oxidized region 814a and the oxidized region 814b are formed in the selective oxidation layer 814 (reference should be made to step (f2) of FIG. 38). In this case, it is possible to form the non-oxidized region 808a of square shape having an edge length of 6 μm and the non-oxidized region 814a of square shape having an edge length of 5 μm simultaneously, by adjusting the Al composition of the p-AlAs layer constituting the selective oxidation layer 808 and the p-AlGaAs layer constituting the selective-oxidation layer 814.

Figure 39:
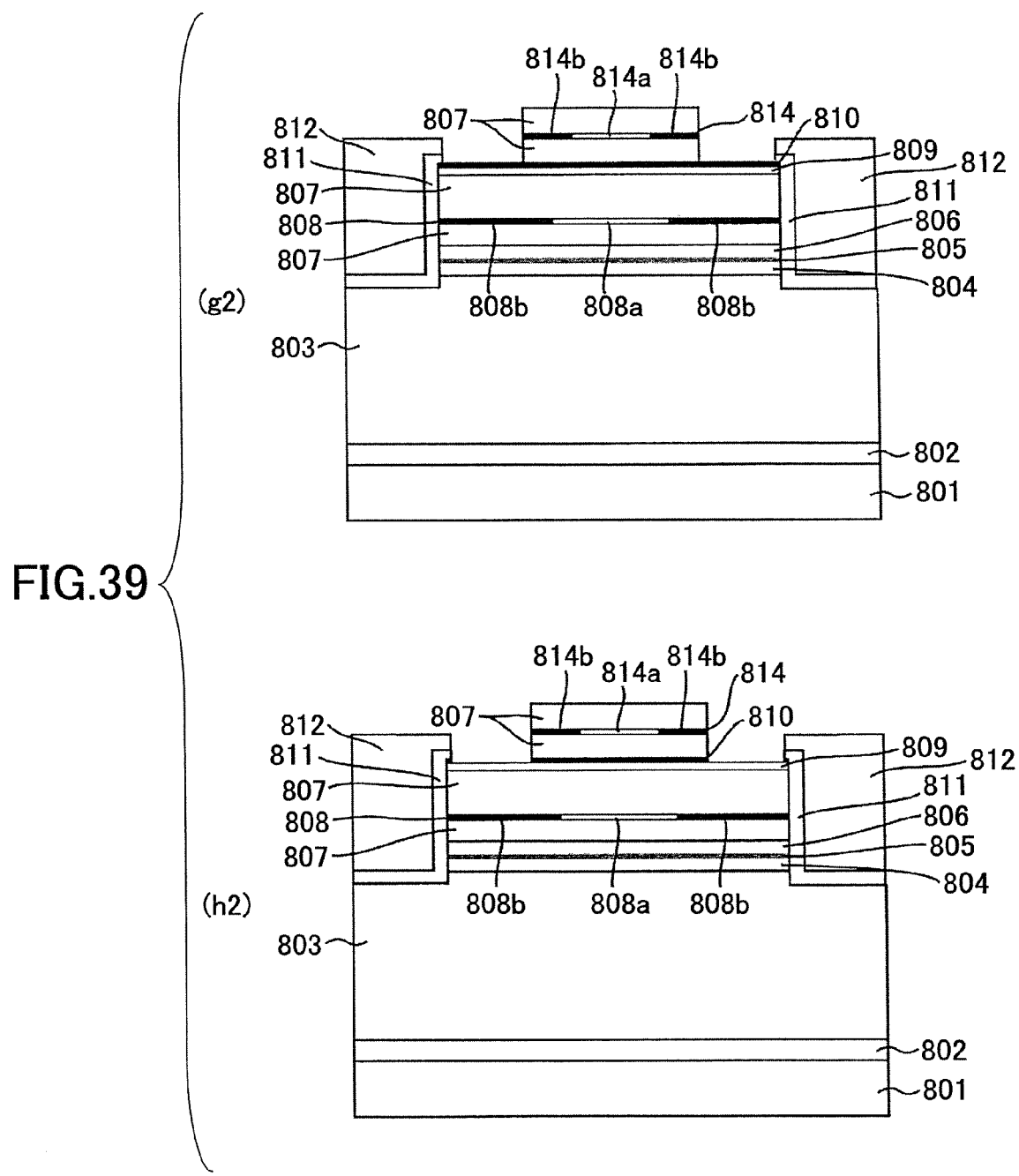
FIG. 39 is a diagram explaining a third step of fabricating the surface-emission laser device of FIG. 35.

Referring to FIG. 39, a CVD process is conducted, after the formation of the non-oxidized regions 808a, 814a and the oxidized regions 809b, 814b, to form the $SiO_2$ layer 811 over the entire surface of the specimen, and a part of the $SiO_2$ layer 811 is removed from the region serving for the optical exit part together with the surrounding region thereof by using photolithography. Thereafter, the insulating resin layer 812 is applied over the entire specimen by a spin coating process, and the insulating resin layer 812 is removed from the region serving for the optical exit part (reference should be made to step (g2) of FIG. 39).

Subsequently, a part of the etching stop layer 810 forming the outermost surface layer of the second stage mesa structure is etched by an etchant of hydrochloric acid ($HCl+H_2O$) while using the insulating resin 812 for the mask (reference should be made to step (h2) of FIG. 39).

Figure 40:
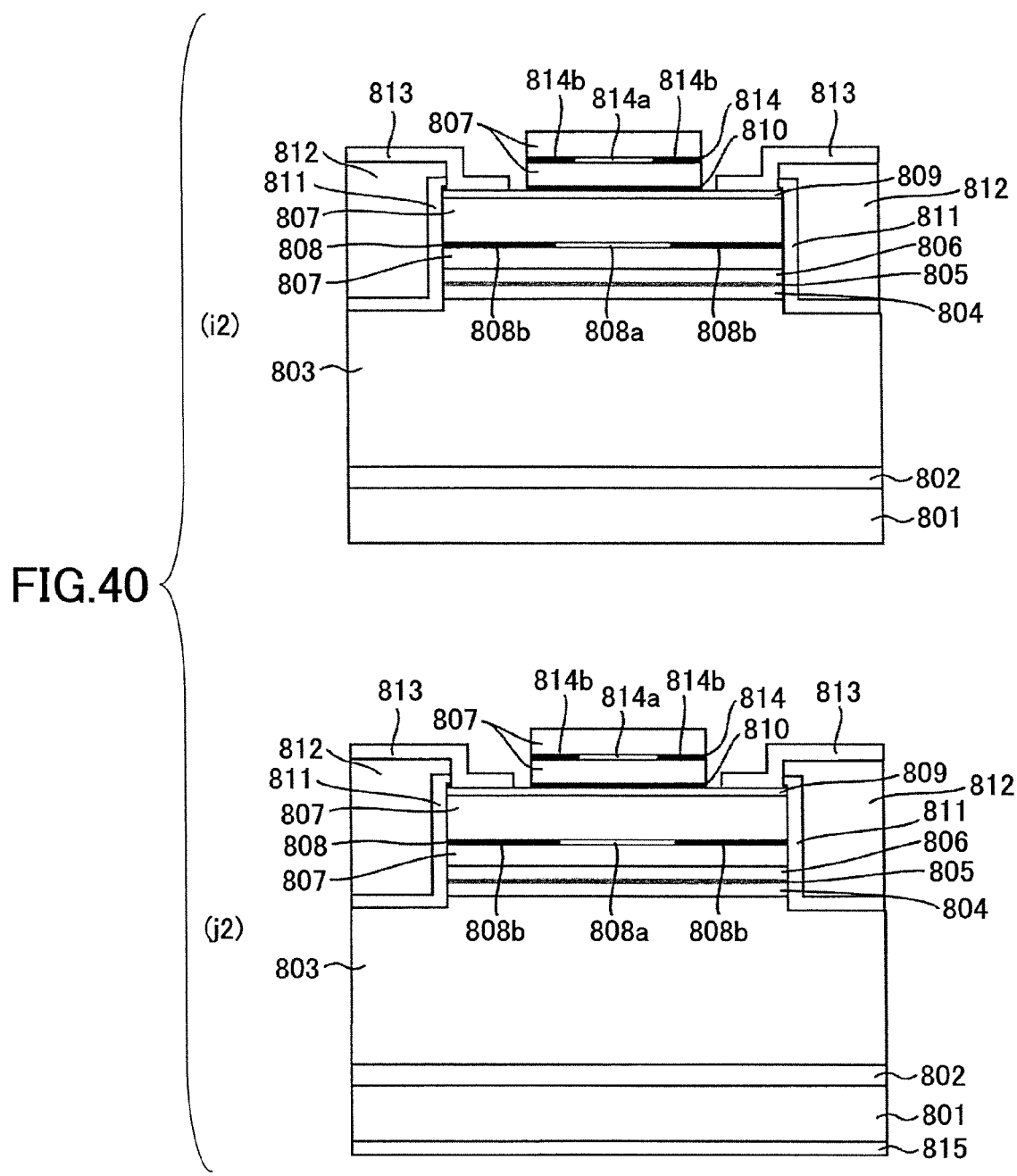
FIG. 40 is a diagram explaining a fourth step of fabricating the surface-emission laser device of FIG. 35.

Referring to FIG. 40, a resist pattern is formed, after removing a part of the insulating resin layer 810, on the region serving for the optical exit part, and a p-side electrode material is deposited on the entire surface of the structure thus obtained by way of evaporation deposition process. Further, by lifting off the p-side electrode material on the resist pattern, the p-side electrode 813 is formed (reference should be made to step (i2) of FIG. 40). Further, the back surface of the substrate 801 is polished and the n-side electrode 815 is formed on the back side of the substrate 801 thus polished. Thereafter, ohmic contact is formed for each of the p-side electrode 813 and the n-side electrode 815 by applying an annealing process (reference should be made to step (j2) of FIG. 40). With this, the surface-emission laser device 800 is fabricated.

With the surface-emission laser device 800, the carriers are injected from the contact 809 into the active layer 805 through the non-oxidized region 808a of the selective oxidation layer 808. There occurs no injection of carriers to the active layer 805 through the non-oxidized region 814a of the selective oxidation layer 814. Thus, with the surface-emission laser device 800, the device resistance is reduced as compared with the case of the carries being injected into the active layer through the non-oxidized regions of two selective oxidation layers. As a result, heat generation in the surface-emission laser device 800 is suppressed and the saturation point of output caused by heat generation is improved, and it becomes possible to obtain the oscillation light with high output power.

Further, with the surface-emission laser device 800, in which the selective oxidation layer 808 functioning as the current confinement layer is provided in the low-refractive index layer 8032 at the third period from the cavity region (=cavity spacer layers 804, 806 and active layer 805), the threshold current is maintained at low level and low diffraction loss is attained (high slope efficiency). Thus, it is possible to obtain the single fundamental mode oscillation with high output power.

While the current confinement layer has been explained as being formed of the selective oxidation layer 808 in the foregoing, the present invention is not limited to such a construction and it is possible to form the current confinement layer by the high-resistance regions 708a and 708b explained with reference to Embodiment 4.

The surface-emission laser device 800 is used for the surface-emission laser array 300A shown in FIG. 22. Further, the surface-emission laser device 800 and the surface-emission laser array 300A that uses the surface-emission laser device 800 are used for the electrophotographic system 400A shown in FIG. 23 and for the optical communication system 500A shown in FIG. 24.

Embodiment 6

Figure 41:
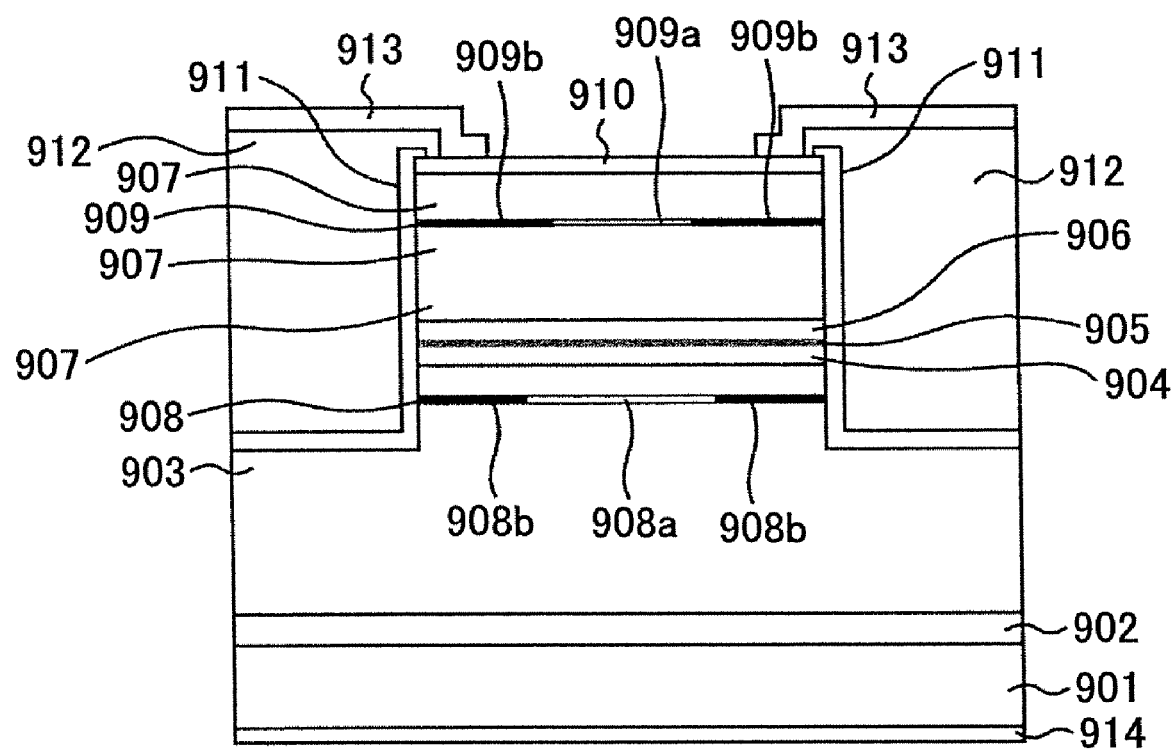
FIG. 41 is a schematic cross-sectional diagram showing a surface-emission laser device according to Embodiment 6 of the present invention.

FIG. 41 is a schematic cross-sectional diagram showing a surface-emission laser device according to Embodiment 6 of the present invention. Referring to FIG. 41, a surface-emission laser device 900 of the Embodiment 6 comprises a substrate 901, a buffer layer 902, reflection layers 903 and 907, cavity spacer layers 904 and 906, an active layer 905, selective oxidation layers 908 and 909, a contact layer 910, an $SiO_2$ layer 911, an insulation resin layer 912, an n-side electrode 913, and a p-side electrode 914. The surface-emission laser device 900 is a surface-emission laser device of the 780 nm band.

The substrate 901 is formed of 9-GaAs. The buffer layer 902 is formed of p-GaAs and is formed on a principal surface of the substrate 901. The reflection layer 903 is formed by repeating the pair of p-$Al_{0.9}Ga_{0.1}As$/p-$Al_{0.3}Ga_{0.7}As$ as the unit of repetition and has a structure of [p-$Al_{0.9}Ga_{0.1}As$/n-$Al_{0.3}Ga_{0.7}As$] repeated for 41.5 times, wherein the reflection layer 902 is formed on the buffer layer 902.

The cavity spacer layer 904 is formed of an undoped $Al_{0.6}Ga_{0.4}As$ layer and is formed on the reflection layer 903. The active layer 905 has a multiple quantum well structure including therein three periods of [AlGaAs/$Al_{0.6}Ga_{0.4}As$] structure and formed on the cavity spacer layer 904, wherein it should be noted that the AlGaAs/$Al_{0.6}Ga_{0.4}As$ pair forms one period.

The cavity spacer layer 906 is formed of an undoped $Al_{0.4}Ga_{0.6}As$ layer and is formed on the active layer 905. The reflection layer 907 is formed on the cavity spacer layer 906 and has a structure of [n-$Al_{0.9}Ga_{0.1}As$/n-$Al_{0.3}Ga_{0.7}As$] in which the n-$Al_{0.9}Ga_{0.1}As$/p-$Al_{0.3}Ga_{0.7}As$ pair is repeated for 24 times.

The selective oxidation layer 908 is formed of p-AlGaAs and is provided inside the reflection layer 903. Thereby, it should be noted that the selective oxidation layer 908 includes a non-oxidized region 908a and an oxidized region 908b and has a thickness of 20 nm. The selective oxidation layer 909 is formed of n-AlAs and is provided inside the reflection layer 907. Thereby, it should be noted that the selective oxidation layer 909 includes a non-oxidized region 908a and an oxidized region 908b and has a thickness of 20 nm. The non-oxidized region 908a has a generally square shape with an edge length of 5 μm, while the non-oxidized region 909a has a generally square shape with an edge of 4 μm. Further, the selective oxidation layer 909 is disposed at a far side from the active layer 908 with regard to the selective oxidation layer 905.

The contact layer 910 is formed of n-GaAs and is formed on the reflection layer 907. The $SiO_2$ layer 911 is formed so as to cover a part of the principal surface of the reflection layer 903, and the edge surfaces of the cavity spacer layer 904, the active layer 905, the cavity spacer layer 906, the reflection layer 907, the selective oxidation layers 908 and 909 and the contact layer 910.

The insulation resin layer 912 is formed adjacent to the $SiO_2$ layer 911. The n-side electrode 913 is formed on a part of the contact layer 910 and the insulating resin layer 912. In this case, the aperture not formed with the n-side electrode 913 has a generally square shape with an edge length of 8 μm. The p-side electrode 914 is formed on a backside of the substrate 901.

Further, each of the reflection layers 903 and 907 constitute a semiconductor distributed Bragg reflector that confines the oscillating light oscillated in the active layer 905 into the active layer 905 as a result of Bragg multiple reflection.

Figure 42:
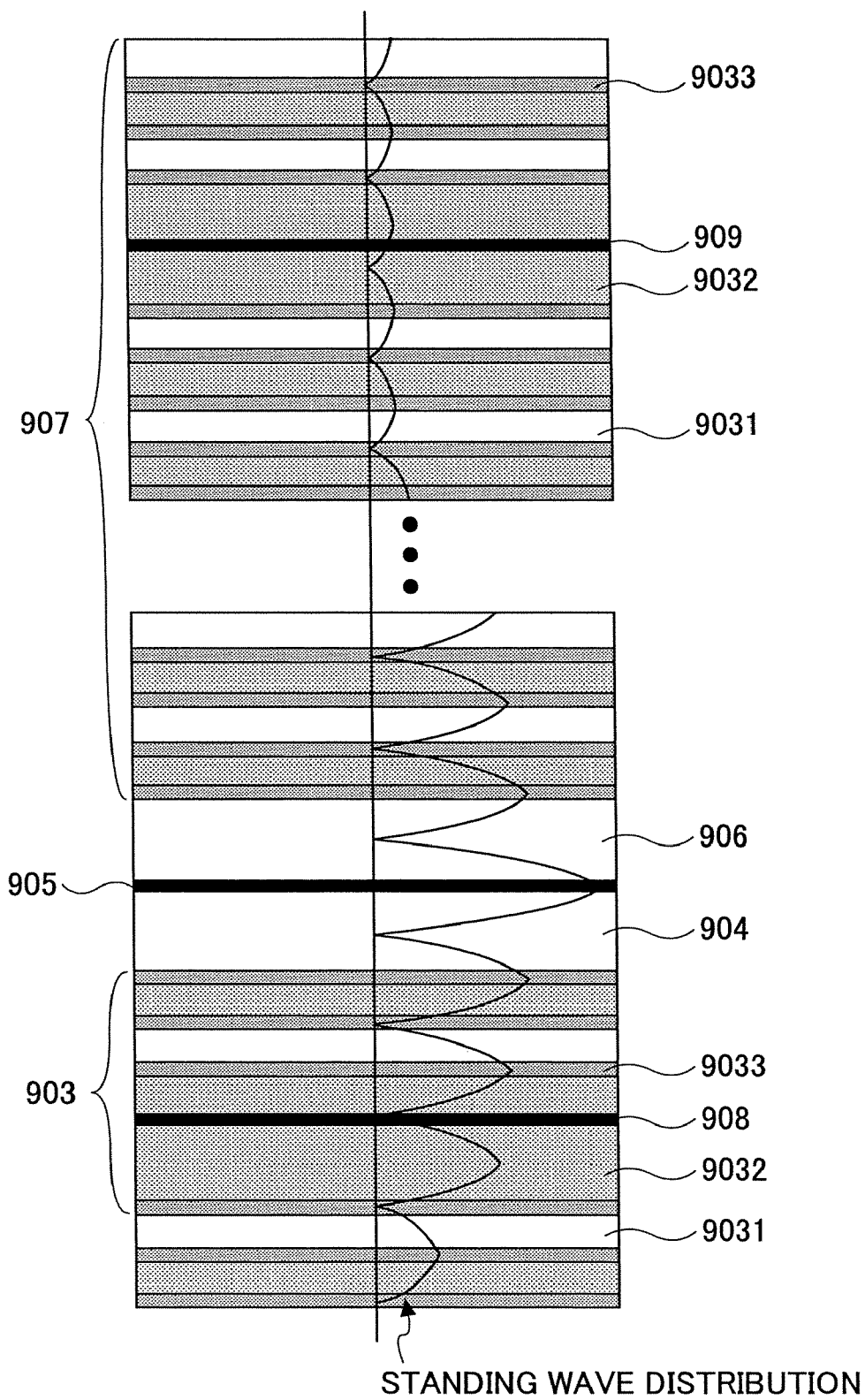
FIG. 42 is a diagram showing a part of the surface-emission laser device of FIG. 41 in the vicinity of a cavity region thereof.

FIG. 42 is a diagram showing a part of the surface-emission laser device 900 of FIG. 41 in the vicinity of the cavity region thereof. It should be noted that FIG. 42 also shows the electric field intensity distribution of the oscillation light in the oscillating state of the surface-emission laser device 900.

Referring to FIG. 42, each of the reflection layers 903 and 907 includes a high-refractive index layer 9031, a low-refractive index layer 9032 and a compositional gradation layer 9033. In the reflection layer 903, the high-refractive index layer 9031 is formed of p-$Al_{0.3}Ga_{0.7}As$ while the low-refractive index layer 9032 is formed of p-$Al_{0.9}Ga_{0.1}As$. Further, the compositional gradation layer 9033 is formed of p-AlGaAs in which the composition thereof is changed from one composition of the high-refractive index layer 9031 and the low-refractive index layer 9032 toward the other of the foregoing compositions.

Further, in the reflection layer 907, the high-refractive index layer 9031 is formed of n-$Al_{0.3}Ga_{0.7}As$ while the low-refractive index layer 9032 is formed of n-$Al_{0.9}Ga_{0.1}As$. Further, the compositional gradation layer 9033 is formed of n-AlGaAs in which the composition thereof is changed from one composition of the low-refractive index layer 9031 and the high-refractive index layer 9032 toward the other of the foregoing compositions.

The cavity region of the surface-emission laser device 900 is defined as the region formed of the cavity spacer layers 904 and 906 and the active layer 905. Thereby, it should be noted that the cavity region, formed of the cavity spacer layers 904 and 906 and the active layer 905, is provided such that there occurs a phase shift amount of $2\pi$ in the semiconductor layers thereof. Thus, the cavity region forms a single wavelength cavity structure.

Further, in order to increase the probability of stimulated emission, the active layer 905 is provided centrally to the cavity region (=cavity spacer layers 904, 906 and active layer 905) at the location corresponding to the anti-node of the standing wave distribution of the oscillation light.

The reflection layers 903 and 907 are formed so as to make contact respectively with the cavity spacer layers 904 and 906 at the side of the low refractive index layer 9032. With this construction, the interface between the low-refractive index layer 9032 and the cavity spacer layer 904 or 906 (or compositional gradation layer 9033 in the case of Embodiment 6) is located at the anti-node of the standing wave distribution of the electric field formed by the oscillation light.

Further, similarly to Embodiment 1, there appear anti-nodes and nodes alternately in the location between the high-refractive index layer 9031 and the low-refractive index layer 9032, where the compositional gradation layer 9033 is disposed.

The selective oxidation layer 908 is provided inside the low-refractive index layer 9032 (p-$Al_{0.9}Ga_{0.1}As$) located at the second period from the cavity region (=cavity spacer layers 904 and 906 and active layer 905). More specifically, the selective oxidation layer 908 is provided at a location corresponding to the second node of the standing wave distribution of the electrode of the oscillation light. The thickness of the low-refractive index layer 9032 in which the selective oxidation layer 908 is provided, is set such that there is caused a phase shift of $3\pi/2$ for the oscillation light in the region extending from the central part of the compositional graded layer 9033 adjacent to one side of the low-refractive index layer 9032 to the central part of the compositional graded layer 9033 adjacent to the low-refractive index layer 9032 at the other side thereof (the region of film thickness d2 shown in FIG. 2). Here, the selective oxidation layer 908 functions as the current confinement layer that confines the current injected into the active layer 905.

The selective oxidation layer 909 is provided inside the low-refractive index layer 9032 located at the twentieth period from the cavity region (=cavity spacer layers 904 and 906 and active layer 905). More specifically, the selective oxidation layer 909 is provided at the location offset from the node at the twentieth period of the standing wave distribution of the electric field caused by the oscillation light in the direction away from the active layer 905 by a distance providing a phase shift of $\pi/4$ for the oscillation light (and hence the distance of $\lambda/8n$ where n represents the refractive index of the low-refractive index layer 9032). Thereby, the thickness of the low-refractive index layer 9032 in which the selective oxidation layer 909 is provided is set generally equal to the thickness of the low-refractive index layer 9032 in which the selective oxidation layer 908 is provided. Thus, the selective oxidation layer 909 functions as the suppression layer suppressing the higher-order transverse mode of the oscillation light similarly to the selective oxidation layer 108 of Embodiment 1.

Thus, with the surface-emission laser device 900, there are provided two selective oxidation layers 908 and 909, wherein the selective oxidation layer 908 functioning as the current confinement layer is disposed inside the reflection layer 903 provided at the side closer to the substrate 901 with regard to the active layer 905, while the selective oxidation layer 909 functioning as the suppression layer suppressing the higher-order transverse mode, is provided at the side away from the substrate with regard to the active layer 905. Thus, the selective oxidation layers 908 and 909 are disposed at opposite sides of the active layer 905.

Further, with the surface-emission laser device 900, too, the selective oxidation layer 909 functioning as the suppression layer suppressing the higher-order transverse mode is disposed at the location further away from the active layer 905 with regard to the selective oxidation layer 908 functioning as the current confinement layer.

Figure 43:
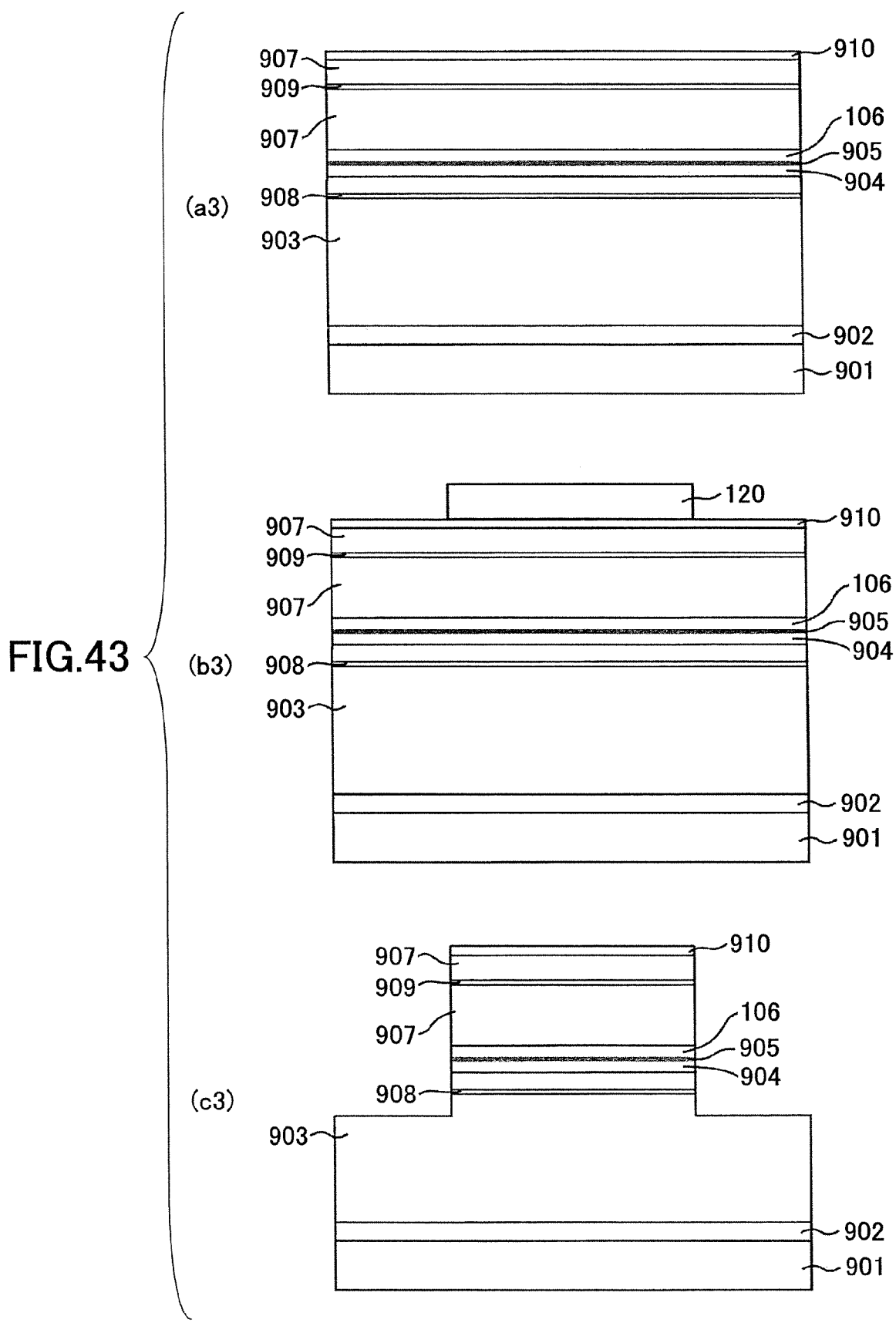
FIG. 43 is a diagram showing a first step of fabricating the surface-emission laser device of FIG. 41.
Figure 44:
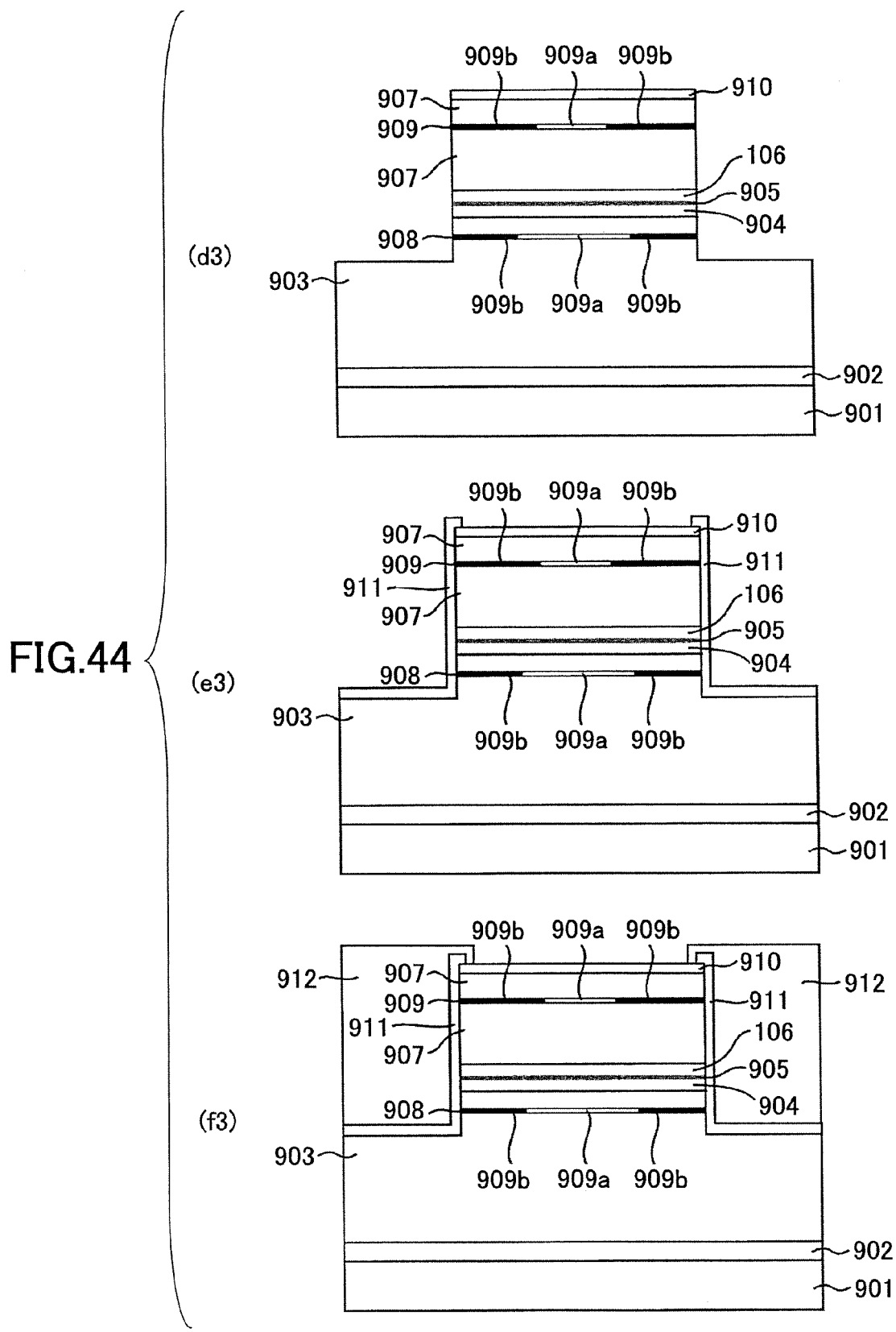
FIG. 44 is a diagram showing a second step of fabricating the surface-emission laser device of FIG. 41.
Figure 45:
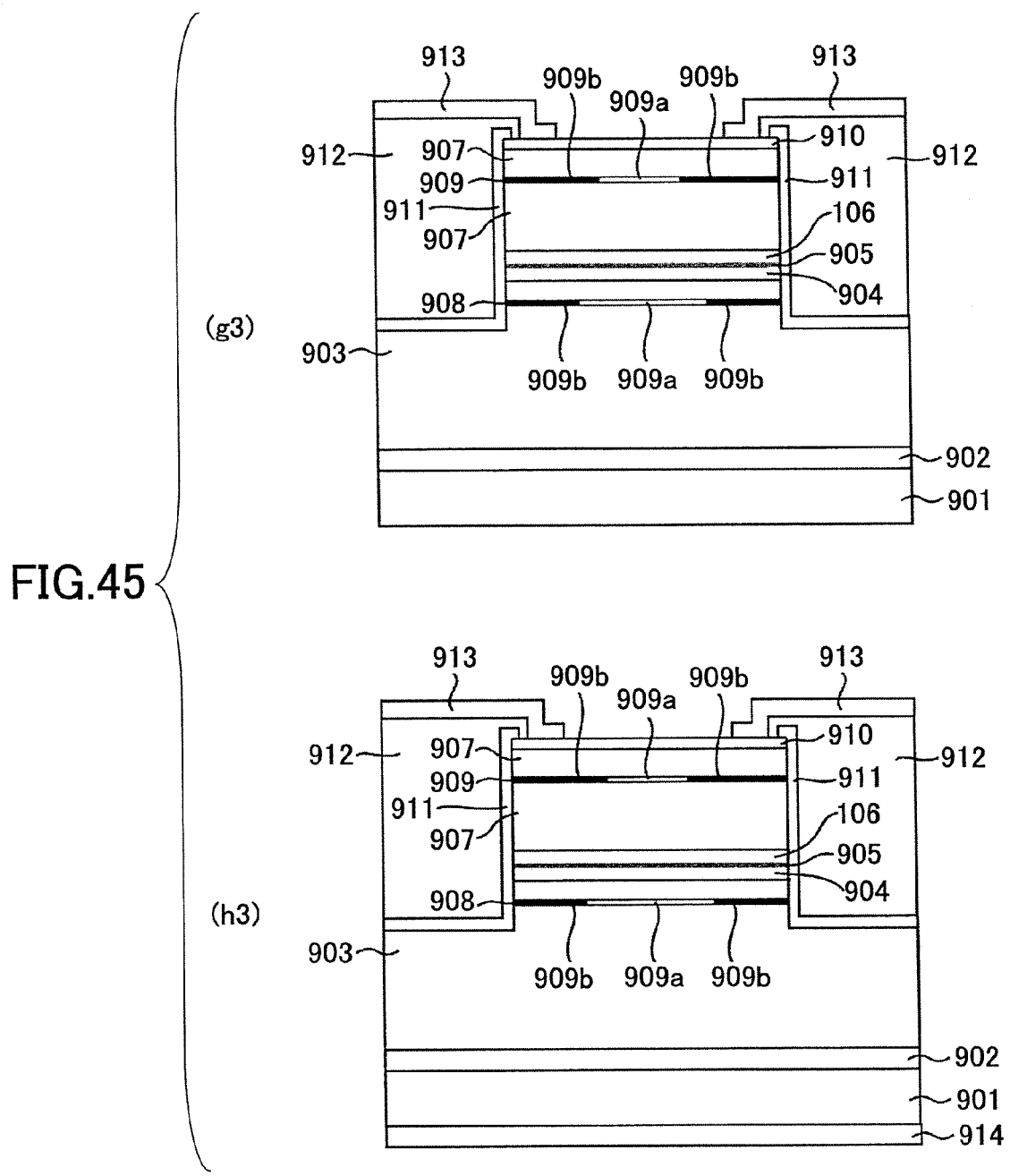
FIG. 45 is a diagram showing a third step of fabricating the surface-emission laser device of FIG. 41.

FIGS. 43, 44 and 45 are first through third process step diagrams showing the fabrication process of the surface-emission laser array 900 shown in FIG. 41. Referring to FIG. 43, the buffer layer 902, the reflection layer 903, the selective oxidation layer 908, the cavity spacer layer 904, the active layer 905, the cavity spacer layer 906, the reflection layer 907, the selective oxidation layer 909 and the contact layer 910 are stacked consecutively on the substrate 901 by using an MOCVD process upon commencement of a series of process steps (reference should be made to step (a3) of FIG. 43).

Therein, the p-GaAs layer forming the buffer layer 902 is formed while using trimethyl gallium (TMG), arsine ($AsH_3$) and carbon tetrabromide ($CBr_4$) as the source, while the p-$Al_{0.9}Ga_{0.1}As$ layer and the p-$Al_{0.3}Ga_{0.7}As$ layer constituting the reflection layer 903 are formed while using trimethyl aluminum (TMA), trimethyl gallium (TMG), arsine ($AsH_3$) and carbon tetrabromide ($CBr_4$) for the source.

Further, the undoped $Al_{0.6}Ga_{0.4}As$ layer of the cavity spacer layer 904 is formed while using trimethyl aluminum (TMA), trimethyl gallium (TMG) and arsine ($AsH_3$) for the source and the AlGaAs/$Al_{0.6}Ga_{0.4}As$ of the active layer 105 is formed while using trimethyl aluminum (TMA), trimethyl gallium (TMG) and arsine ($AsH_3$) for the source.

Further, the undoped $Al_{0.6}Ga_{0.4}As$ layer of the cavity spacer layer 906 is formed while using trimethyl aluminum (TMA), trimethyl gallium (TMG) and arsine ($AsH_3$) for the source and the n-$Al_{0.9}Ga_{0.1}As$/$Al_{0.3}Ga_{0.7}As$ of the reflection layer 907 is formed while using trimethyl aluminum (TMA), trimethyl gallium (TMG), arsine ($AsH_3$) and hydrogen selenide ($H_2Se$) for the source.

Further, the p-AlGaAs of the selective oxidation layer 908 is formed while using trimethyl aluminum (TMA), trimethyl gallium (TMG), arsine ($AsH_3$) and carbon bromide ($CBr_4$) for the source material and n-$Al_{0.9}Ga_{0.1}As$/$Al_{0.3}Ga_{0.7}As$ of the selective oxidation layer 909 is formed while using trimethyl aluminum (TMA), trimethyl gallium (TMG), arsine ($AsH_3$) and hydrogen selenide ($H_2Se$) for the source material.

The n-GaAs layer of the contact layer 910 is formed while using trimethyl gallium (TMG), arsine ($AsH_3$) and hydrogen selenide ($H_2Se$) for the source.

Thereafter, a resist film is coated upon the contact layer 910 and a resist pattern 120 is formed on the contact layer 910 while using a photolithographic process (reference should be made to the step (b3) of FIG. 43). In the present case, the resist pattern 120 has a square shape with an edge length of 20 μm.

Upon formation of the resist pattern 120, a part of the reflection layer 903, the cavity spacer layer 904, the active layer 905, the cavity space layer 906, the reflection layer 907, the selective oxidation layers 908 and 909, and the contact layer 910 are removed by a dry etching process at the peripheral parts thereof while using the resist pattern 120 as a mask. Thereafter, the resist pattern 120 is removed (reference should be made to step (c3) of FIG. 43).

Next, referring to FIG. 44, the structure thus obtained is heated, after the step (c3) of FIG. 43, to 425° C. in the ambient formed by bubbling water of 85° C. with a nitrogen gas. With this, oxidation proceeds in the selective oxidation layers 908 and 909 from the peripheral part thereof toward the central part, and with this, the non-oxidized layer 908a and the oxidized layer 908b are formed in the selective oxidation layer 908 and the non-oxidized region 909a and the oxidized region 909b are formed in the selective oxidation layer 909 (reference should be made to step (d3) of FIG. 44).

In this case, it is possible to form the non-oxidized region 908a of square shape having an edge length of 5 μm and the non-oxidized region 909a of square shape having an edge length of 4 μm simultaneously, by adjusting the Al composition of the p-AlGaAs layer constituting the selective oxidation layer 908 and the n-AlAs layer constituting the selective-oxidation layer 909.

Thereafter, the $SiO_2$ layer 911 is formed on the entire surface of the specimen thus obtained by using a CVD process. Thereafter, the $SiO_2$ layer 911 is removed by a photolithographic process from the region optical exit part together with the surrounding region thereof (reference should be made to step (e3) of FIG. 44).

Next, the insulating resin layer 912 is applied over the entire specimen by a spin coating process, and the insulating resin layer 912 is removed from the region serving for the optical exit part (reference should be made to step (f3) of FIG. 44).

Referring to FIG. 45, a resist pattern is formed after the formation of the insulating resin layer 912 on the region serving for the optical exit part with an edge length of 8 μm, and an n-side electrode material is deposited on the entire surface of the structure thus obtained by way of evaporation deposition process. Further, by lifting off the n-side electrode material on the resist pattern, the n-side electrode 913 is formed (reference should be made to step (g3) of FIG. 45). Further, the back surface of the substrate 901 is polished and the p-side electrode 914 is formed on the back side of the substrate 901 thus polished. Thereafter, ohmic contact is formed for each of the n-side electrode 913 and the p-side electrode 914 by applying an annealing process (reference should be made to step (h3) of FIG. 45). With this, the surface-emission laser device 900 is fabricated.

With the surface-emission laser device 900, it should be noted that the suppression layer (=selective oxidation layer 909) for suppressing the higher-order transverse mode is provided in the reflection layer 907 of n-type semiconductor ($n-Al_{0.9}Ga_{0.1}As/Al_{0.3}Ga_{0.7}As$) and the current confinement layer (=selective oxidation layer 908) restricting the current to be injected into the active layer 905 is provided in the reflection layer formed of p-type semiconductor ($p-Al_{0.9}Ga_{0.1}As/As_{0.3}Ga_{0.7}As$).

Because holes having lower mobility are less prone to cause re-spreading as compared with electrons, it has been known that the carrier confinement efficiency is improved with the current confinement layer. Thus, it is preferable to provide the current confinement layer in the reflection layer formed of p-type semiconductor. However, associated with the low mobility, there is a problem that the p-type semiconductor that contains holes as majority carrier, tends to show high resistance. Further, in view of its function of performing action against the oscillating light, the suppression layer for suppressing the higher-order transverse mode can perform the same function and attain the same effect in any of the cases of providing the suppression layer to the reflection layer 903 and the reflection layer 907 disposed at the opposite sides of the active layer 905.

Thus, with the surface-emission laser device 900 of Embodiment 6, the selective oxidation layer 908 functioning as the current confinement layer is provided to the reflection layer 903 formed of p-type semiconductor ($p-Al_{0.9}Ga_{0.1}As/Al_{0.3}Ga_{0.7}As$) and the selective oxidation layer 909 functioning as the suppression layer suppressing the higher-order transverse mode is provided to the reflection layer 907 formed of n-type semiconductor ($n-Al_{0.9}Ga_{0.1}As/Al_{0.3}Ga_{0.7}As$), for avoiding the increase of resistance which would occur when the two selective oxidation layers are provided in the same reflection layer.

Thus, with the surface-emission laser device 900, it becomes possible to attain low device resistance by providing one selective oxidation layer 908 in the reflection layer 903 formed of p-type semiconductor ($p-Al_{0.9}Ga_{0.1}As/Al_{0.3}Ga_{0.7}As$). Further, with the present embodiment, the threshold current is maintained low and the diffraction loss is reduced (=high slope efficiency). Thus, it becomes possible to attain single fundamental mode oscillation with high output power.

The surface-emission laser device 900 is used for the surface-emission laser array 300 shown in FIG. 17. Further, the surface-emission laser device 900 and the surface-emission laser array 300 that uses the surface-emission laser device 900 are used for the electrophotographic system 400 shown in FIG. 18 and for the optical communication system 500 shown in FIG. 19.

Embodiment 7

Figure 46:
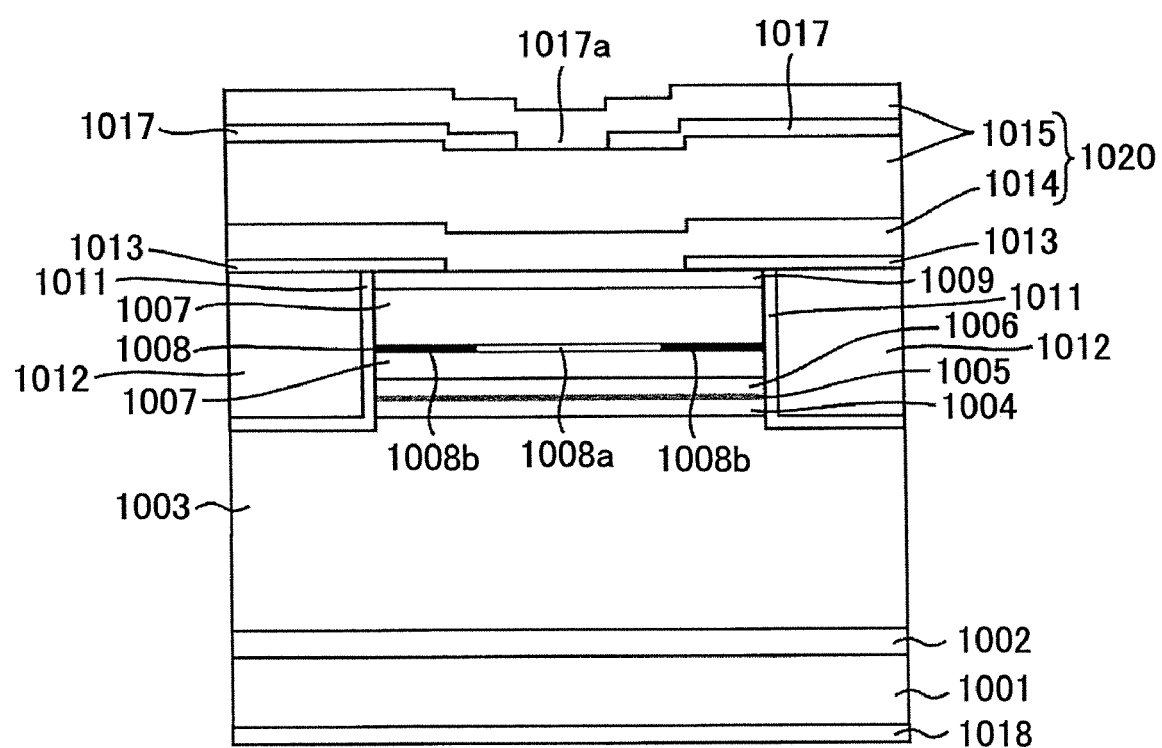
FIG. 46 is a schematic cross-sectional diagram showing a surface-emission laser device according to Embodiment 7 of the present invention.

FIG. 46 is a schematic cross-sectional diagram showing a surface-emission laser device according to Embodiment 7 of the present invention. Referring to FIG. 46, a surface-emission laser device 1000 of the Embodiment 7 comprises a substrate 1001, a buffer layer 1002, reflection layers 1003, 1007 and 1020, cavity spacer layers 1004 and 1006, an active layer 1005, a selective oxidation layer 1008, a contact layer 1009, an $SiO_2$ layer 1011, an insulating resin layer 1012, a p-side electrode 1013, a suppression layer 1017, and an n-side electrode 1018. The surface-emission laser device 1000 is a surface-emission laser device of the 780 nm band.

The substrate 1001 is formed of n-GaAs. The buffer layer 1002 is formed of n-GaAs and is formed on a principal surface of the substrate 1001. The reflection layer 1003 has a structure of $[n-Al_{0.9}Ga_{0.1}As/n-Al_{0.3}Ga_{0.7}As]$ of 40.5 periods formed on the buffer layer 1002 by repeating the pair of $n-Al_{0.9}Ga_{0.1}As/p-Al_{0.3}Ga_{0.7}As$ as the unit of repetition.

The cavity spacer layer 1004 is formed of an undoped $Al_{0.6}Ga_{0.4}As$ layer and is formed on the reflection layer 1003. The active layer 1005 has a multiple quantum well structure formed of repetition of the $Al_{0.15}Ga_{0.85}As/Al_{0.6}Ga_{0.4}As$ pair and is formed on the cavity spacer layer 1004.

The cavity spacer layer 1006 is formed of an undoped $Al_{0.6}Ga_{0.4}As$ layer and is formed on the active layer 1005. The reflection layer 1007 is formed on the cavity spacer layer 1006 and has a structure of $[p-Al_{0.9}Ga_{0.1}As/n-Al_{0.3}Ga_{0.7}As]$ in which the $p-Al_{0.9}Ga_{0.1}As/p-Al_{0.3}Ga_{0.7}As$ pair is repeated for 26 times.

The selective oxidation layer is formed of p-AlAs layer of the thickness of 20 nm and is provided in the reflection layer 1007. Further, the selective oxidation layer 1008 is formed of a non-oxidized region 1008a and an oxidized region 1008b. In this case, the non-oxidized region 1008a has a square shape having an edge length of 6 μm.

The contact layer 1009 is formed of p-GaAs having a film thickness of 20 nm and is formed on the reflection layer 1007. The $SiO_2$ layer 1011 is formed so as to cover a part of the principal surface of the reflection layer 1003, and the edge surfaces of the cavity spacer layer 1004, the active layer 1005, the cavity spacer layer 1006, the reflection layer 1007 (807A), the selective oxidation layer 1008 and further a part of the contact layer 1009.

The insulation resin layer 1012 is formed adjacent to the $SiO_2$ layer 1011. The p-side electrode 1013 is formed on a part of the contact layer 1009 and the insulating resin layer 1012.

The reflection layer 1020 is formed of a low-refractive index layer 1014 and a high-refractive index layer 1015. The low-refractive index layer 1014 is formed for example of $SiO_2$ while the high-refractive index layer 1015 is formed for example of $TiO_x$. Thereby, it should be noted that $SiO_2$ has a refractive index n of 1.6 while $TiO_x$ has a refractive index of 3.0.

The suppression layer 1017 is formed inside the high-refractive index layer 1015 of the reflection layer 1020. Further, the suppression layer 1017 is formed of $SiO_2$ of 20 nm and has an aperture 1017a at the central part thereof. This aperture 1017a has a square shape having an edge length of 4 μm.

Thus, the non-oxidized region 1008a of the selective oxidation layer 1008 has a larger area over the non-oxidized region 1017a of the suppression layer 1017. The n-side electrode 1018 is formed on a backside of the substrate 801.

Further, each of the reflection layers 1003, 1007 and 1020 constitute a semiconductor distributed Bragg reflector that confines the oscillating light oscillated in the active layer 1005 into the active layer 1005 as a result of Bragg multiple reflection.

Figure 47:
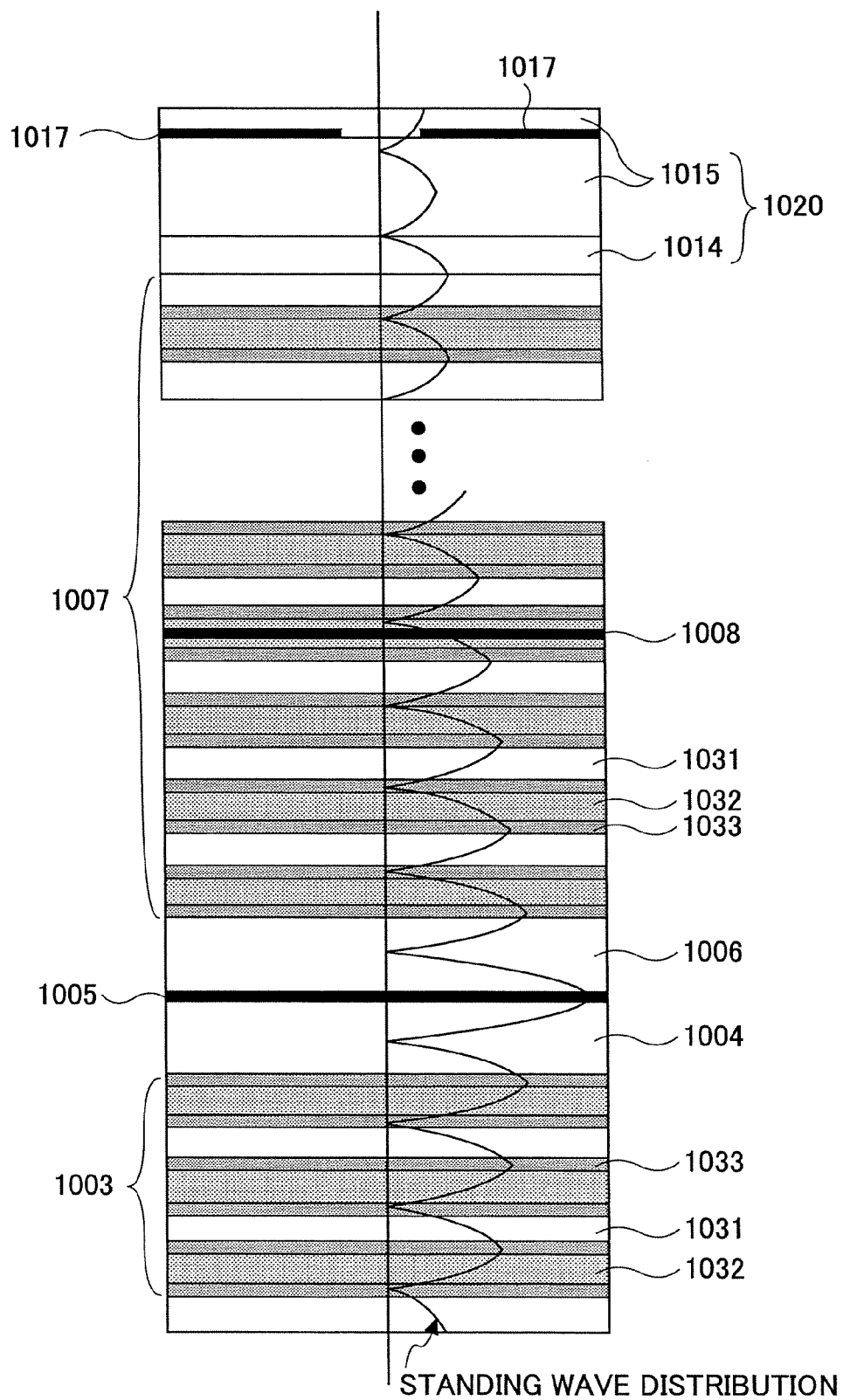
FIG. 47 is a diagram showing a part of the surface-emission laser device of FIG. 46 in the vicinity of a cavity region thereof.

FIG. 47 is a diagram showing a part of the surface-emission laser device 1000 of FIG. 46 in the vicinity of the cavity region thereof. It should be noted that FIG. 47 also shows the electric field intensity distribution of the oscillation light in the oscillating state of the surface-emission laser device 1000.

Referring to FIG. 47, each of the reflection layers 1003 and 1007 includes a high-refractive index layer 1031, a low-refractive index layer 1032 and a compositional gradation layer 1033. In the reflection layer 1003, the high-refractive index layer 1031 is formed of n-$Al_{0.3}Ga_{0.7}As$ while the low-refractive index layer 1032 is formed of n-$Al_{0.9}Ga_{0.1}As$. Further, the compositional gradation layer 1033 is formed of n-AlGaAs in which the composition thereof is changed from one composition of the low-refractive index layer 1031 and the high-refractive index layer 1032 toward the other of the foregoing compositions.

In the reflection layer 1007, the high-refractive index layer 1031 is formed of p-$Al_{0.3}Ga_{0.7}As$ while the low-refractive index layer 1032 is formed of p-$Al_{0.9}Ga_{0.1}As$. Further, the compositional gradation layer 1033 is formed of p-AlGaAs in which the composition thereof is changed from one composition of the low-refractive index layer 1031 and the high-refractive index layer 1032 toward the other of the foregoing compositions.

The cavity region of the surface-emission laser device 1000 is defined as the region formed of the cavity spacer layers 1004 and 1006 and the active layer 1005. Thereby, it should be noted that the cavity region, formed of the cavity spacer layers 1004 and 1006 and the active layer 1005, is provided such that there occurs a phase shift amount of $2\pi$ in the semiconductor layers thereof. Thus, the cavity region forms a single wavelength cavity structure.

Further, in order to increase the probability of stimulated emission, the active layer 1005 is provided centrally to the cavity region (=cavity spacer layers 1004, 1006 and active layer 1005) at the location corresponding to the anti-node of the standing wave distribution of the oscillation light.

The reflection layers 1003 and 1007 are formed so as to make contact respectively with the cavity spacer layers 1004 and 1006 at the side of the low refractive index layer 1032. With this construction, the interface between the low-refractive index layer 1032 and the cavity spacer layer 1004 or 1006 (or compositional gradation layer 1033 in the case of Embodiment 7) is located at the anti-node of the standing wave distribution of the electric field formed by the oscillation light.

Further, similarly to Embodiment 1, there appear anti-nodes and nodes alternately in the location between the high-refractive index layer 1031 and the low-refractive index layer 1032, where the compositional gradation layer 1033 is disposed.

The selective oxidation layer 1008 is provided inside the low-refractive index layer 1032 located at the fourth period from the cavity region (=cavity spacer layers 1004 and 1006 and active layer 1005). The thickness of the low-refractive index layer 1032 in which the selective oxidation layer 1008 is provided, is set such that there is caused a phase shift of $3\pi/2$ for the oscillation light in the region extending from the central part of the compositional graded layer 1033 adjacent to one side of the low-refractive index layer 1032 to the central part of the compositional graded layer 1033 adjacent to the low-refractive index layer 1032 at the other side thereof (the region of film thickness d2 shown in FIG. 2). Thus, the phase condition of multiple reflection is met in the case the phase shift in the constituting layers of the reflection layer 1007 becomes an odd integer multiple of $\pi/2$. Here, the selective oxidation layer 1008 functions as the current confinement layer that confines the current injected into the active layer 1005.

The low-refractive index layer 1014 of the reflection layer 1020 has a film thickness of $\lambda/4n$ (n being the refractive index of $SiO_2$), while the high-refractive index layer 1015 has a film thickness of $3\lambda/8n$ (n being the refractive index of $TiO_x$). It is sufficient that the high-refractive index layer 1015 has a film thickness of an odd integer multiple of $\lambda/4n$.

The suppression layer 1017 is formed inside the high-refractive index layer 1015 of the reflection layer 1020. More specifically, the suppression layer 1017 is provided in the high-refractive index layer 1015 at the location offset from the location of the node of the standing wave distribution of the oscillation light by a distance of $\pi/4$ in terms of phase ($\lambda/8n$ in terms of thickness (n being the refractive index of $TiO_x$)). By disposing the suppression layer 1017 as such, the suppression layer 1017 can suppress the higher-order transverse modes.

Thus, with the surface-emission laser device 1000, the reflection layer 1007 formed of p-type semiconductor and the reflection layer 1020 formed of dielectric are disposed at the side further away from the substrate with regard to the active layer 1005, the selective oxidation layer 1008 is disposed in the reflection layer 1007 and the suppression layer 1017 is disposed inside the reflection layer 1020. Further, the suppression layer 1017 has a refractive index different from the dielectric (=high-refractive index layer 1015) adjacent thereto in the lamination direction of the reflection layer 1020.

Figure 48:
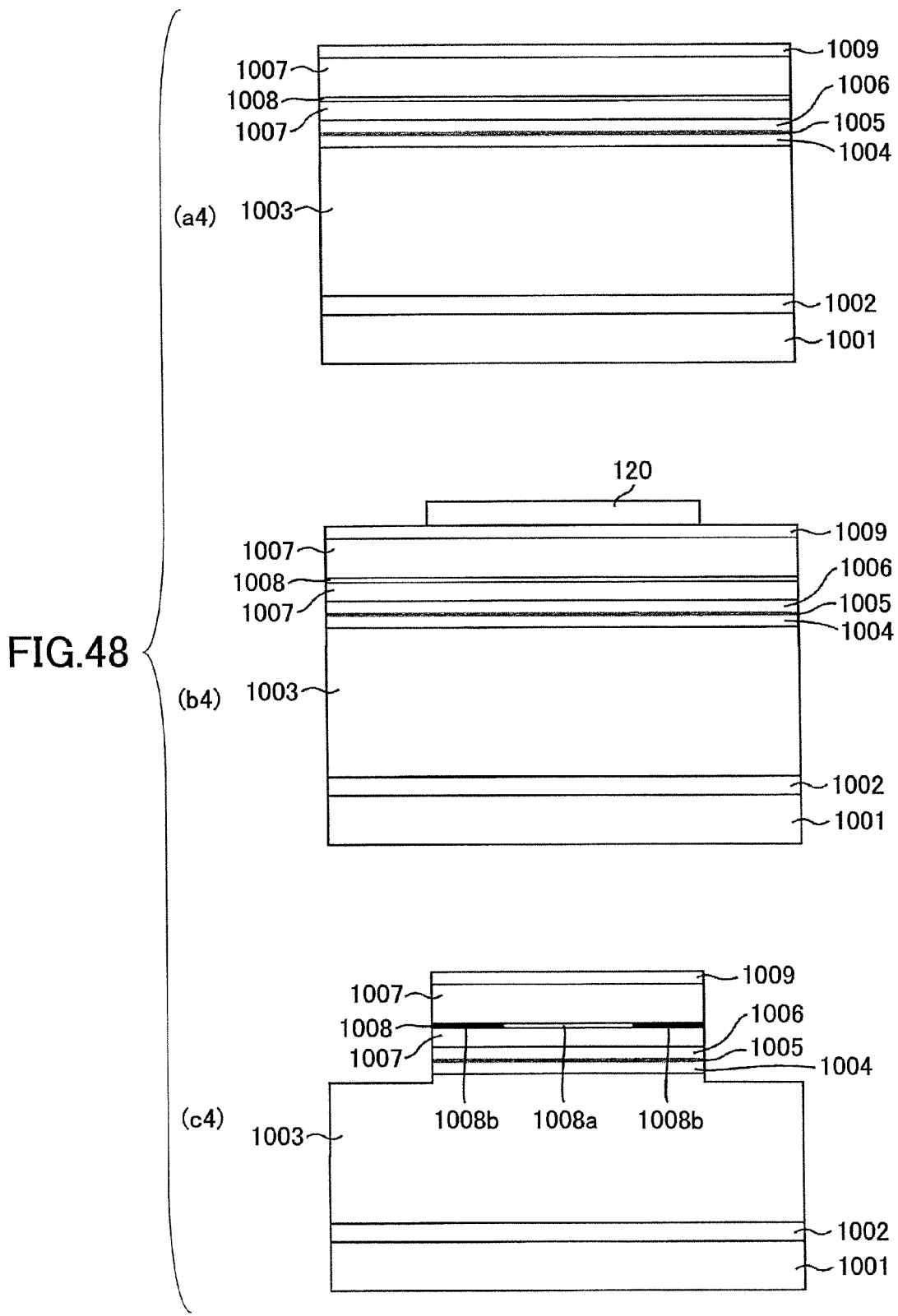
FIG. 48 is a diagram explaining a first step of fabricating the surface-emission laser device of FIG. 46.

FIGS. 48 through 51 are first through fourth process step diagrams showing the fabrication process of the surface-emission laser array 1000 shown in FIG. 46. Referring to FIG. 48, the buffer layer 1002, the reflection layer 1003, the cavity spacer layer 1004, the active layer 1005, the cavity spacer layer 1006, the reflection layer 1007, the selective oxidation layer 1008 and the contact layer 1009 are stacked consecutively on the substrate 1001 by using an MOCVD process upon commencement of a series of process steps (reference should be made to step (a4) of FIG. 48).

Therein, the n-GaAs layer forming the buffer layer 1002 is formed while using trimethyl gallium (TMG), arsine ($AsH_3$) and hydrogen selenide ($H_2Se$) as the source, while the n-$Al_{0.9}Ga_{0.1}As$ layer and the n-$Al_{0.3}Ga_{0.7}As$ layer constituting the reflection layer 1003 are formed while using trimethyl aluminum (TMA), trimethyl gallium (TMG), arsine ($AsH_3$) and hydrogen selenide ($H_2Se$) for the source.

Further, the undoped $Al_{0.6}Ga_{0.4}As$ layer of the cavity spacer layer 1004 is formed while using trimethyl aluminum (TMA), trimethyl gallium (TMG) and arsine (AsH$_3$) for the source and the Al$_{0.15}$Ga$_{0.85}$As/Al$_{0.6}$Ga$_{0.4}$As of the active layer 1005 is formed while using trimethyl aluminum (TMA), trimethyl gallium (TMG) and arsine (AsH$_3$) for the source.

Further, the undoped Al$_{0.6}$Ga$_{0.4}$As layer of the cavity spacer layer 1006 is formed while using trimethyl aluminum (TMA), trimethyl gallium (TMG) and arsine (AsH$_3$) for the source and the p-Al$_{0.9}$Ga$_{0.7}$As/Al$_{0.3}$Ga$_{0.7}$As of the reflection layer 1007 is formed while using trimethyl aluminum (TMA), trimethyl gallium (TMG), arsine (AsH$_3$) and carbon tetrabromide (CBr$_4$) for the source.

Further, the p-AlAs layer of the selective oxidation layer 1008 is formed while using trimethyl aluminum (TMA), arsine (AsH$_3$) and carbon tetrabromide (CBr$_4$) for the source material, and the p-GaAs layer of the contact layer 1009 is formed while using trimethyl gallium (TMG), arsine (AsH$_3$) and carbon tetrabromide (CBr$_4$) for the source material.

Thereafter, a resist film is coated upon the contact layer 1009 and a resist pattern 120 is formed on the contact layer 1009 while using a photolithographic process (reference should be made to the step (b4) of FIG. 48). In the present case, the resist pattern 120 has a square shape with an edge length of 20 μm.

Upon formation of the resist pattern 120, the contact layer 1009, the selective oxidation layer 1008, the reflection layer 1007, the cavity spacer layer 1006, the active layer 1005, the cavity spacer layer 1004 and a part of the reflection layer 1003 are removed at the peripheral parts thereof by a dry etching process while using the resist pattern 120 thus formed as a mask. Further the resist pattern 120 is removed after the etching, and with this, a mesa structure exposing the edge surface of the selective oxidation layer 1008 is obtained.

Thereafter, the structure thus obtained is heated to 425° C. in the ambient formed by bubbling water of 85° C. with a nitrogen gas. With this, oxidation proceeds in the selective oxidation layer 1008 from the peripheral part thereof toward the central part, and with this, the non-oxidized layer 1008a and the oxidized layer 1008b are formed in the selective oxidation layer 1008 (reference should be made to step (c4) of FIG. 48).

Figure 49:
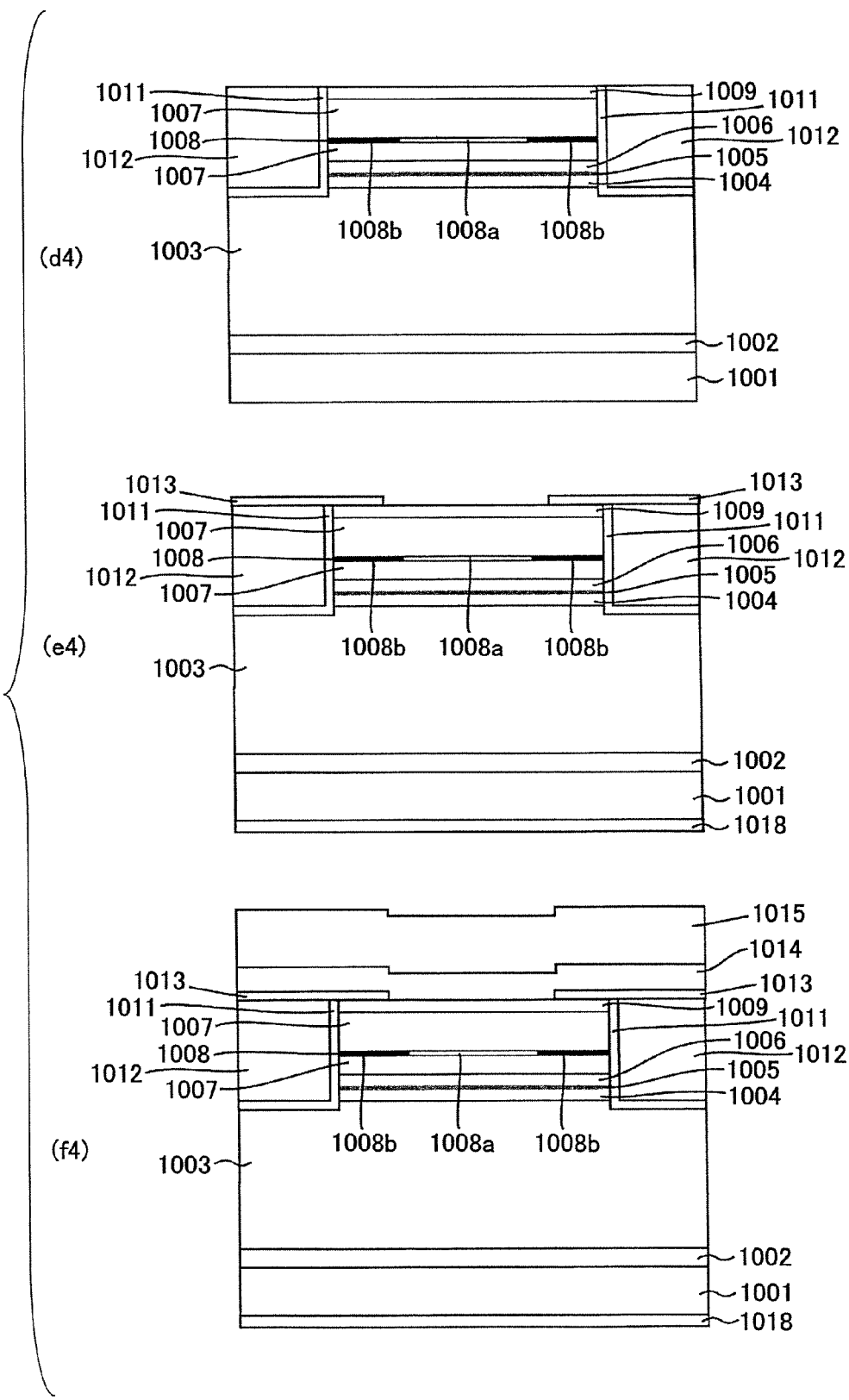
FIG. 49 is a diagram explaining a second step of fabricating the surface-emission laser device of FIG. 46.

Referring to FIG. 49, a CVD process is conducted, after the formation of the non-oxidized regions 1008a and the oxidized regions 1008b, to form the SiO$_2$ layer 1011 over the entire surface of the specimen, and a part of the SiO$_2$ layer 1011 is removed from the region serving for the optical exit part together with the surrounding region thereof by using photolithography. Thereafter, the insulating resin layer 1012 is applied over the entire specimen by a spin coating process, and the insulating resin layer 1012 is removed from the region serving for the optical exit part (reference should be made to step (d4) of FIG. 49).

Subsequently, a square resist pattern having a size of 8 μm for each edge is formed on the region serving for the optical exit part, and the material of p-side electrode is formed on the entire surface of the specimen by an evaporation deposition process. Further, the p-side material on the resist pattern is lifted off and the p-side electrode 1013 is formed. Further, the back surface of the substrate 1001 is polished and the n-side electrode 1018 is formed on the back side of the substrate 1001 thus polished. Thereafter, ohmic contact is formed for each of the p-side electrode 1013 and the n-side electrode 1018 by applying an annealing process (reference should be made to step (e4) of FIG. 49).

Thereafter, the low-refractive index layer 1014 of SiO$_2$ and the high-refractive index layer 1015 of TiO$_x$ are formed consecutively on the entire surface of the specimen by an electron-beam evaporation deposition process (reference should be made to step (f4) of FIG. 49).

Figure 50:
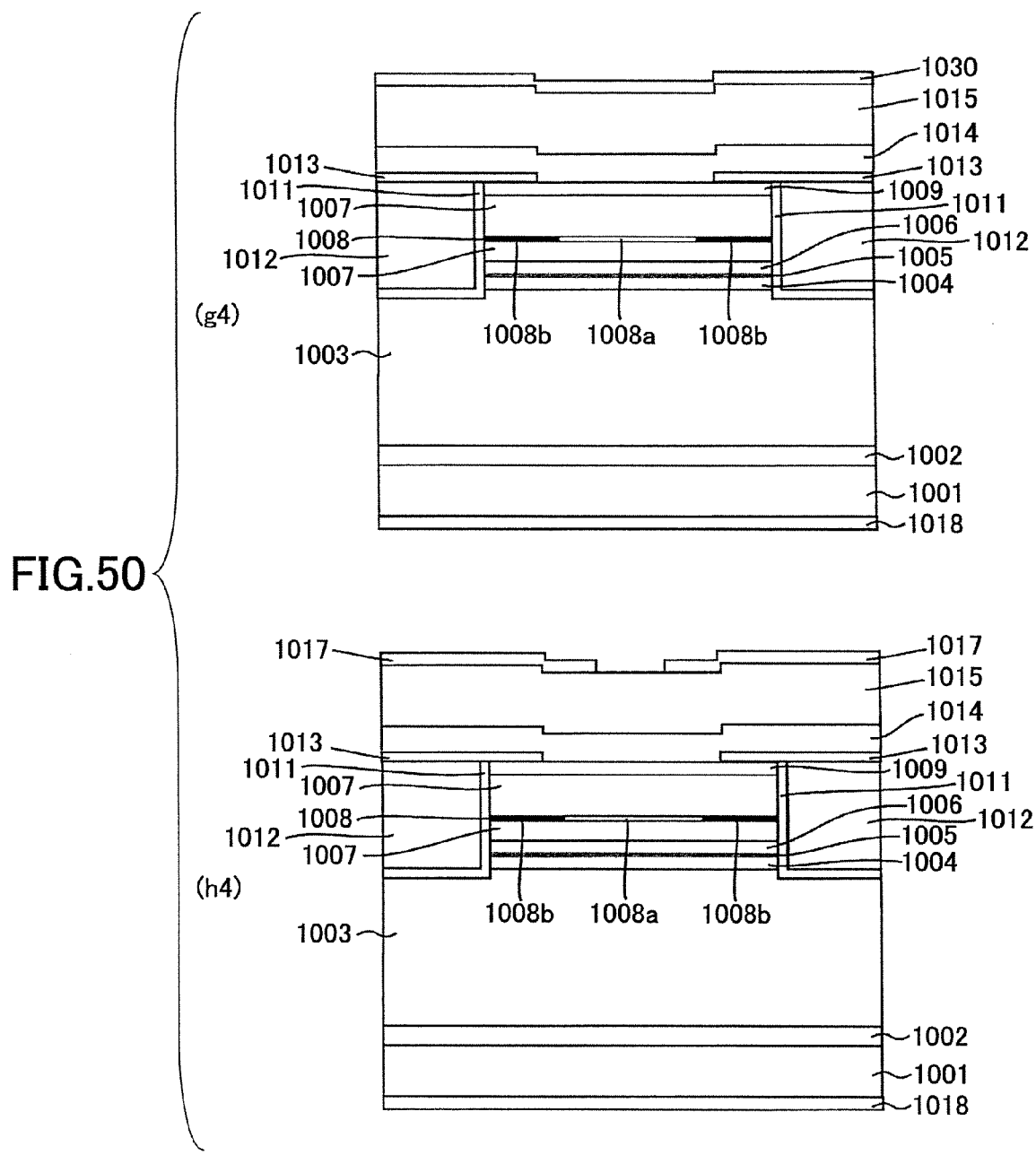
FIG. 50 is a diagram explaining a third step of fabricating the surface-emission laser device of FIG. 46.

Referring to FIG. 50, after formation of the low-refractive index layer 1014 and the high-refractive index layer 1015, an SiO$_2$ layer 1030 is formed on the entire surface of the specimen by an electron-beam evaporation deposition process with the thickness of 20 nm (reference should be made to step (g4) of FIG. 50). Thereafter, a resist pattern having an aperture of square shape having an edge length of 4 μm is formed on the SiO$_2$ lawyer 1030, and the SiO$_2$ layer 1030 in the aperture part is removed by a buffered hydrofluoric acid (BHF). Thereby, TiOx is not etched by the buffered fluoric acid (BHF), and only the SiO$_2$ layer r1030 is removed from the aperture part. With this, the suppression layer 1017 is formed (reference should be made to step (h4) of FIG. 50).

Figure 51:
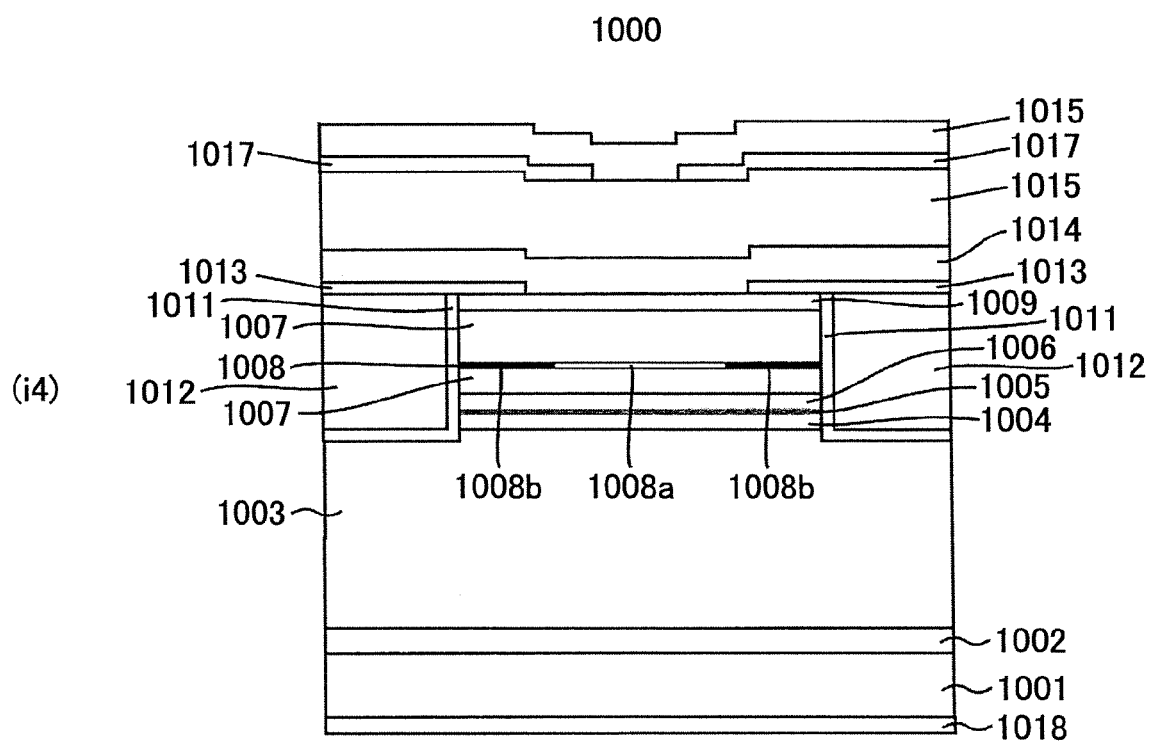
FIG. 51 is a diagram explaining a fourth step of fabricating the surface-emission laser device of FIG. 46.

Referring to FIG. 51, after formation of the suppression layer 1017, a high-refractive index layer 1015 of TiO$_x$ is formed on the suppression layer 1017 by an electron-beam evaporation deposition process. With this, the surface-emission laser device 100 is completed (reference should be made to step (i4) of FIG. 51.

With the surface-emission laser device 1000, the reflection layer 1020 formed of the reflection layer 1007 of p-type semiconductor rand a dielectric (SiO$_2$ or TiO$_x$) is formed at the side further away from the substrate 1001 with regard to the active layer 1005. Further, the selective oxidation layer 1008 restricting the current to be injected into the active layer 1005 is provided in the reflection layer 1007 and the suppression layer 1017 suppressing the higher-order transverse mode is provided in the reflection layer 1020. As a result, there is no need to consider the transverse mode characteristics when providing the selective oxidation layer 1008. Thus, it is possible to form the selective oxidation layer 1008 so as to decrease the electric resistance and oscillation threshold at the time of injecting current into the active layer 1005.

In the conventional surface-emission laser devices, in particular, there has been a problem of increase of resistance when to attain single fundamental transverse mode oscillation, while with the surface-emission laser device 100, it becomes possible to use a wide area for the conductive region, and it is possible to reduce the resistance while maintaining the single fundamental transverse mode oscillation.

Figure 52:
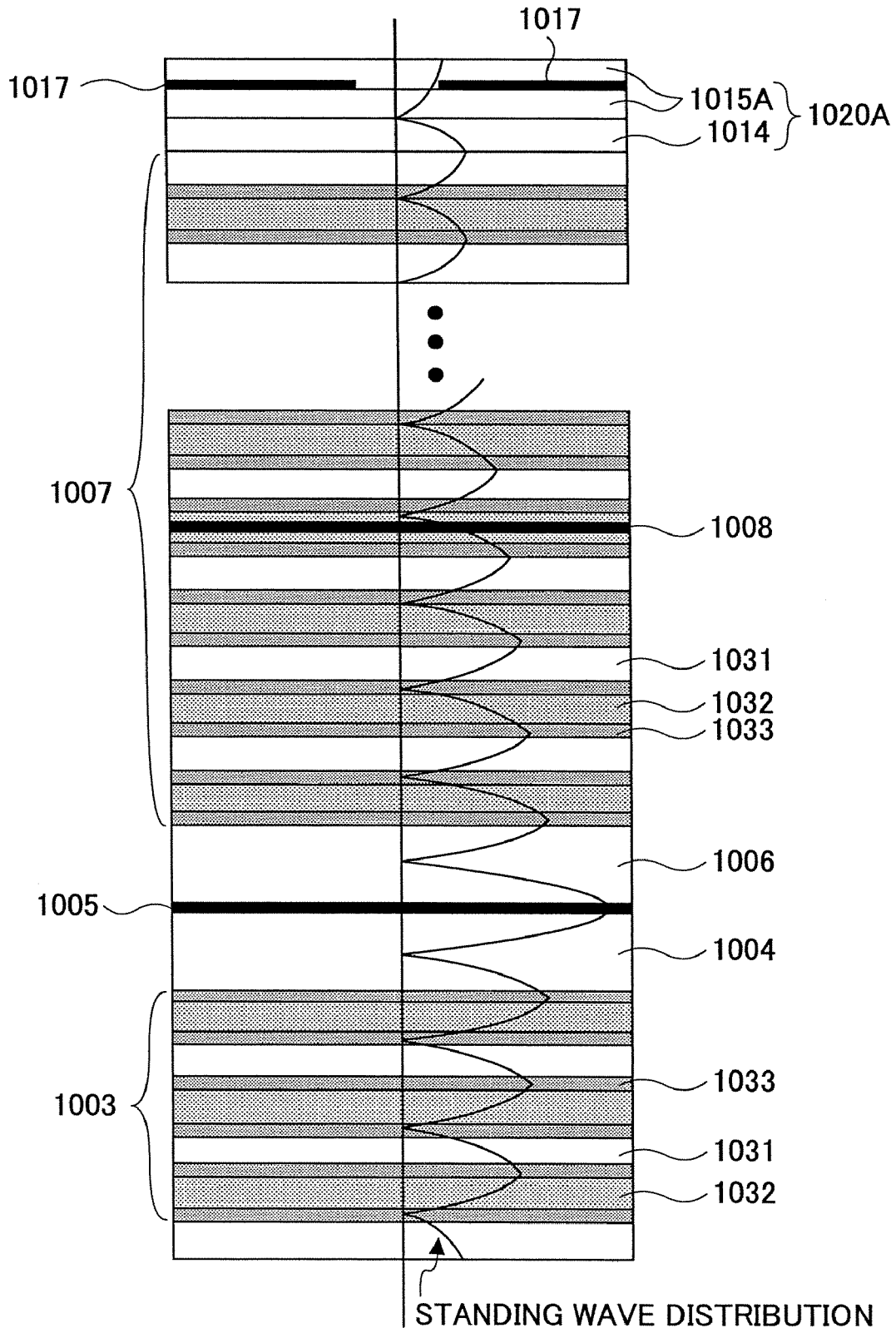
FIG. 52 is another diagram showing a part of the surface-emission laser device of FIG. 46 in the vicinity of a cavity region thereof.

FIG. 52 is another diagram showing the part of the surface-emission laser device 1000 of FIG. 46 in the vicinity of the cavity region thereof. There, the surface-emission laser device 1000 may use a reflection layer 1020A in place of the reflection layer 1020. It should be noted that the reflection layer 1020A is identical to the reflection layer 1020 except that the high-refractive index layer 1015 of the reflection layer 1020 is replaced with a high-refractive index layer 1015A.

The high-refractive index layer 1015A is formed of TiO$_x$ and has a film thickness of λ/4n (n being the refractive index of TiO$_x$). Further, the suppression layer 1017 is disposed with offset from the location of the node of the standing wave distribution of the oscillating light in the direction away from the active layer 1005 with a distance that causes a phase shift of π/4 for the oscillation light.

In the case of disposing the suppression layer 1017 in the high-refractive index layer 1015A, a TiO$_x$ layer is formed on the low-refractive index layer 1014 with a film thickness of λ/10n (n being the refractive index of TiO$_x$) by electron-beam evaporation deposition process, followed by formation of an SiO$_2$ layer of the thickness of 20 nm by an electron-beam evaporation deposition process, and an aperture 1017a is formed in the SiO$_2$ layer of the thickness of 20 nm by removing a region at the central part with a size of 4.5 μm for each edge by using a buffered hydrofluoric acid (BHF). Further, a TiO$_x$ layer having a film thickness of 3×/20n (n being the refractive index of TiO$_x$) is formed by an electron-beam evaporation deposition process. With this, a high-refractive index layer 1015A having a film thickness of λ/40 (n being the refractive index of TiO$_x$) is formed.

While it has been explained in the foregoing that the aperture 1017*a* of the suppression layer has a size of 4 μm, which is smaller than the size of the non-oxidized region 1008*a* in the selective oxidation layer 1008, the present invention is not limited to such a construction, and it is possible to increase or decrease the size of the aperture 1017*a* of the suppression layer 1017 with regard to the size of the non-oxidized region 1008*a* of the selective-oxidation layer 1008.

Further, with the surface-emission laser device 1000, the p-side electrode 1013 preferably as the area identical to the area of the oxidized region 1008*b* of the selective oxidation layer 1008. Thus, the p-side electrode 1013 is provided at the location corresponding to the oxidized region 1008*b*.

Further, while the suppression layer 1017 has been disposed with offset from the location of the node of the standing wave distribution of the oscillation light in the direction away from the active layer 1005 by the distance that provides the phase shift of π/4 with regard to the oscillation light, the present invention is not limited to such a construction, and the suppression layer 1017 may be provided at any arbitrary location between the location of the node of the standing wave distribution of the oscillation light and an adjacent anti-node adjacent in the direction away from the active layer 1005.

Further, while the current confinement layer has been explained as being formed of the selective oxidation layer 1008 in the foregoing, the present invention is not limited to such a construction and it is possible to form the current confinement layer by the high-resistance regions 708*a* and 708*b* explained with reference to Embodiment 4.

Further, while explanation has been made that the reflection layer 1020 is formed of SiO$_2$ and TiO$_x$, the present invention is not limited to such a construction and the reflection layer may be formed by the dielectrics other than SiO$_2$ and TiO$_x$, as long as they are the dielectrics having etching resistances significantly different with each other.

The surface-emission laser device 1000 is used for the surface-emission laser array 300A shown in FIG. 22. Further, the surface-emission laser device 1000 and the surface-emission laser array 300A that uses the surface-emission laser device 1000 are used for the electrophotographic system 400A shown in FIG. 23 and for the optical communication system 500A shown in FIG. 24.

In Embodiment 7, the reflection layer 1007 forms the "first reflection layer", while the reflection layer 1020 forms the "second reflection layer".

Further, while explanation has been made in the foregoing that the semiconductor layers constituting each of the surface-emission laser devices 100, 200, 600, 700, 800, 900 and 1000 are formed by MOCVD process, the present invention is not limited to such a specific process and it is also possible to use other crystal growth process such as molecular beam crystal growth process (MBE: molecular beam epitaxy).

Further, the surface-emission laser devices 100, 200, 600, 700, 800, 900 and 1000 may have an oscillation wavelength other than the wavelength of 780 nm or 890 nm. For example, it is possible to obtain light emission with wavelength shorter than the 680 nm band by using the material of AlGaInP system for the active layers 105, 205, 605, 705, 805, 905 and 1005. Further, it is possible to obtain light emission with the wavelength of the 850 nm band in addition to the 780 nm band, by using the material of AlGaInP system for the active layers 105, 205, 605, 705, 805, 905 and 1005. Further, it is possible to obtain light emission with wavelength longer than the 1.1 μm band by using the material of GaInNAsSb system for the active layers 105, 205, 605, 705, 805, 905 and 1005. In this case, it is possible to fabricate a surface-emission laser device capable of performing single fundamental transverse mode oscillation up to nearly the peak output power while suppressing the oscillation of higher-order transverse mode, by appropriately selecting the materials and the stacking period numbers for the reflection layers 103, 107; 203 and 207; 603 and 607; 703 and 707; 803 and 807; 903, 907 and 1007, in response to each wavelength band.

While the present invention has been explained for preferred embodiments, the present invention is not limited to such specific embodiments and various variations and modifications may be made within the scope of the invention described in patent claims.

The present invention contains the entire contents of the Japanese patent application 2005-346055 filed on Nov. 30, 2005, the Japanese patent application 2006-126072 filed on Apr. 28, 2006 and the Japanese patent application 2006-299074 filed on Nov. 2, 2006, the entire contents of which are incorporated herein as reference.

INDUSTRIAL APPLICABILITY

The present invention is applicable to surface-emission laser devices capable of increasing the output power in the single fundamental transverse mode easily. Further, the present invention is applicable to a surface-emission laser array provided with surface-emission laser devices capable of increasing the output power of single fundamental transverse mode easily. Further, the present invention is applicable to an electrophotographic system having a surface-emission laser device capable of increasing the output power of single fundamental transverse mode easily or a surface-emission laser array including therein such surface-emission laser devices. Further, the present invention is applicable to an optical communication system having a surface-emission laser device capable of increasing the output power of single fundamental transverse mode easily or a surface-emission laser array including therein such surface-emission laser devices.

The invention claimed is:

1. A surface-emission laser device, comprising:
   an active layer;
   cavity spacer layers provided at both sides of said active layer;
   reflection layers provided at respective sides of said cavity spacer layers, said reflection layers reflecting an oscillation light oscillated in said active layer; and
   a selective oxidation layer provided between a first location and a second location, said first location being formed in said reflection layer corresponding to a node of a standing wave distribution of an electric field of a fundamental mode of said oscillation light and an adacent location to said first location corresponding to said node of said standing wave distribution of the fundamental mode in said reflection layer in a direction away from said active layer, said second location corresponding to an anti-node of said standing wave distribution.

2. The surface-emission laser device as claimed in claim 1, wherein said selective oxidation layer is provided between said first location and a midpoint between said first and second locations.

3. The surface-emission laser device as claimed in claim 1, wherein said selective oxidation layer is provided generally at a midpoint between said first location and said second location.

4. The surface-emission laser device as claimed in claim 1, wherein said reflection layer has a structure in which a first layer having a first refractive index and a second layer having a second refractive index larger than the fist refractive index are laminated alternately, said selective oxidation layer being formed in said first layer.

5. The surface-emission laser device according to claim 1, wherein the selective oxidation layer is arranged between the first and second locations at a position other than a node of the standing wave distribution of an electric field of the fundamental mode.

* * * * *